(12) United States Patent
Seshita et al.

(10) Patent No.: US 10,250,193 B2
(45) Date of Patent: Apr. 2, 2019

(54) HIGH-FREQUENCY SEMICONDUCTOR AMPLIFIER CIRCUIT

(71) Applicant: KABUSHIKI KAISHA TOSHIBA, Tokyo (JP)

(72) Inventors: Toshiki Seshita, Kawasaki Kanagawa (JP); Yasuhiko Kuriyama, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 16/009,339

(22) Filed: Jun. 15, 2018

(65) Prior Publication Data

US 2018/0294774 A1 Oct. 11, 2018

Related U.S. Application Data

(62) Division of application No. 15/444,242, filed on Feb. 27, 2017, now Pat. No. 10,033,332.

(30) Foreign Application Priority Data

Sep. 5, 2016 (JP) .................................. 2016-173002

(51) Int. Cl.
*H03F 1/02* (2006.01)
*H03F 3/193* (2006.01)
(Continued)

(52) U.S. Cl.
CPC ......... *H03F 1/0205* (2013.01); *H03F 1/0261* (2013.01); *H03F 1/223* (2013.01); *H03F 3/193* (2013.01); *H03F 3/72* (2013.01); *H03F 2200/111* (2013.01); *H03F 2200/294* (2013.01); *H03F 2200/451* (2013.01);
(Continued)

(58) Field of Classification Search
USPC ......................................... 330/285, 296, 311
See application file for complete search history.

(56) References Cited

U.S. PATENT DOCUMENTS 7,486,135 B2 * 2/2009 Mu ........................ H03F 1/223
330/51
8,102,205 B2 1/2012 Pletcher et al.
(Continued)

FOREIGN PATENT DOCUMENTS

JP 2005316799 A 11/2005
JP 2009005092 A 1/2009
(Continued)

*Primary Examiner* — Hieu Nguyen
(74) *Attorney, Agent, or Firm* — Kim & Stewart LLP

(57) ABSTRACT

According to an embodiment, a high-frequency semiconductor amplifier circuit includes an input terminal and an output terminal. A gate of a first transistor is connected to the input terminal. A drain of the first transistor is connected to the output terminal. A second transistor is connected between a source of the first transistor and a reference potential terminal. A bias generation circuit has an input control signal terminal, a bias voltage terminal connected to the gate of the first transistor, a control voltage terminal connected to a gate of the second transistor, and an intermediate voltage terminal connected to the drain of the first transistor. The bias generation circuit supplies a control voltage, a bias voltage, and a first voltage according to the input control signal.

5 Claims, 56 Drawing Sheets

(51) Int. Cl.
*H03F 3/72* (2006.01)
*H03F 1/22* (2006.01)

(52) U.S. Cl.
CPC ............... *H03F 2200/555* (2013.01); *H03F 2203/7209* (2013.01); *H03F 2203/7239* (2013.01)

(56) References Cited

U.S. PATENT DOCUMENTS

| | | |
|---|---|---|
| 9,083,402 B2 | 7/2015 | Asano et al. |
| 9,154,356 B2 | 10/2015 | Tasic et al. |
| 9,407,215 B2 | 8/2016 | Gill |
| 9,712,125 B2 * | 7/2017 | Lehtola ............... H03F 3/211 |
| 2014/0009209 A1 | 1/2014 | Cebi et al. |
| 2015/0296515 A1 | 10/2015 | Pehlivanoglu |

FOREIGN PATENT DOCUMENTS

| | | |
|---|---|---|
| JP | 2009010826 A | 1/2009 |
| JP | 5512740 B2 | 6/2014 |
| JP | 2014239349 A | 12/2014 |
| JP | 2015517782 A | 6/2015 |
| JP | 2015523810 A | 8/2015 |
| JP | 2015204628 A | 11/2015 |
| JP | 5879547 B2 | 3/2016 |

* cited by examiner

| EN | OPERATION MODE | Vdd_int | VB1 | Con |
|---|---|---|---|---|
| H | GAIN MODE | 0.8V | 0.35V | 1.6V |
| L | BYPASS MODE | 0V | 1.6V | 0V |

FIG. 5B

| EN | OPERATION MODE | Vdd_int | VB1 | Con1 | Con2 |
|---|---|---|---|---|---|
| H | GAIN MODE | 0.8V | 0.35V | 1.6V | 0V |
| L | BYPASS MODE | 0V | 1.6V | 0V | 1.6V |

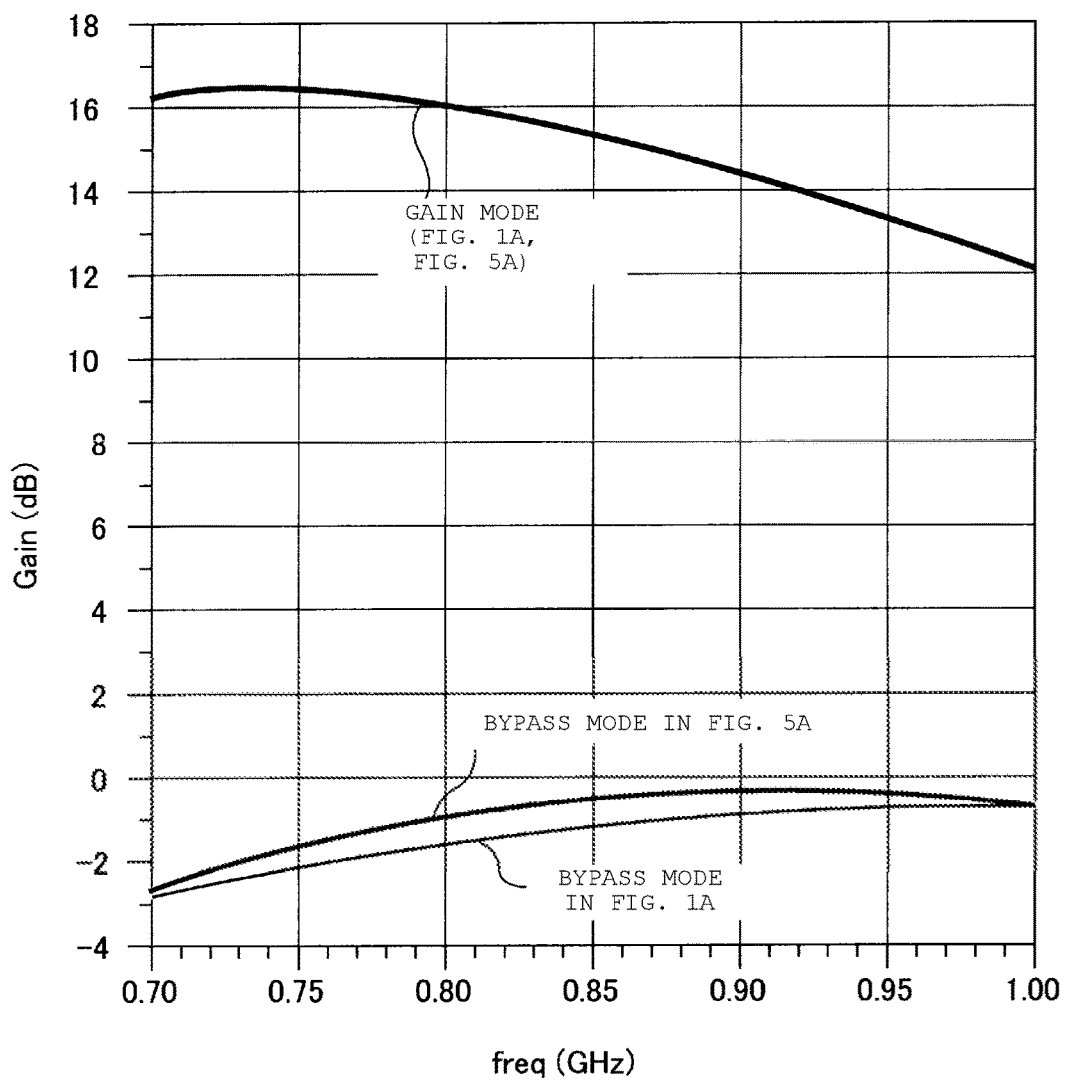

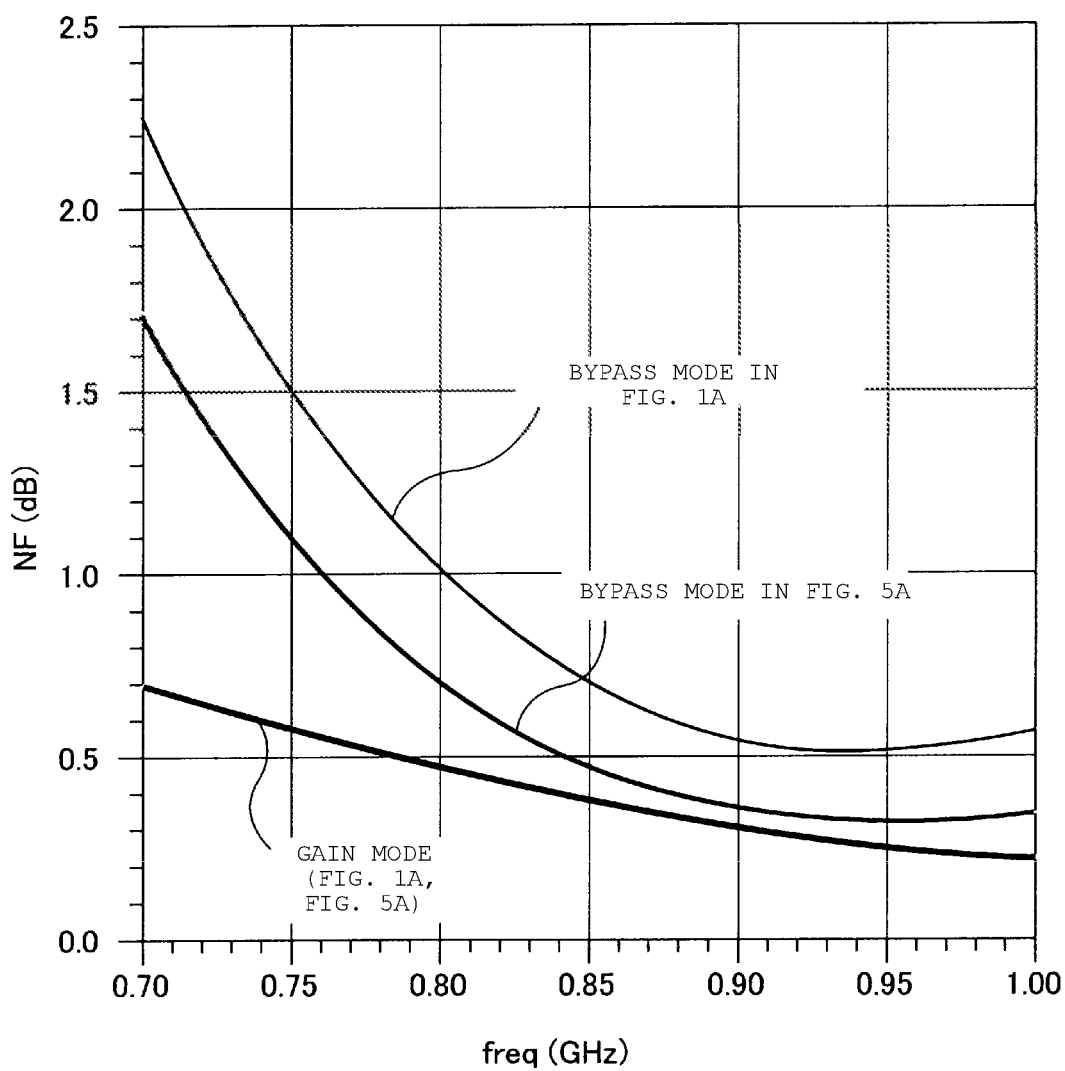

FIG. 8B

| EN | OPERATION MODE | Vdd_int | VB1 | VB2 |
|---|---|---|---|---|
| H | GAIN MODE | 1.6V | 0.35V | 1.15V |
| L | BYPASS MODE | 0V | 1.6V | 1.6V |

FIG. 14B

| EN | OPERATION MODE | Vdd_int | VB1 | VB2 | VH |
|---|---|---|---|---|---|
| H | GAIN MODE | 1.6V | 0.35V | 1.15V | 1.6V |
| L | BYPASS MODE | 0V | 1.6V | 1.6V | 1.6V |

FIG. 18B

| EN | OPERATION MODE | Vdd_int | VB1 | VB2 | VH |
|---|---|---|---|---|---|
| H | GAIN MODE | 1.6V | 0.35V | 1.15V | 1.6V |
| L | BYPASS MODE | 0V | 1.6V | 1.6V | 1.6V |

FIG. 21B

| Vc1 | Vc2 | Vc3 | OPERATION MODE | SELECTED INPUT TERMINAL | Vdd_int | VB11 | VB12 | VB21 | VB22 | Con1 | Con2 |
|---|---|---|---|---|---|---|---|---|---|---|---|
| H | L | H | GAIN | RFin1 | 1.6V | 0.35V | 1.15V | 0V | 0V | 1.6V | 0V |
| H | H | H | | RFin2 | 1.6V | 0V | 0V | 0.35V | 1.15V | 0V | 1.6V |
| L | L | H | BYPASS | RFin1 | 0V | 1.6V | 1.6V | 0V | 0V | 0V | 0V |
| L | H | H | | RFin2 | 0V | 0V | 0V | 1.6V | 1.6V | 0V | 0V |
| x | x | L | SHUTDOWN | — | 0V | 0V | 0V | 0V | 0V | 0V | 0V |

FIG. 25B

| Vc1 | Vc2 | Vc3 | OPERATION MODE | SELECTED INPUT TERMINAL | Vdd_int | VB11 | VB12 | VB21 | VB22 | Con1 | Con2 | Con3 | Con4 |
|---|---|---|---|---|---|---|---|---|---|---|---|---|---|
| H | L | H | GAIN | RFin1 | 1.6V | 0.35V | 1.15V | 0V | 0V | 1.6V | 0V | 1.6V | 1.6V |
| H | H | H | GAIN | RFin2 | 1.6V | 0V | 0V | 0.35V | 1.15V | 0V | 1.6V | 1.6V | 1.6V |
| L | L | H | BYPASS | RFin1 | 0V | 1.6V | 1.6V | 0V | 0V | 0V | 0V | 1.6V | 0V |
| L | H | H | BYPASS | RFin2 | 0V | 0V | 0V | 1.6V | 1.6V | 0V | 0V | 1.6V | 1.6V |
| x | x | L | SHUTDOWN | — | 0V | 0V | 0V | 0V | 0V | 0V | 0V | 0V | 0V |

FIG. 28B

| Vc1 | Vc2 | Vc3 | OPERATION MODE | SELECTED INPUT TERMINAL | Vdd_int | VB11 | VB12 | VB21 | VB22 | Con1 | Con2 | Con3 | Con4 |
|---|---|---|---|---|---|---|---|---|---|---|---|---|---|
| H | L | H | GAIN | RFin1 | 1.6V | 0.35V | 1.15V | 0V | 0V | 1.6V | 0V | 1.6V | 1.6V |
| H | H | H | GAIN | RFin2 | 1.6V | 0V | 0V | 0.35V | 1.15V | 0V | 1.6V | 1.6V | 1.6V |
| L | L | H | BYPASS | RFin1 | 0V | 1.6V | 1.6V | 0V | 0V | 0V | 0V | 1.6V | 0V |
| L | H | H | BYPASS | RFin2 | 0V | 0V | 0V | 1.6V | 1.6V | 0V | 0V | 1.6V | 1.6V |
| x | x | L | SHUTDOWN | — | 0V | 0V | 0V | 0V | 0V | 0V | 0V | 0V | 0V |

FIG. 36B

| Vc1 | Vc2 | Vc3 | OPERATION MODE | SELECTED INPUT TERMINAL | Vdd_int | VB11 | VB12 | VB21 | VB22 | Con1 | Con2 |
|---|---|---|---|---|---|---|---|---|---|---|---|
| H | L | H | GAIN | RFin1 | 1.6V | 0.35V | 1.15V | 1.6V | 1.6V | 0V | 0V |
| H | H | H | GAIN | RFin2 | 1.6V | 0V | 0V | 0V | 0V | 1.6V | 1.6V |
| L | L | H | BYPASS | RFin1 | 0V | 1.6V | 1.6V | 0V | 1.6V | 0V | 0V |
| L | H | H | BYPASS | RFin2 | 0V | 0V | 0V | 0V | 0V | 0V | 1.6V |
| x | x | L | SHUTDOWN | — | 0V | 0V | 0V | 0V | 0V | 0V | 0V |

HIGH-FREQUENCY SEMICONDUCTOR AMPLIFIER CIRCUIT

CROSS-REFERENCE TO RELATED APPLICATIONS

This application is a division of U.S. patent application Ser. No. 15/444,242, filed on Feb. 27, 2017, which claims the benefit of priority from Japanese Patent Application No. 2016-173002, filed Sep. 5, 2016, the entire contents of each of which are incorporated herein by reference.

FIELD

Embodiments described herein relate generally to a high-frequency semiconductor amplifier circuit.

BACKGROUND

Recently, studies have been under way to form a high-frequency low noise amplifier using an SOI (silicon on insulator) CMOS process (hereinafter, referred to as a SOI process) instead of a SiGe bipolar process (hereinafter, referred to as a SiGe process). The SOI process is generally lower in cost as compared with the SiGe process. In addition, since parasitic capacitance of a MOS transistor formed in the SOI process is usually small, power loss of the high frequency signal is reduced. Accordingly, when the SOI process is used, a high-frequency switch and a high-frequency low noise amplifier may be formed on the same SOI substrate without deterioration of electrical characteristics, whereby a single chip (integrated) product can be realized.

In recent years, there has been a demand for providing a bypass mode for the high-frequency amplifier by which the high-frequency input signal is output without being amplified by the high-frequency low noise amplifier in addition to a gain mode in which the signal is amplified by the high-frequency low noise amplifier.

To configure a circuit in which these two modes can be switched/selected; however, at least three switches are required at the front and back of the high-frequency low noise amplifier. Recently, a multi-band amplifier has been made in which some number of radio signals in different frequency bands can be switched. Accordingly, to make the number of bands switchable and to perform the above-described mode switching for each band, it becomes necessary to provide numerous additional switches. But, in general, it is desirable to reduce the size of the circuit required for mode/band switching as much as possible.

DESCRIPTION OF THE DRAWINGS

FIG. 5B is a diagram illustrating input/output voltages of a bias generation circuit in FIG. 5A.

FIG. 6 is a graph in which a gain of the high-frequency semiconductor amplifier circuit illustrated in FIG. 1A is compared with that of the high-frequency semiconductor amplifier circuit illustrated in FIG. 5A.

FIG. 7 is a graph in which a noise figure of the high-frequency semiconductor amplifier circuit illustrated in FIG. 1A is compared with that of the high-frequency semiconductor amplifier circuit illustrated in FIG. 5A.

FIG. 8B is a diagram illustrating input/output voltages of a bias generation circuit in the high-frequency semiconductor amplifier circuit of FIG. 8A.

FIG. 14B is a diagram illustrating input/output voltages of a bias generation circuit in the high-frequency semiconductor amplifier circuit illustrated in FIG. 14A.

FIG. 18B is a diagram illustrating input/output voltages of a bias generation circuit in the high-frequency semiconductor amplifier circuit illustrated in FIG. 18A.

FIG. 21B is a diagram illustrating input/output voltages of a bias generation circuit in the high-frequency semiconductor amplifier circuit illustrated in FIG. 21A.

FIG. 25B is a diagram illustrating input/output voltages of a bias generation circuit in the high-frequency semiconductor amplifier circuit illustrated in FIG. 25A.

FIG. 28B is a diagram illustrating input/output voltages of a bias generation circuit in the high-frequency semiconductor amplifier circuit illustrated in FIG. 28A.

FIG. 36B is a diagram illustrating input/output voltages of a bias generation circuit in the high-frequency semiconductor amplifier circuit illustrated in FIG. 36A.

DETAILED DESCRIPTION

In general, according to one embodiment, a high-frequency semiconductor amplifier circuit includes a first input terminal, at which a first signal having a high frequency can be input, and a first output terminal, at which an output signal corresponding to the first signal can be output. A first transistor is on a semiconductor on insulator (SOI) substrate. A gate of the first transistor is connected to the first input terminal via a first capacitor. A drain of the first transistor is connected to the first output terminal via a third capacitor. A second transistor is on the SOI substrate and is connected between a source of the first transistor and a reference potential terminal. A bias generation circuit has a first input control signal terminal, at which an first input control signal can be received, a first bias voltage terminal connected to the gate of the first transistor via a first resistor, a control voltage terminal connected to a gate of the second transistor via a second resistor, and a first intermediate voltage terminal connected to the drain of the first transistor via a third resistor and a first inductor connected in parallel. The bias generation circuit is configured to supply: a control voltage at the control voltage terminal to place the second transistor in a conducting state when the first input control signal is at a first level, and to place the second transistor in a non-conducting state when the first input control signal is at a second level; a first bias voltage at the first bias terminal at a first bias level when the first input control signal is at the first level, and at a second bias level, that is higher than the first bias level, when the first input control signal is at the second level; and a first voltage at the first voltage terminal at a first intermediate level that is between a reference potential and a power supply potential supplied to the bias generation circuit when the first input control signal is at the first level, and at the reference potential when the first input control signal is at the second level.

Example embodiments will be described below with reference to the accompanying drawings.

First Embodiment

Figure 1A:
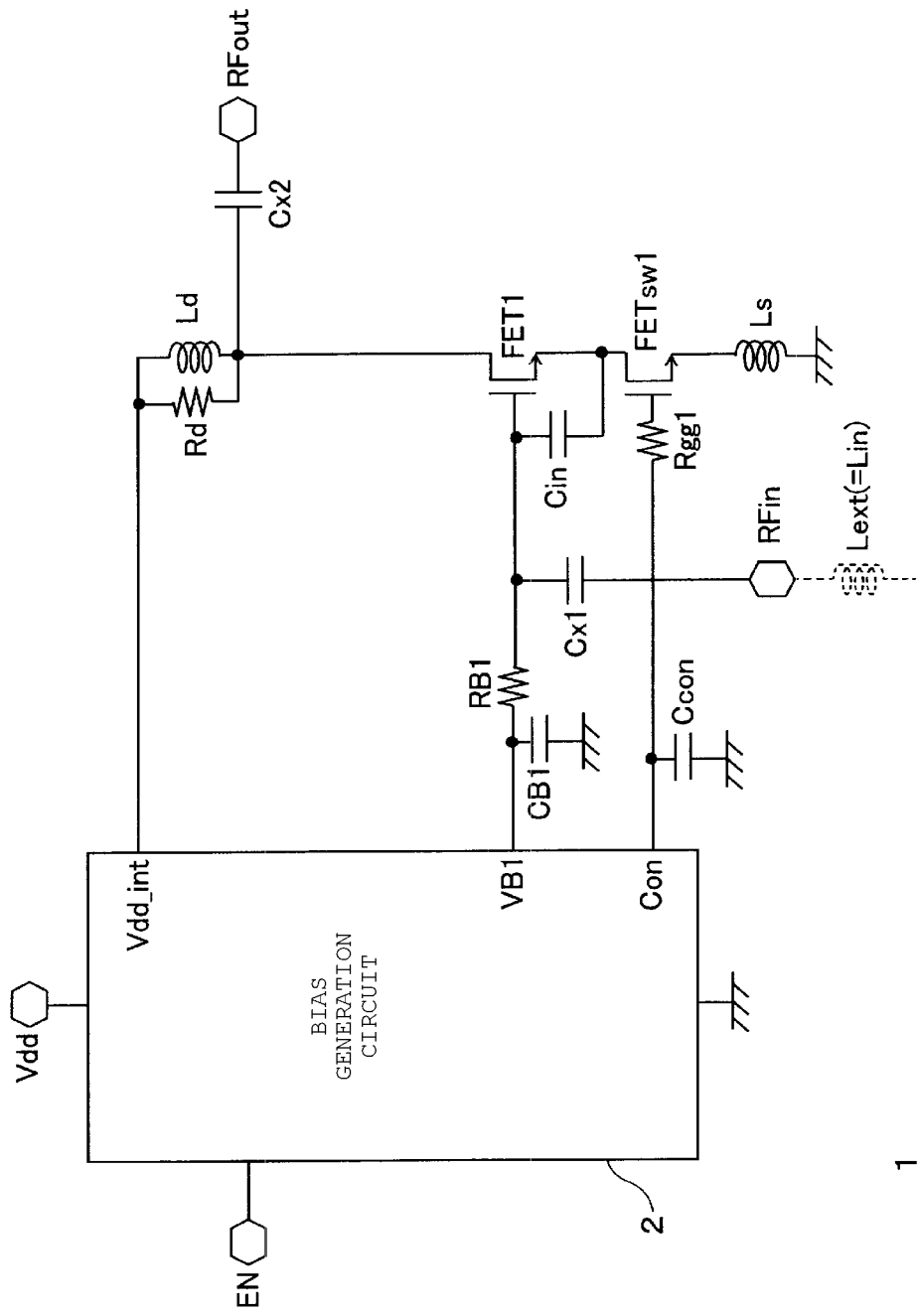
FIG. 1A is a circuit diagram of a high-frequency semiconductor amplifier circuit according to a first embodiment.
Figures 1B, 2:
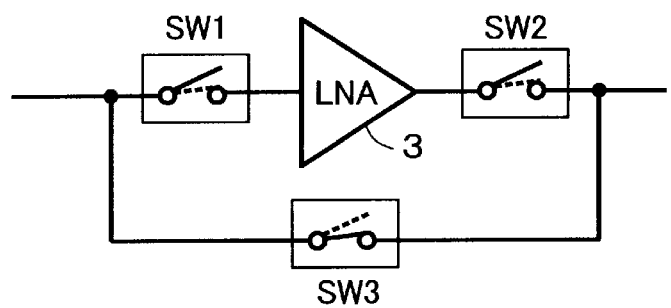
FIG. 1B is a diagram illustrating input/output voltages of a bias generation circuit in FIG. 1A.
FIG. 2 is an equivalent circuit diagram of the high-frequency semiconductor amplifier circuit illustrated in FIG. 1A.

FIG. 1A is a circuit diagram of a high-frequency semiconductor amplifier circuit 1 according to a first embodiment. FIG. 1B is a diagram illustrating input/output voltages of a bias generation circuit 2 in FIG. 1A. FIG. 2 is an equivalent circuit diagram of the high-frequency semiconductor amplifier circuit 1 depicted in FIG. 1A. In FIG. 1A, the high-frequency semiconductor amplifier circuit 1 includes a high-frequency LNA (Low Noise Amplifier) 3 (see FIG. 2). The elements of the high-frequency semiconductor amplifier circuit 1 illustrated in FIG. 1A are fabricated on a common SOI substrate by a CMOS process.

The high-frequency semiconductor amplifier circuit 1 illustrated in FIG. 1A conceptually includes the high-frequency LNA 3 and switches SW1 to SW3 as illustrated in FIG. 2. By closing of the switches SW1 and SW2 and opening of the switch SW3, a gain mode (first mode) is selected and a high-frequency input signal is amplified and then output by the high-frequency LNA 3. By opening the switches SW1 and SW2 and closing the switch SW3, a bypass mode (second mode) is selected in which a high-frequency input signal is output without being amplified by the high-frequency LNA 3. The high-frequency semiconductor amplifier circuit 1 according to this first embodiment is capable of arbitrarily performing a mode switch between the first mode and the second mode.

In FIG. 1A, the high-frequency semiconductor amplifier circuit 1 includes a bias generation circuit 2, an N-type transistor (first transistor) FET1, an N-type transistor (second transistor) FETsw1, inductors Ld and Ls, resistors Rd, RB1, and Rgg1, and capacitors Cin, Cx1, Cx2, CB1, and Ccon.

The bias generation circuit 2 is provided with a terminal for receiving an enable signal (input control signal) EN and a terminal for receiving an external power supply voltage Vdd. The enable signal EN is a mode switching signal for switching between the gain mode and the bypass mode. For example, the gain mode is selected when the enable signal EN is High, and the bypass mode is selected when the enable signal EN is Low. In the bias generation circuit 2, a voltage (first voltage) Vdd_int, a bias voltage (first bias voltage) VB1, and a control voltage Con are output at voltage levels that depend on whether the gain mode or the bypass mode is being selected.

More specifically, the bias generation circuit 2 generates the control voltage Con such that the FETsw1 is turned on while in the gain mode, and sets the bias voltage VB1 to be lower than a drain-to-source voltage of the FET1. Further, the bias generation circuit 2 generates the control voltage Con such that the FETsw1 is turned off while in the bypass mode, and generates the bias voltage VB1 such that a channel of the FET1 is in a strong inversion state.

A gate of the FET1 receives the high-frequency input signal via the capacitor Cx1 from an input terminal RFin. The capacitor Cx1, which is a DC-cut capacitor, is set to a large value so as not to adversely affect the characteristic impedance. An inductor Lin is externally attached to the input terminal RFin for receiving the high-frequency input signal, and is set to a relatively large value (about 20 nH (nanoHenries) or more at the high-frequency LNA 3 for 900 MHz band signal).

The bias voltage VB1 output from the bias generation circuit 2 is input to the gate of the FET1 via the resistor RB1. The capacitor CB1 is connected between an output terminal of the bias generation circuit 2, which outputs the bias voltage VB1, and a ground node (reference node). The resistor RB1 and the capacitor CB1 are provided to prevent a high frequency signal from entering the output terminal of the bias generation circuit 2 outputting the bias voltage VB1.

The capacitor Cin is connected between the gate and the source of the FET1. One end of the resistor Rd, the inductor Ld, and the capacitor Cx2 is connected to a drain of the FET1. The voltage Vdd_int output from the bias generation circuit 2 is input to the other end of the resistor Rd and the inductor Ld. An output terminal RFout of the high-frequency semiconductor amplifier circuit 1 is connected to the other end of the capacitor Cx2.

The resistor Rd is a stabilizing resistor and has a function of suppressing oscillation and lowering output impedance. Output matching is provided by the inductor Ld and the capacitor Cx2. A value of the inductor Ld can be reduced by the resistor Rd.

The control voltage Con output from the bias generation circuit 2 is input to a gate of the FETsw1 via a resistor Rgg1. The capacitor Ccon is connected between the output terminal of the bias generation circuit 2 outputting the control voltage Con and the ground node. The resistor Rgg1 is a high resistance resistor, and the high frequency signal can be prevented from leaking from the gate of the FETsw1 by the resistor Rgg1 when the FETsw1 is turned on. The FETsw1 functions as a switch for switching the electrically connection of the source of the FET1 to one end of the inductor Ls.

The bias generation circuit 2 generates the bias voltage VB1 that drives the gate of the FET1, the control voltage Con that performs the switching on or off of the FETsw1, and the voltage Vdd_int that is input to the other end of each of the resistor Rd and the inductor Ld. The voltage Vdd_int is a voltage used for setting the drain voltage of the FET1.

FIG. 1B illustrates a correlation between logic (High/Low) of the enable signal EN, the voltage Vdd_int, the bias voltage VB1, and the control voltage Con for the embodiment depicted in FIG. 1A. As illustrated in FIG. 1B, when the enable signal EN is High (H), the gain mode is selected, the voltage Vdd_int becomes 0.8 V, the bias voltage VB1 becomes 0.35 V, and the control voltage Con becomes 1.6V. When the enable signal EN is Low (L), the bypass mode is selected, the voltage Vdd_int becomes 0 V, the bias voltage VB1 becomes 1.6 V, and the control voltage Con becomes 0 V.

In the following description, an example will be described in which the threshold voltage of FET1 is 0.3 V and the threshold voltage of the FETsw1 is 0.5 V. Since the FETsw1 operates as a switch, the threshold voltage thereof is set to be higher than that of the FET1, and the FETsw1 is securely turned off.

First, the gain mode (when the enable signal EN is High) of the high-frequency semiconductor amplifier circuit 1 illustrated in FIG. 1A will be described. In the gain mode, the control voltage Con is 1.6 V, and the FETsw1 is turned on. In this first embodiment, an on-state resistance of the FETsw1 is set to be negligibly small.

In the gain mode, the bias voltage VB1 input to the gate of the FET1 is set to 0.35 V as illustrated in FIG. 1B. This reason will be described.

Figure 3:
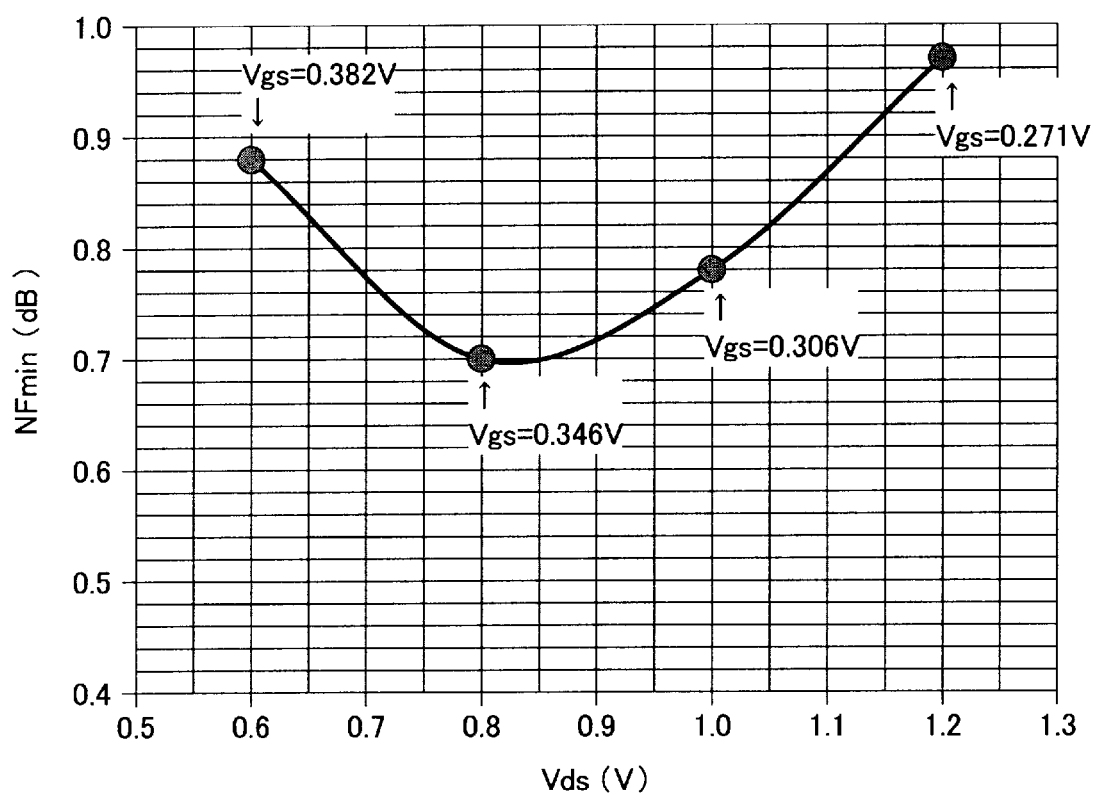
FIG. 3 is a graph illustrating a relation between a drain-to-source voltage of a FET and a minimum noise figure NFmin of a noise figure NF of the FET.

FIG. 3 is a graph illustrating a relation between the drain-to-source voltage Vds of the FET1 and a minimum noise figure NFmin of a noise figure NF of the FET1. The NFmin is a value of the noise figure NF when noise matching is made. In FIG. 3, a drain current Idd of the FET1 is fixed at 2 mA, and a frequency of the high-frequency input signal is 2 GHz. In addition, a gate-oxide-film thickness Tox of the FET1 is 2.5 nm, and a gate length Lg is 0.14 μm.

According to FIG. 3, when Vds=0.8 V, the NFmin becomes minimum, that is, best. At this time, a gate-to-source voltage Vgs is 0.346 V.

Based on the result of FIG. 3, the voltage Vdd_int is set to 0.8V and the bias voltage VB1 is set to 0.35 V in the gain mode. In addition, the threshold voltage of the FET1 is 0.3V. Therefore, setting the bias voltage VB1 to 0.35 V means that a gate voltage of the FET1 is set close to the threshold voltage.

When the Vgs is lowered under the condition that a drain-to-source current Ids of the FET1 is constant, a Vdsl inevitably becomes high, and the following Expression (1) is established:

$$VB1 < Vds1 \qquad \text{Expression (1)}$$

Accordingly, setting the gate voltage of the FET1 close to the threshold voltage means to operate the FET1 within the range in which the above-described Expression (1) is satisfied.

On the other hand, in the bypass mode where the enable signal EN has a low level, voltages become as follows: Vdd_int=0 V, VB1=1.6 V, and Con=0 V. Since Con=0 V, the FETsw1 is turned off. In addition, since VB1=1.6 V, a channel of the FET1 is in a strong inversion state. Therefore, a gate-to-channel capacitance of the FET1 becomes a gate oxide film capacitance Cox.

Assuming that a gate width of the FET1 is 0.5 mm and a relative dielectric constant of the gate oxide film is 3.9, the gate oxide film capacitance Cox is expressed by the following Equation (1). As expressed in the Equation (1), the gate oxide film capacitance Cox has a relatively large value.

$$Cox = 8.854187816 \times 10^{-12} \times 3.9 \times 0.14 \times 0.14 \times 10^{-6} \times 0.5 \times 10^{-3}/2.5 \times 10^{-9} \cong 0.97 \text{ pF} \qquad \text{(Equation 1)}$$

Figure 4:
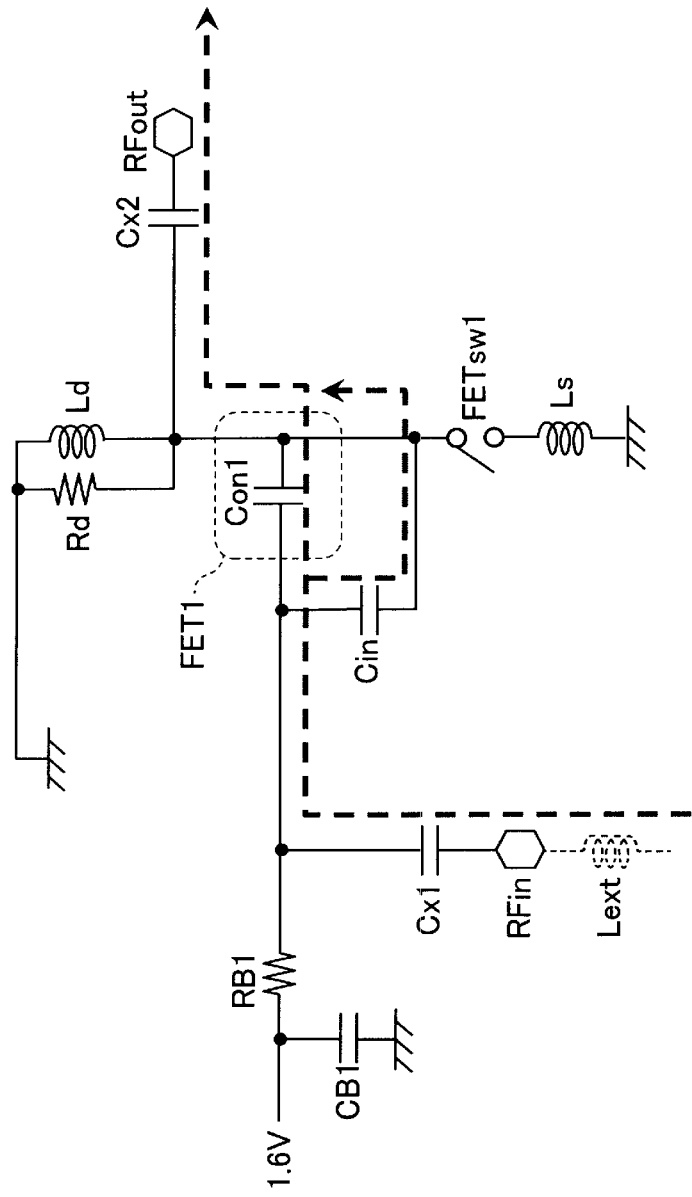
FIG. 4 is a schematic diagram illustrating an equivalent circuit and a signal path of the circuit illustrated in FIG. 1A while in a bypass mode.

FIG. 4 is a schematic diagram illustrating an equivalent circuit and a signal path of the high-frequency semiconductor amplifier circuit 1 illustrated in FIG. 1A while in the bypass mode. In FIG. 4, the FET1 is represented only by a gate-to-channel capacitance Con1 (approximately the sum of the Cox and a gate fringing capacitance), and the on-state resistance of the FET1 is ignored.

In FIG. 4, the high-frequency input signal passes through a series inductance Lext, which is externally attached to the high-frequency semiconductor amplifier circuit 1 (or a chip including the high-frequency semiconductor amplifier circuit 1), and the DC-cut capacitor Cx1, and reaches a channel node of the FET1 through the shunt capacitor formed of the capacitors Con1 and Cin which has an equivalent capacitance to the FET1. In the bypass mode, since the FETsw1 is in the OFF state, the high-frequency input signal passes to the drain of the FET1.

Here, the characteristic impedance of the signal path might deviate from 50Ω due to the inductor Lext, the shunt capacitor of the capacitors (Cin+Con1), the inductor Ld, the resistor Rd, and the capacitor Cx2 on the signal path through which the high-frequency input signal passes. However, if a proper design is adopted, the characteristic impedance need not significantly deviates from 50Ω.

As illustrated in FIG. 4, in the bypass mode, since the FETsw1 is turned off and the FET1 is in the strong inversion state, the FET1 can be regarded as electrically equivalent to the MOS capacitor Con1. Accordingly, the high-frequency input signal is bypassed to the output terminal via the capacitor Cx1, the combined capacitor (Cin+Con1), and the capacitor Cx2. In this way, switching can be performed between the gain mode and the bypass mode without having additional switches except for the FET1 and the FETsw1, and thus the circuit size can be reduced.

Figure 5A:
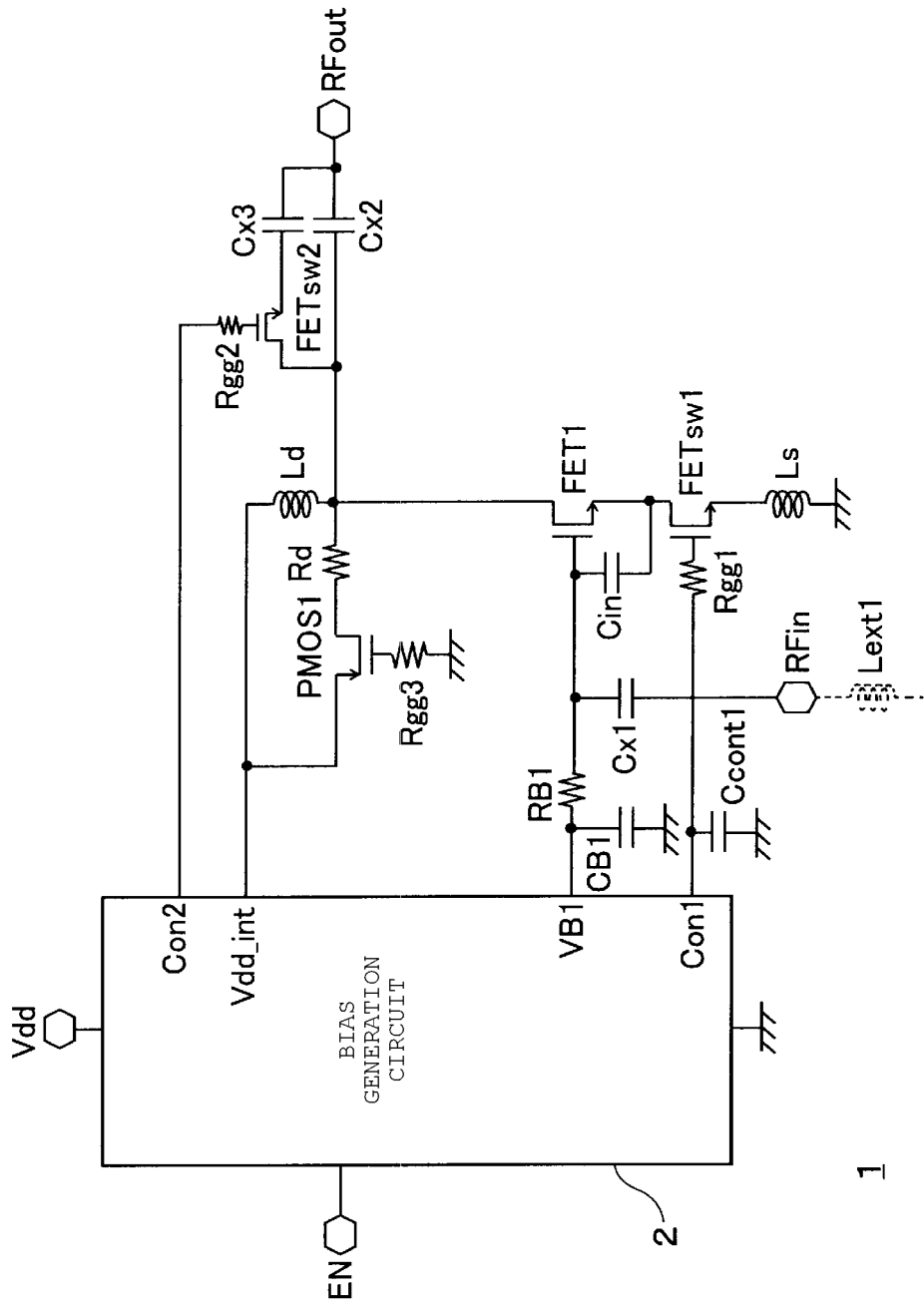
FIG. 5A is a circuit diagram of a high-frequency semiconductor amplifier circuit according to a first modified example of FIG. 1A.

FIG. 5A is a circuit diagram of a high-frequency semiconductor amplifier circuit 1 according to a first modified example of FIG. 1A. FIG. 5B is a diagram illustrating input/output voltages of a bias generation circuit 2 illustrated in FIG. 5A. FIG. 5B illustrates a correlation between logic of an enable signal EN, a voltage Vdd_int, a voltage VB1, and a voltage Con in FIG. 5A. The high-frequency semiconductor amplifier circuit 1 illustrated in FIG. 5A includes a P-type transistor (switching circuit) PMOS1 and an N-type transistor FETsw2 in addition to the configuration of FIG. 1A.

A control voltage Con2 output from the bias generation circuit 2 is input to a gate of the FETsw2 via a high resistance resistor Rgg2. A capacitor Cx2 is connected between a drain of the FETsw2 and an output terminal RFout. A capacitor Cx3 is connected between a source of the FETsw2 and the output terminal RFout. In a gain mode, since the control voltage Con2 is 0 V, the FETsw2 is turned off. Accordingly, the capacitor Cx3 becomes ineffectual in the gain mode. In a bypass mode, the Con2 is 1.6 V, the FET2 is turned on, and thus the capacitor Cx3 becomes effective.

The voltage Vdd_int output from the bias generation circuit 2 is input to a source of a PMOS1. A high resistance resistor Rgg3 is connected between a gate of the PMOS1 and a ground node. In this description, a threshold voltage of the PMOS1 is set to −0.5 V. In this case, the PMOS1 is turned on in the gain mode, a resistor Rd becomes effective. In the bypass mode, since Vgs=0 V, the PMOS1 is turned off, and the resistor Rd becomes ineffectual. In this way, the resistor Rd causing the loss becomes ineffective in the bypass mode, and the capacitor Cx3 can be appropriately set, whereby the characteristic impedance of the high-frequency path can be brought close to the preferable value of 50Ω.

FIGS. 6 and 7 are diagrams in which electrical characteristics of the high-frequency semiconductor amplifier circuit 1 illustrated in FIG. 1A are compared with those of the high-frequency semiconductor amplifier circuit 1 illustrated in FIG. 5A. In FIG. 6, a horizontal axis represents a frequency (GHz), and a vertical axis represents a gain (dB) of the high-frequency semiconductor amplifier circuit 1. In the gain mode, both the circuits illustrated in FIGS. 1A and 5A have substantially the same gain. On the other hand, in the bypass mode, the gain of the circuit illustrated in FIG. 5A is slightly larger (closer to zero dB) than that of the circuit illustrated in FIG. 1A. For example, at 900 MHz (0.90 GHz), both circuits illustrated in FIGS. 1A and 5A have a gain of about 14.4 dB in the gain mode. On the other hand, in the bypass mode, the circuit illustrated in FIG. 1A has a gain of −0.89 dB, and the circuit illustrated in FIG. 5A has a gain of −0.34 dB.

In FIG. 7, a horizontal axis represents a frequency (GHz), and a vertical axis represents a noise figure NF (dB). In the gain mode, both circuits illustrated in FIGS. 1A and 5A have substantially the same noise figure NF. On the other hand, in the bypass mode, the noise figure NF of the circuit illustrated in FIG. 5A is smaller, and thus better, than that of the circuit illustrated in FIG. 1A. For example, at 900 MHz, both circuits illustrated in FIGS. 1A and 5A have a noise figure NF of about 0.31 dB in the gain mode. On the other hand, in the bypass mode, the circuit illustrated in FIG. 1A has a noise figure of about 0.55 dB, and the circuit illustrated in FIG. 5A has a noise figure of about 0.36 dB.

Thus, it can be found that the circuit illustrated in FIG. 5A has a larger gain and a smaller noise figure NF than the circuit illustrated in FIG. 1A when in the bypass mode. That is, the circuit illustrated in FIG. 5A is superior to the circuit illustrated in FIG. 1A, with respect to the electrical characteristics while operating in the bypass mode.

As described above, according to the first embodiment, the FETsw1 is provided at the source side of the FET1, which amplifies the high-frequency input signal, to switch whether or not to disconnect the connection path between the source of the FET1 and the inductor Ls, and the FETsw1 is turned on in the gain mode, whereby the high-frequency input signal is amplified by the FET1 and the amplified signal can be output. On the other hand, in the bypass mode, the FETsw1 is turned off, the FET1 can be regarded equivalently to a MOS capacitor, and the high-frequency input signal is propagated to the output terminal RFout via this MOS capacitor. Accordingly, the switching between the gain mode and the bypass mode can be performed using only the FET1 and FETsw1 switches/transistors, and the configuration of the high-frequency semiconductor amplifier circuit 1 can be simplified.

In gain mode, since the gate voltage of the FET1 is set close to the threshold voltage, the noise figure NF of the FET1 can be minimized.

Furthermore, by the inclusion of PMOS1 and FETsw2, as illustrated in FIG. 5A, the characteristic impedance in the bypass mode can be brought close to 50Ω, and the loss can be reduced.

Second Embodiment

In the first embodiment, as illustrated in FIG. 1A, the FETsw1 can be added to the source of the common source FET1, and thus the amplified signals are output from the drain of the FET1. In this case, gate-to-drain capacitance Cgd of the FET1 act as a Miller capacitance, thereby deteriorating a high frequency gain. In a second embodiment, a FET2 is connected with FET1 in a cascode manner to reduce the voltage amplitude on the drain of the FET1, and thus, the influence of the Cgd can be reduced to improve the high frequency gain.

Figure 8A:
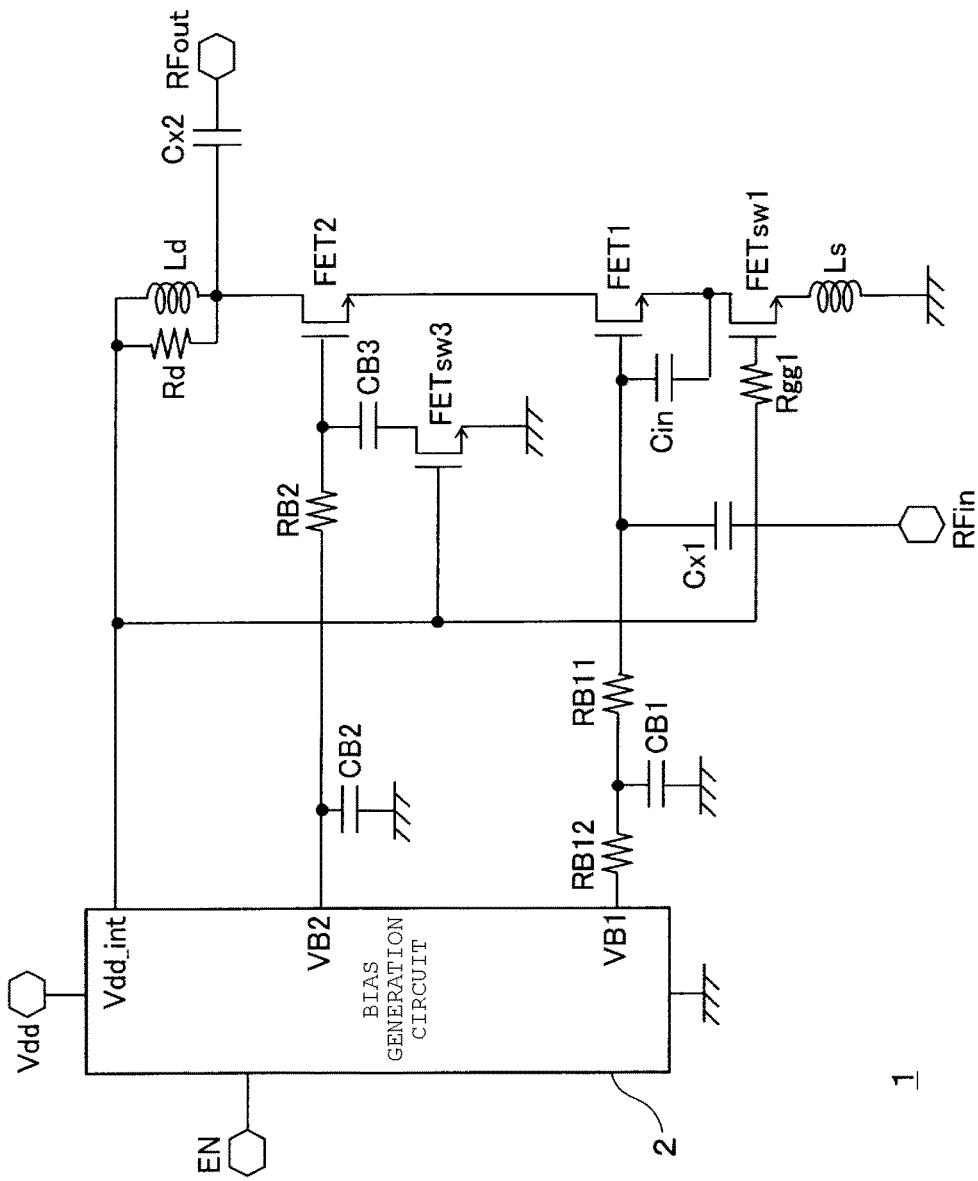
FIG. 8A is a circuit diagram of a high-frequency semiconductor amplifier circuit according to a second embodiment.

FIG. 8A is a circuit diagram of a high-frequency semiconductor amplifier circuit 1 according to the second embodiment, and FIG. 8B is a diagram illustrating input/output voltages of a bias generation circuit 2 in the high-frequency semiconductor amplifier circuit 1 illustrated in FIG. 8A. In FIG. 8A, the high-frequency semiconductor amplifier circuit 1 includes an N-type transistor (third transistor) FET2, an N-type transistor (first switching circuit) FETsw3, a capacitor CB2, a capacitor (first capacitor) CB3, and a resistor RB2 in addition to the circuit elements illustrated in FIG. 1A.

A drain of the FET2 is connected to one end of a resistor Rd, an inductor (first inductor) Ld, and a capacitor (second capacitor) Cx2. A signal obtained by amplifying the high-frequency input signal is output from an output terminal RFout through the drain of the FET2 via the capacitor Cx2.

A source of the FET2 is connected to a drain of the FET1. That is, the FET2 is connected to the FET1 and forms a cascode amplifier circuit together with the FET1. A gate of the FET2 receives a bias voltage (second bias voltage) VB2, which is output from the bias generation circuit 2, via a resistor RB2. The capacitor CB2 is connected between an output terminal of the bias generation circuit 2, which outputs the bias voltage VB2, and a ground node. The resistor RB2 is provided to prevent the high frequency signal from entering the output terminal of the bias generation circuit 2 which outputs the bias voltage VB2. The gate of the FET2 is connected to a drain of the FETsw3 via the capacitor CB3. A source of the FETsw3 is grounded. A voltage Vdd_int is input to a gate of the FETsw3 and the other end of the resistor Rd and the inductor Ld. The gate of the FETsw3 is connected to the gate of the FETsw1 via a resistor Rgg1.

A bias voltage VB1 output from the bias generation circuit 2 is input to the gate of the FET1 via resistors RB11 and RB12, which are connected to each other in series. A capacitor CB1 is connected between a connection node of the resistor RB11 and RB12 and a ground node. The resistors RB11 and RB12 and the capacitor CB1 are provided to prevent the high frequency signal from entering the output terminal of the bias generation circuit 2 which outputs the bias voltage VB1.

Similarly to the first embodiment, the high-frequency semiconductor amplifier circuit 1 illustrated in FIG. 8A also has a gain mode when the enable signal EN is High and a bypass mode when the enable signal EN is Low. It is assumed that both of the FET1 and the FET2 have a threshold voltage of 0.3 V and both of the FETsw1 and the FETsw3 have a threshold voltage of 0.5 V.

As illustrated in FIG. 8B, when in the gain mode, the voltage Vdd_int is set to 1.6 V, the bias voltage VB1 is set to 0.35 V, and the bias voltage VB2 is set to 1.15 V. In the gain mode, both of the FETsw1 and the FETsw3 are turned on. The reason for setting the bias voltage VB1 to 0.35 V is that the gate voltage of the FET1 is set close to the threshold voltage as in the first embodiment. The reason for setting the bias voltage VB2 to 1.15 V is that the drain-to-source voltage of the FET1 is set to an optimum value (for example, 0.8 V) as in the first embodiment. In the gain mode, the gate voltage of the FET1 is set close to the threshold voltage, a Vdsl is appropriately set, and thus the noise figure NF can be lowered with low current consumption.

On the other hand, in the bypass mode, the voltage Vdd_int is set to 0 V, the bias voltage VB1 is set to 1.6 V, and the VB2 is set to 1.6 V. Thus, the FET1 is in a strong inversion state, and is completely turned on.

Figure 9:
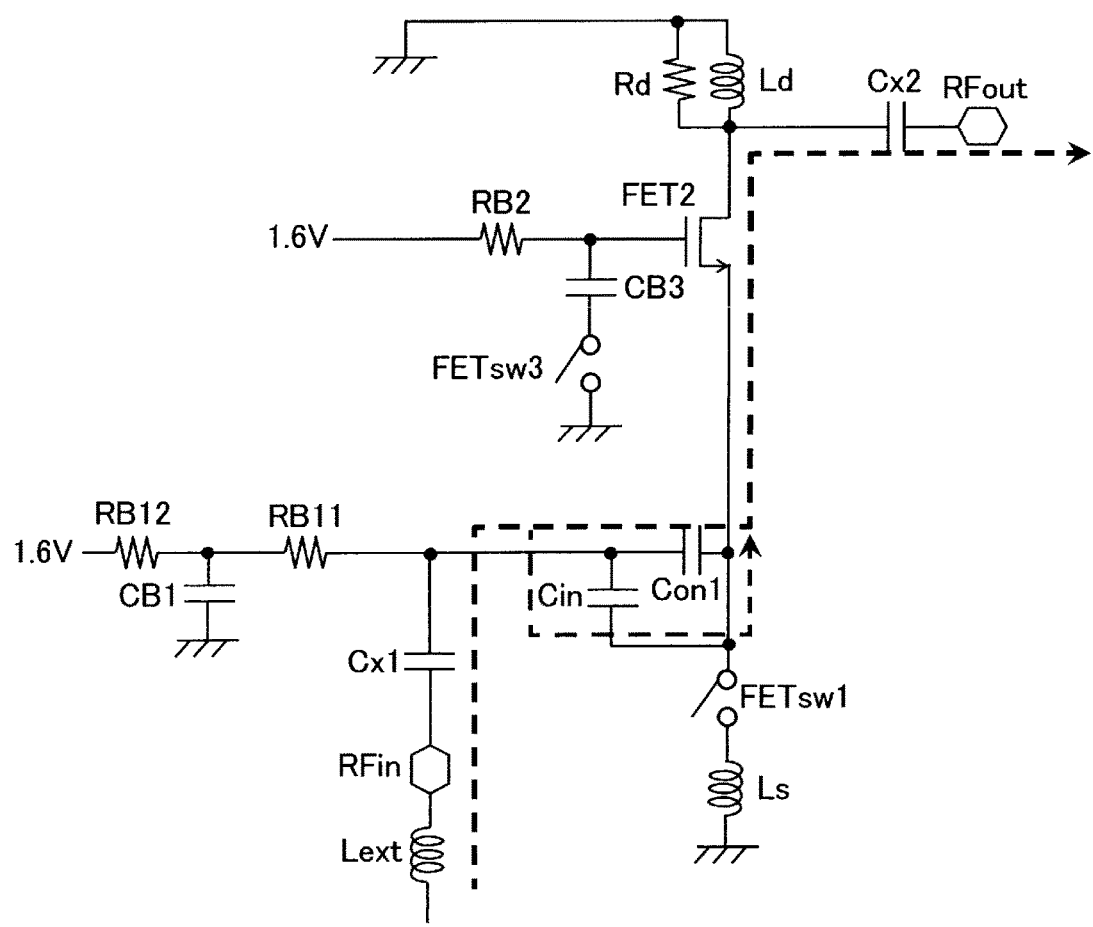
FIG. 9 is a schematic diagram illustrating an equivalent circuit and a signal path of the circuit illustrated in FIG. 8A while in a bypass mode.

FIG. 9 is a schematic diagram illustrating an equivalent circuit and a signal path of the high-frequency semiconductor amplifier circuit 1 illustrated in FIG. 8A when in the bypass mode. In the bypass mode, because of having a gate-to-source voltage Vgs of 0 V, both of the FETsw1 and the FETsw3 are turned off. In this case, after passing through the capacitor Cx1, the high-frequency input signal reaches a source node of the FET2 through a combined capacitor comprised of a gate capacitor Con1 of the FET1 and a capacitor Cin, which are connected in parallel to each other. Since the FET2 is in the ON-state, the signal reaching the source node of the FET2 passes through the FET2 and is output from the output terminal RFout via the capacitor Cx2.

The characteristic impedance of the signal path deviates from the value of 50Ω due to the presence of the inductor Lext attached externally, the capacitor Con1, the resistor Rd, and the capacitor Cx2. However, if constants of these passive elements are appropriately selected, there is no concern that the characteristic impedance substantially deviates from 50Ω.

Figure 10:
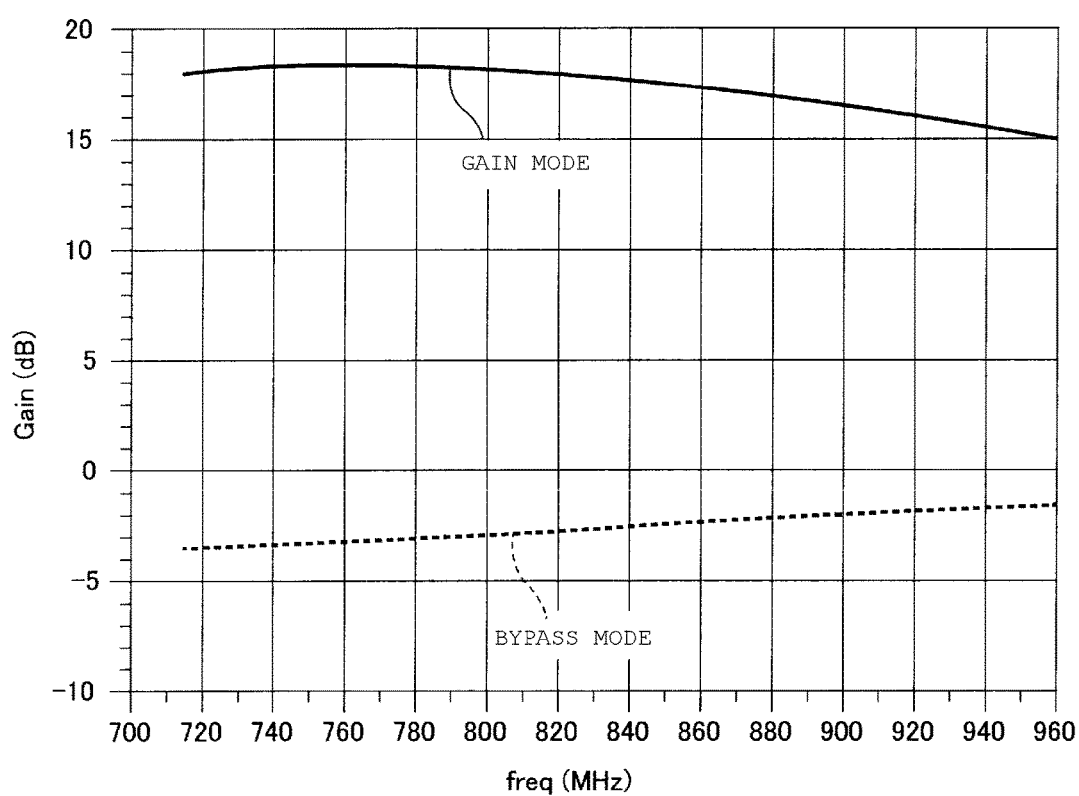
FIG. 10 is a graph illustrating simulation results of a gain of the high-frequency semiconductor amplifier circuit illustrated in FIG. 8A.
Figure 11:
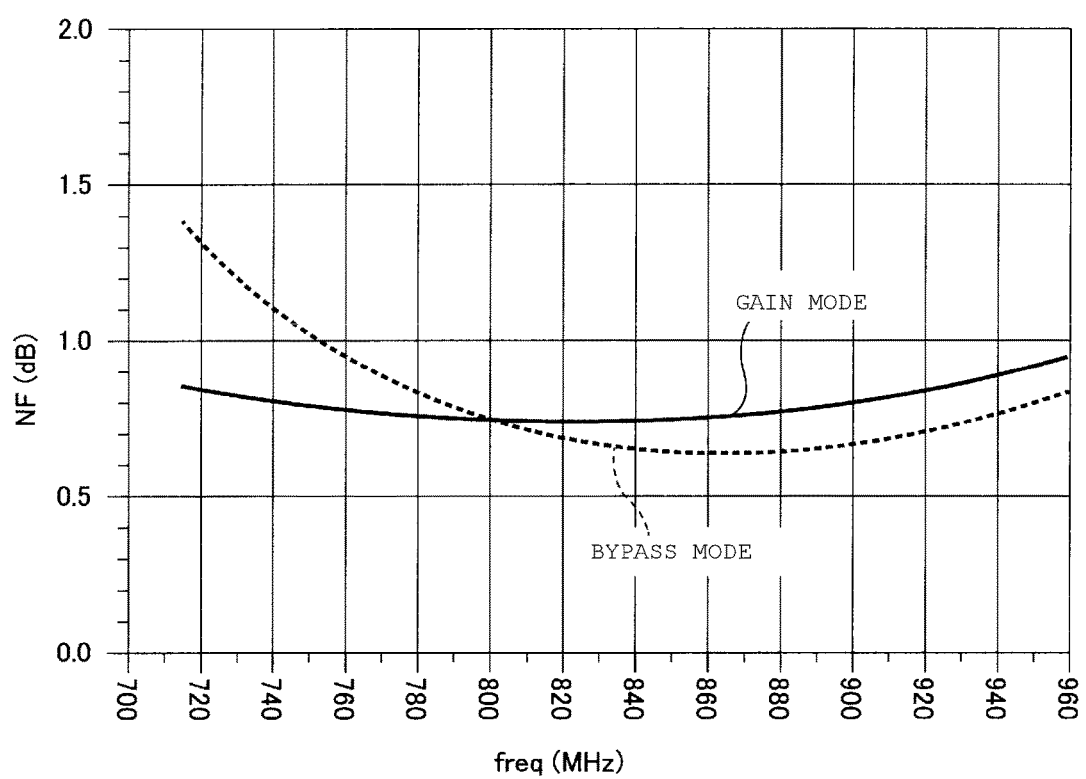
FIG. 11 is a graph illustrating simulation results for a noise figure of the high-frequency semiconductor amplifier circuit illustrated in FIG. 8A.

FIGS. 10 and 11 are graphs illustrating simulation results for the high-frequency semiconductor amplifier circuit 1 illustrated in FIG. 8A. In FIG. 10, a horizontal axis represents a frequency (MHz), and a vertical axis represents a gain (dB). Excellent gain characteristics are obtained at a frequency of 820 MHz. For example, the gain is about 17.9 dB in the gain mode, and the gain is about −2.7 dB in the bypass mode for this frequency.

In FIG. 11, a horizontal axis represents a frequency (MHz), and a vertical axis represents a noise figure NF (dB).

For example, at a frequency of 820 MHz, the noise figure NF is 0.74 dB in the gain mode, and the noise figure NF is 0.68 dB in the bypass mode.

As can be seen from the graph of FIG. 10, a loss is as small as about 3 dB in the bypass mode. As can be seen from the graph of FIG. 11, the noise figure NF is excellent at about 0.7 dB in the bypass mode.

Figure 12:
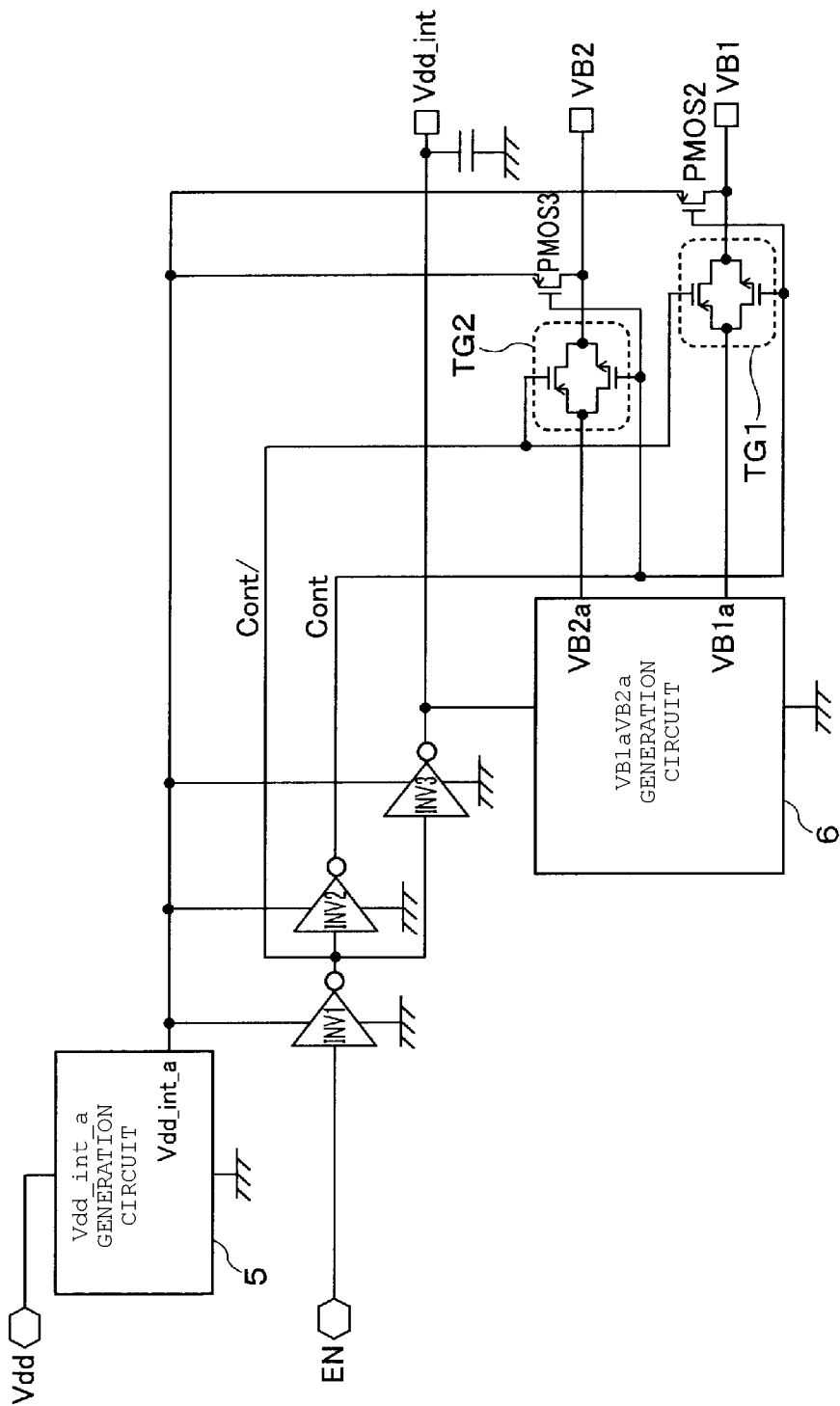
FIG. 12 is a circuit diagram illustrating an example circuit configuration of the bias generation circuit illustrated in FIG. 8A.

FIG. 12 is a circuit diagram illustrating an example circuit configuration of the bias generation circuit 2 illustrated in FIG. 8A. In FIG. 12, the bias generation circuit 2 includes a Vdd_int_a generation circuit 5, a VB1aVB2a generation circuit 6, inverters INV1, INV2, and INV3, and transfer gates TG1 and TG2.

The Vdd_int_a generation circuit 5 generates an internal voltage Vdd_int_a for the voltage Vdd_int based on the external power-supply voltage Vdd. The VB1aVB2a generation circuit 6 generates internal voltages VB1a and VB2a for the voltages VB1 and VB2. The internal voltage VB1a is, for example, 0.35 V, and the internal voltage VB2a is 1.15 V, for example.

The inverter INV1 inverts and outputs the enable signal EN. The inverters INV2 and INV3 invert and output the output signal of the inverter INV1. An output signal Cont from the inverter INV2 and an output signal Cont/ from the inverter INV1 are used to control the transfer gates TG1 and TG2, respectively. An output signal of the inverter INV3 is supplied to a terminal for outputting the voltage Vdd_int. A power-supply voltage of each of these inverters INV1 to INV3 is the internal voltage Vdd_int_a.

A P-type transistor (not specifically illustrated) in the inverter INV3 preferably has a gate width of 1 mm or larger, for example. An output voltage of the inverter INV3 is supplied to the output terminal as the voltage Vdd_int. A large capacitance of 10 pF or more is preferably provided at the output terminal for the voltage Vdd_int.

The transfer gate TG1 switches whether or not to supply the internal voltage VB1a to an output terminal for the bias voltage VB1, based on the output signals Cont and Cont/. The transfer gate TG2 switches whether or not to supply the internal voltage VB2a to an output terminal for the bias voltage VB2, based on the output signals Cont and Cont/.

A drain of a P-type transistor PMOS2 is connected to the output terminal for the bias voltage VB1. The PMOS2 outputs the internal voltage Vdd_int_a from the output terminal as the bias voltage VB1 when the output signal Cont from the inverter INV2 is Low, that is, during the bypass mode when the enable signal EN is Low.

A drain of a P-type transistor PMOS3 is connected to the output terminal for the bias voltage VB2. The PMOS3 outputs the internal voltage Vdd_int_a from the output terminal as the bias voltage VB2 when the output signal Cont of the inverter INV2 is Low, that is, during the bypass mode when the enable signal EN is Low.

Figure 13:
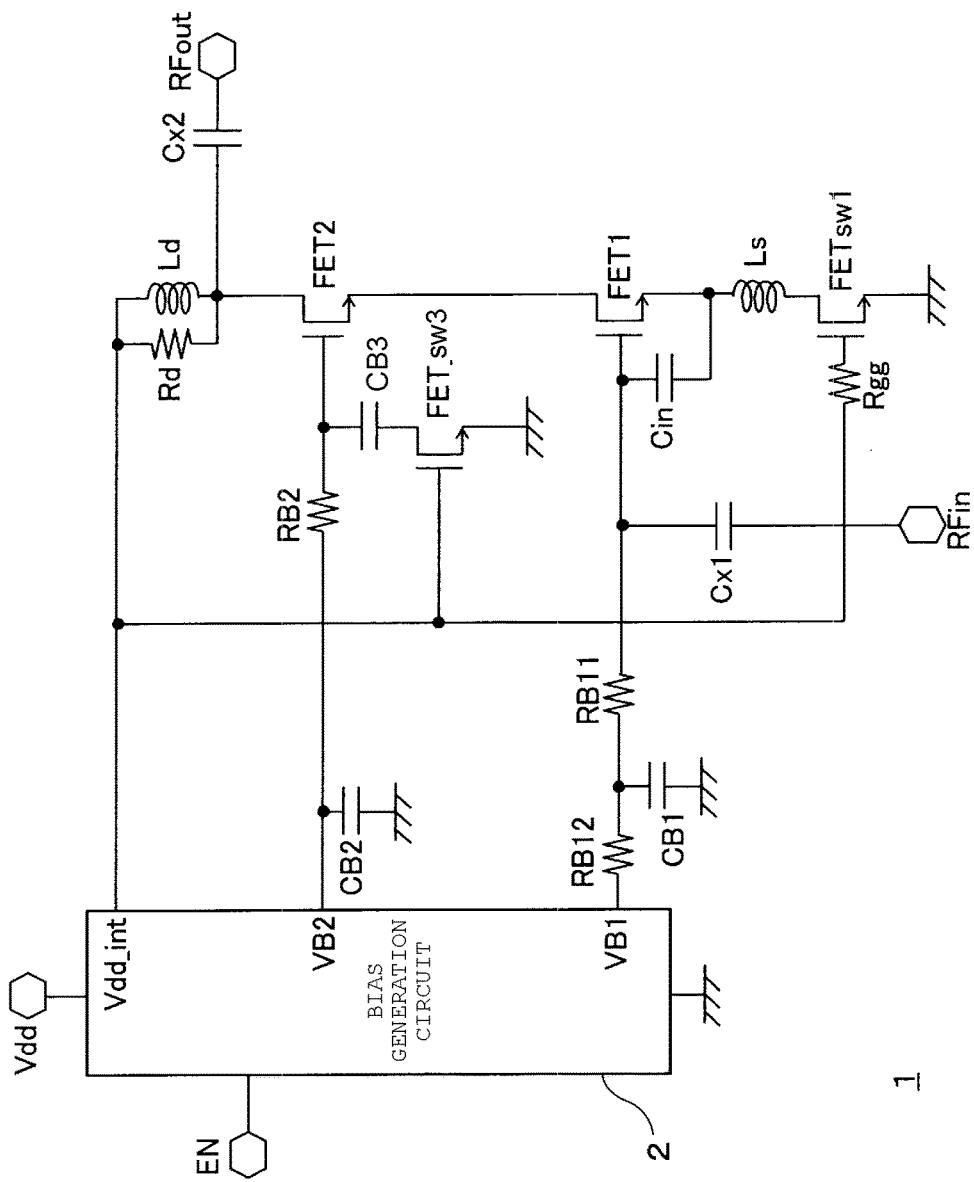
FIG. 13 is a circuit diagram of a high-frequency semiconductor amplifier circuit according to a first modified example of FIG. 8A.

FIG. 13 is a circuit diagram of a high-frequency semiconductor amplifier circuit 1 according to a first modified example of FIG. 8A. The configuration of the circuit 1 illustrated in FIG. 13 is similar to that of the circuit 1 illustrated in FIG. 8A except that the FETsw1 and the inductor Ls are connected in reverse order. Similarly to the circuit illustrated in FIG. 8A, the high-frequency semiconductor amplifier circuit 1 illustrated in FIG. 13 can also obtain an excellent noise figure NF.

Figure 14A:
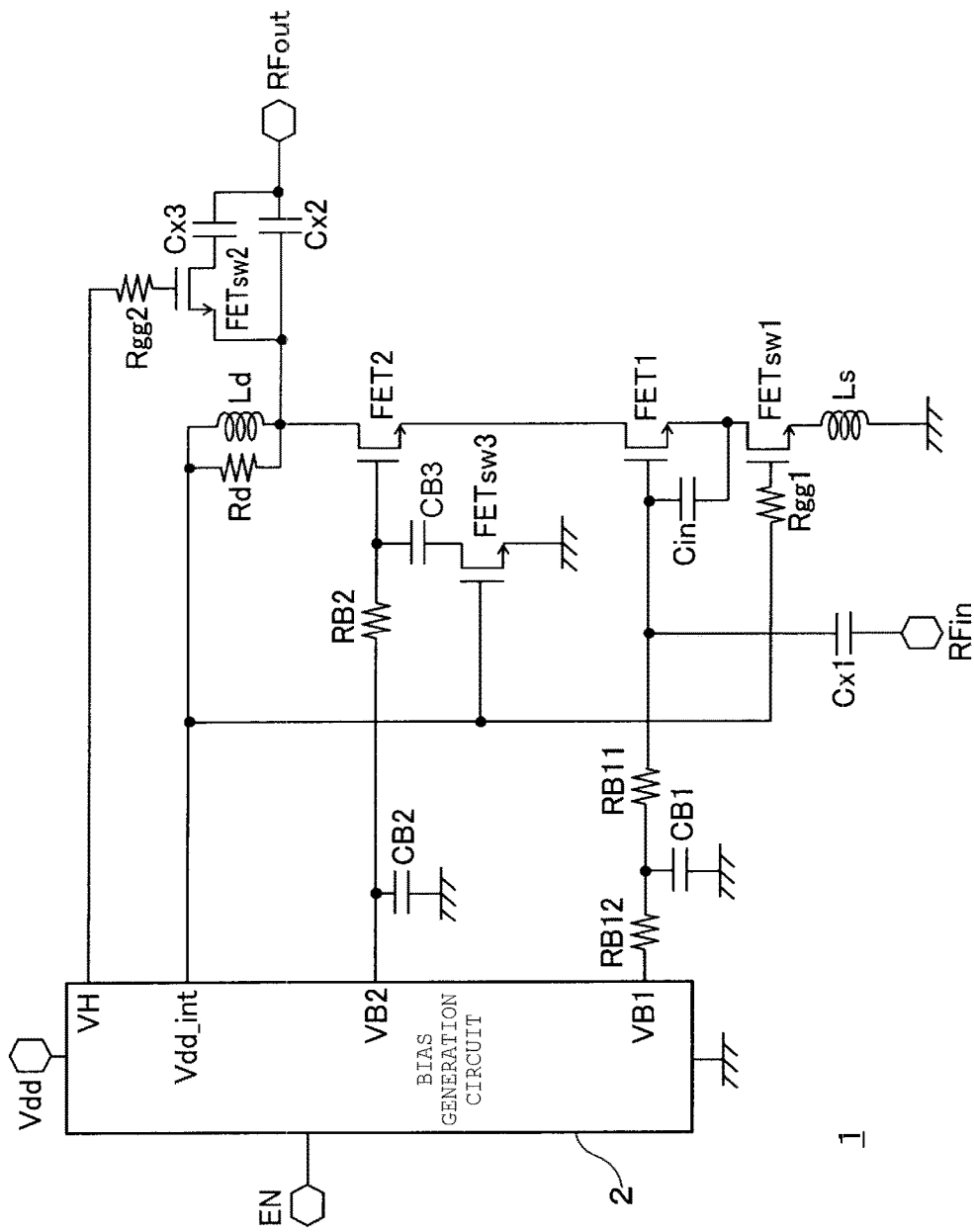
FIG. 14A is a circuit diagram of a high-frequency semiconductor amplifier circuit according to a second modified example of FIG. 8A.

FIG. 14A is a circuit diagram of a high-frequency semiconductor amplifier circuit 1 according to a second modified example of FIG. 8A, and FIG. 14B is a diagram illustrating input/output voltages of a bias generation circuit 2 in the high-frequency semiconductor amplifier circuit 1 illustrated in FIG. 14A. In FIG. 14A, the high-frequency semiconductor amplifier circuit 1 includes an N-type transistor FETsw2, a capacitor Cx3, and a resistor Rgg2 in addition to the configuration illustrated in FIG. 8A. The FETsw2 and the capacitor Cx3 form a capacitance adjustment circuit which can adjust capacitance connected to the output terminal RFout depending on whether the circuit 1 is in the gain mode or the bypass mode.

As can be understood by comparing FIG. 14B with FIG. 8B, a voltage Vdd_int, a bias voltage VB1, and a bias voltage VB2 generated by the bias generation circuit 2 in FIG. 14A are similar to those generated by the bias generation circuit 2 in FIG. 8A in the gain mode or the bypass mode.

A voltage VH generated by the bias generation circuit 2 of FIG. 14A is set to 1.6 V in both the gain mode and the bypass mode.

In the gain mode, since the gate voltage of the FET1 is set close to the threshold voltage, an excellent noise figure NF can be achieved with low current consumption. Since the voltage Vdd_int is 1.6 V, a gate-to-source voltage of the FETsw2 becomes 0 V, and the FETsw2 is turned off. Accordingly, in the gain mode, the circuit performs similarly to the circuit in FIG. 8A.

Figure 15:
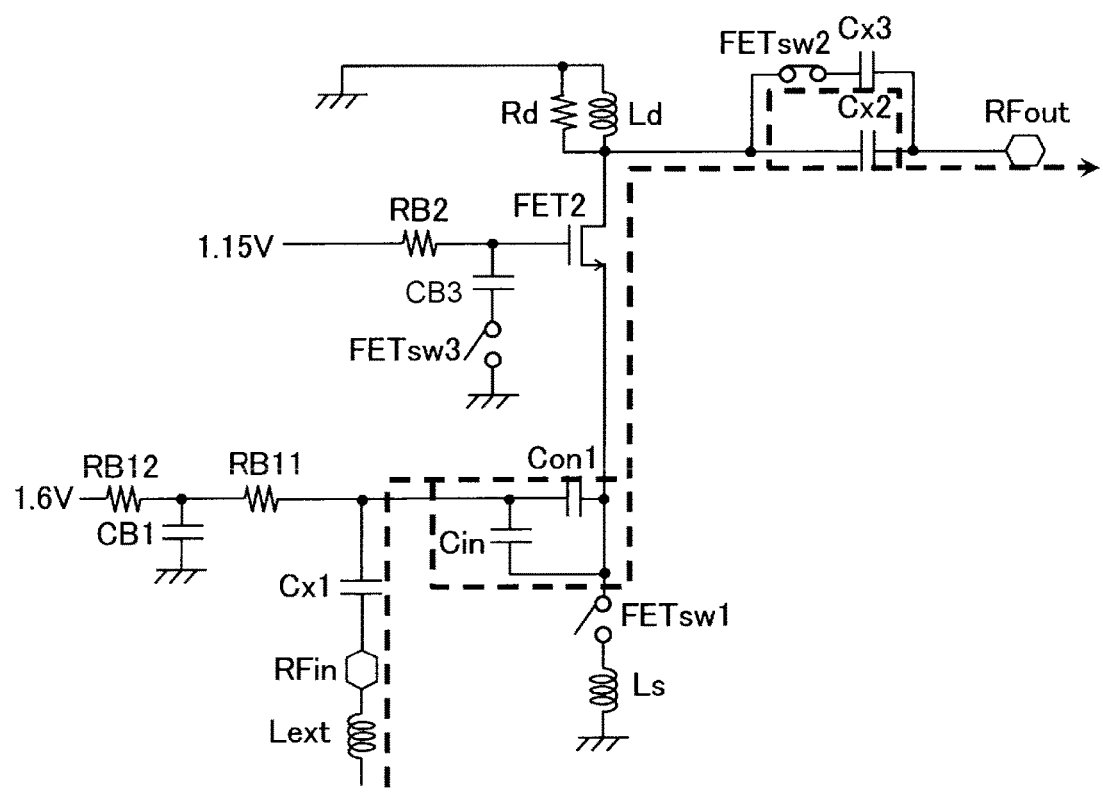
FIG. 15 is a schematic diagram illustrating an equivalent circuit and a signal path of the circuit illustrated in FIG. 14A while in a bypass mode.

A bypass mode of the high-frequency semiconductor amplifier circuit 1 illustrated in FIG. 14A will be described below. FIG. 15 is a schematic diagram illustrating an equivalent circuit and a signal path of the high-frequency semiconductor amplifier circuit 1 illustrated in FIG. 14A while in the bypass mode. In the bypass mode, the FET1 is in a strong inversion state, that is, in a complete ON-state. Since the voltage Vdd_int is 0 V, the FETsw2 is turned on. Accordingly, as illustrated in FIG. 15, the capacitors Cx2 and Cx3 are connected in parallel with each other between signal input terminal RFin and the output terminal RFout.

In the bypass mode, the high-frequency input signal input from the RFin subsequently passes through the capacitor Cx1, the capacitor Cin and the gate capacitor Con1 of the FET1, which are connected in parallel to each other, the FET2, and the capacitors Cx2 and Cx3, which are connected in parallel to each other, thereby being output from the output terminal RFout. When the capacitor Cx3 connected to the drain of the FETsw2 is set to an appropriate value, the characteristic impedance for the high-frequency path can be set to approximately 50Ω when in the bypass mode.

Figure 16:
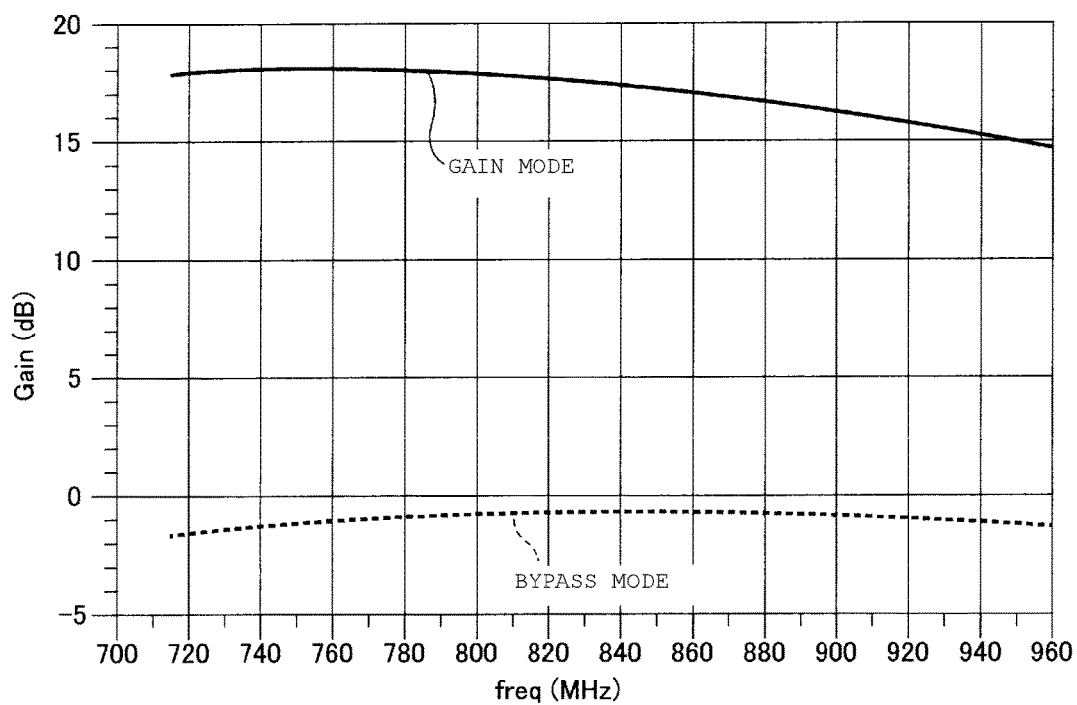
FIG. 16 is a graph illustrating results obtained by comparing a gain of the circuit in illustrated in FIG. 14A in two different modes.
Figure 17:
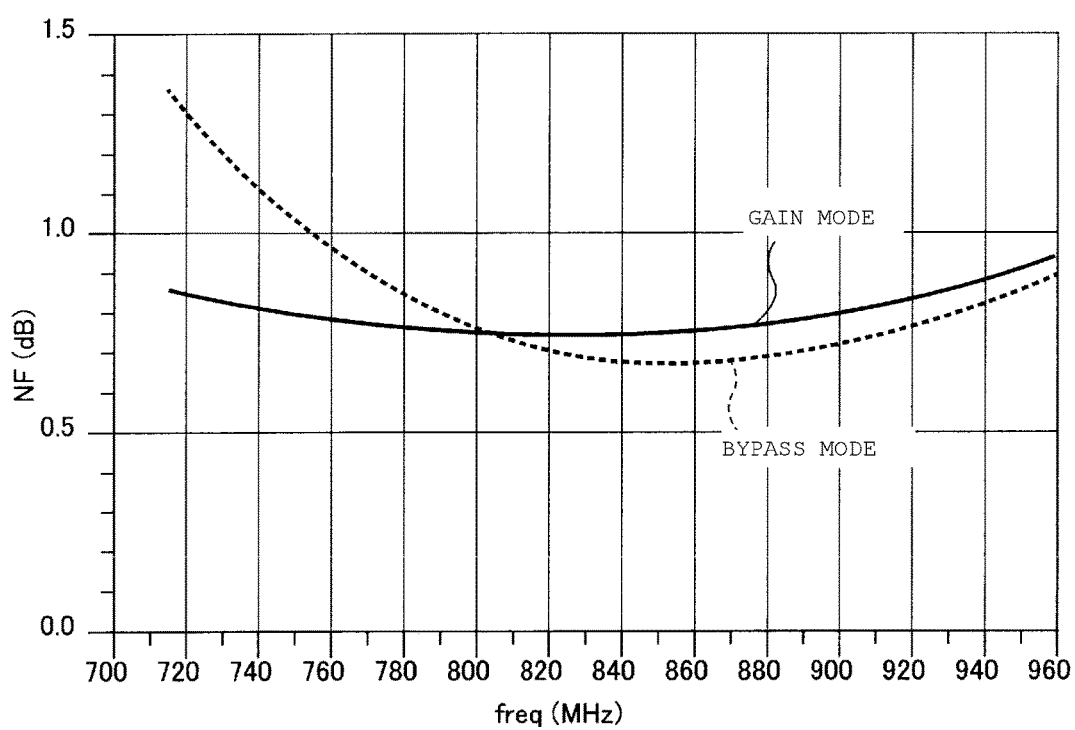
FIG. 17 is a graph illustrating results obtained by comparing a noise figure of the circuit in illustrated in FIG. 14A in two different modes.

FIGS. 16 and 17 are diagrams illustrating results obtained by comparing electrical characteristics of the high-frequency semiconductor amplifier circuit 1 illustrated in FIG. 14A in the two modes. In FIG. 16, a horizontal axis represents a frequency (MHz), and a vertical axis represents a gain (dB). Excellent gain characteristics are obtained at a frequency of 835 MHz; for example, the gain is about 17.9 dB in the gain mode, and the gain is about −0.7 dB in the bypass mode.

In FIG. 17, a horizontal axis represents a frequency (MHz), and a vertical axis represents a noise figure NF (dB). For example, at a frequency of 835 MHz, the noise figure NF is about 0.74 dB in the gain mode, and the noise figure NF is about 0.68 dB in the bypass mode.

Thus, it is understood that a loss is as small as approximately 0.7 dB in the bypass mode and the noise figure NF is also excellent at approximately 0.7 dB.

Figure 18A:
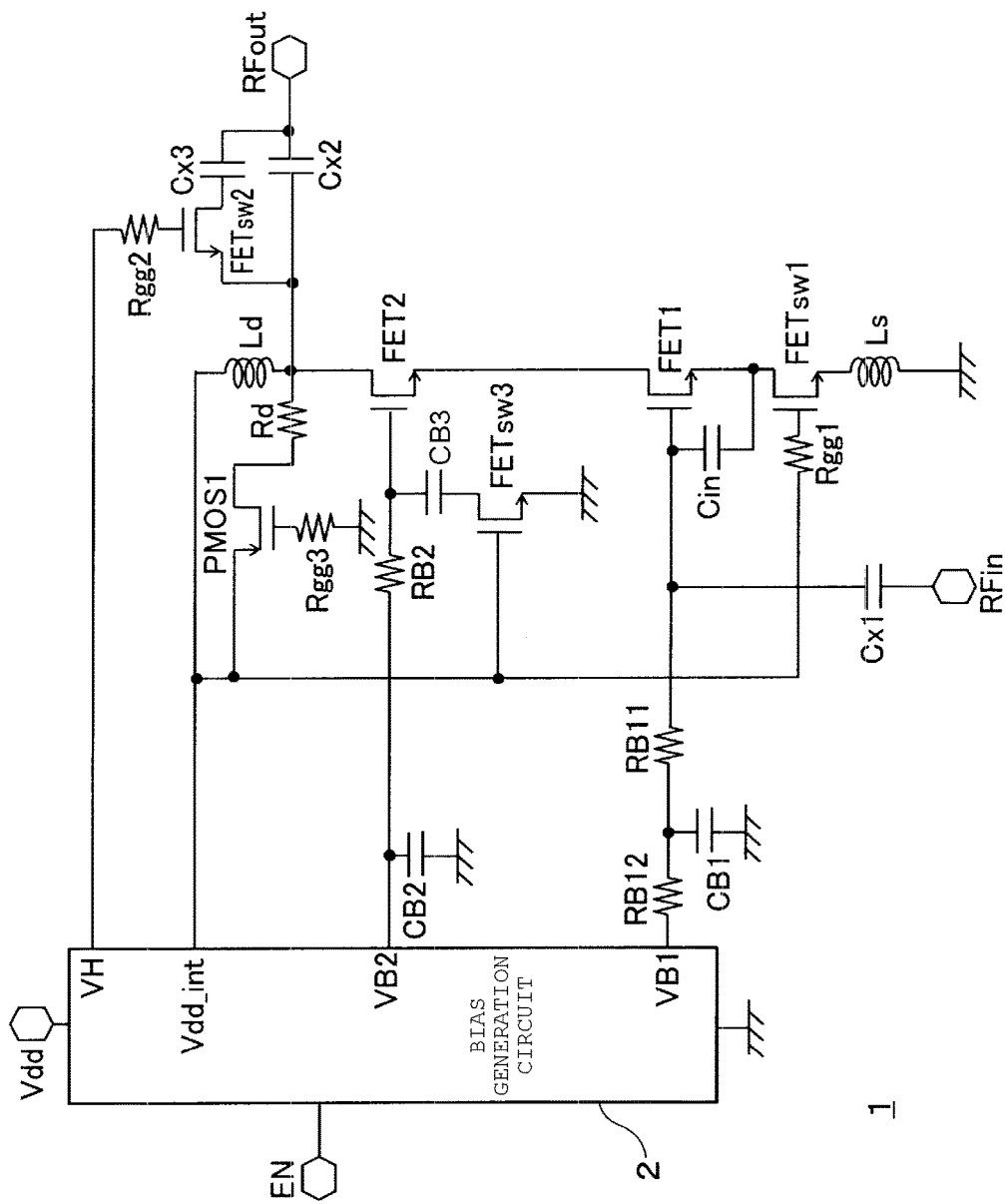
FIG. 18A is a circuit diagram of a high-frequency semiconductor amplifier circuit according to a third modified example of FIG. 8A.

FIG. 18A is a circuit diagram of a high-frequency semiconductor amplifier circuit 1 according to a third modified example of FIG. 8A, and FIG. 18B is a diagram illustrating input/output voltages of the bias generation circuit 2 in the high-frequency semiconductor amplifier circuit 1 illustrated in FIG. 18A. In FIG. 18A, the high-frequency semiconductor amplifier circuit 1 includes a P-type transistor (second switching circuit) PMOS1 in addition to the circuit configuration illustrated in FIG. 14A (the second modified example of FIG. 8A).

A high resistance resistor Rgg3 is connected between a gate of the PMOS1 and a ground node. A voltage Vdd_int that is output from the bias generation circuit 2 is input to a source of the PMOS1. One end of a resistor Rd is connected to a drain of the PMOS1.

As can be understood by comparing FIG. 18B with FIG. 14B, the voltages Vdd_int, VB1, VB2, and VH output from the bias generation circuit 2 are similar to those output from the bias generation circuit 2 in FIG. 14A in both the gain mode and the bypass mode.

The PMOS1 is turned on in the gain mode and thus, while in the gain mode, the circuit configuration of FIG. 18A is electrically similar or equivalent to that in FIG. 14A. On the other hand, the PMOS1 is turned off (non-conducting) in the bypass mode. Thus, there is substantially no resistor Rd in the active electrical signal pathway and the resistor Rd has no effect on the electrical characteristics of high-frequency semiconductor amplifier circuit 1. Accordingly, when capacitor Cx3 is appropriately selected or set, the characteristic impedance of the high-frequency path can be approximated to the value of 50Ω.

Figure 19:
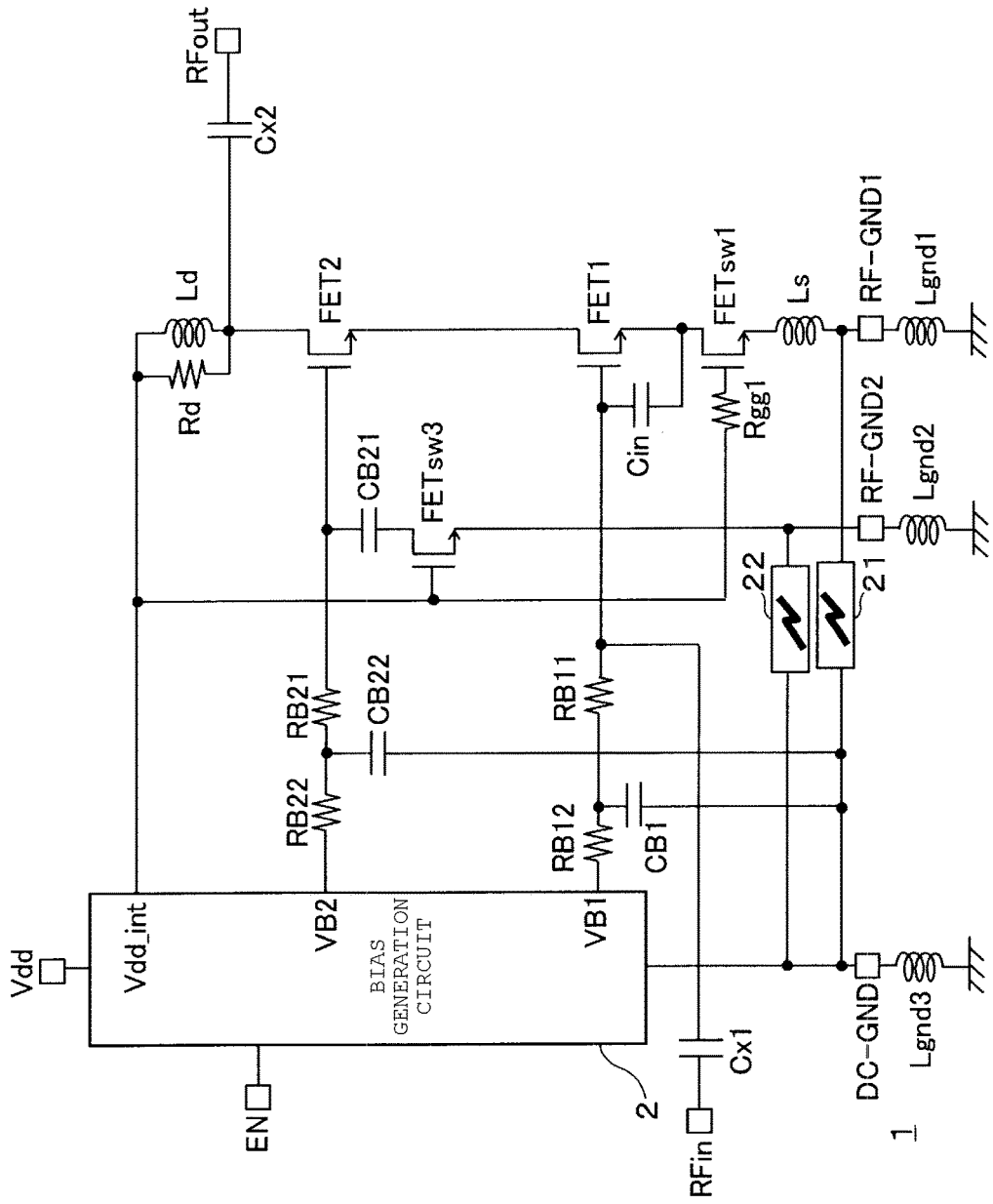
FIG. 19 is a circuit diagram of a high-frequency semiconductor amplifier circuit according to a fourth modified example of FIG. 8A.

FIG. 19 is a circuit diagram of a high-frequency semiconductor amplifier circuit 1 according to a fourth modified example of FIG. 8A. In FIG. 19, parasitic inductances at ground nodes RF-GND1, RF-GND2, and DC-GND are defined as Lgnd1, Lgnd2, and Lgnd3, respectively.

In FIG. 19, the high-frequency semiconductor amplifier circuit 1 is characterized in that the ground node DC-GND for a bias generation circuit 2, the ground node RF-GND1 on a source side of a FETsw1, and the ground node RF-GND2 on a source side of a FETsw3 are separated from each other.

In FIG. 19, there may be concern that a high frequency signal enters the ground node DC-GND via capacitors CB1 and CB22. However, when resistors RB11 and RB21 are set to values sufficiently larger than the impedance of a parasitic inductance Lgnd3, the high frequency signal superimposed on the ground node DC-GND can be made negligibly small. In addition, when resistors RB12 and RB22 are set to a sufficiently large value, a high frequency signal entering the terminals for bias voltages VB1 and VB2 can also be made negligibly small. In this way, according to the circuit in FIG. 19, when the power of the high-frequency input signal is large, it is possible to substantially limit the high frequency signal from entering the bias generation circuit 2 and causing erroneous operation.

Furthermore, if the ground nodes RF-GND1 and RF-GND2 are connected to each other, the high frequency signal from the capacitor CB21 to the ground node RF-GND2 via the FETsw3 is coupled to a ground node RF-GND1 of an inductor Ls due to the influence of the parasitic inductance Lgnd2, and thus high-frequency characteristics deteriorates.

In this example, using the ground node DC-GND of the bias generation circuit 2 as a reference node, a first ESD (Electro Static Discharge) protection element 21 is connected between the reference node (DC-GND) and the ground node RF-GND1, and a second ESD protection element 22 is connected between the reference node (DC-GND) and the ground node RF-GND2. This can prevent trouble caused by ESD events between the ground nodes RF-GND1 and RF-GND2.

As described above, in the second embodiment, since the high-frequency input signal is amplified using FET1 and FET2, which are in a cascode arrangement, it is possible to realize the high-frequency semiconductor amplifier circuit 1 having a larger high frequency gain as compared with the first embodiment.

Third Embodiment

Figure 20:
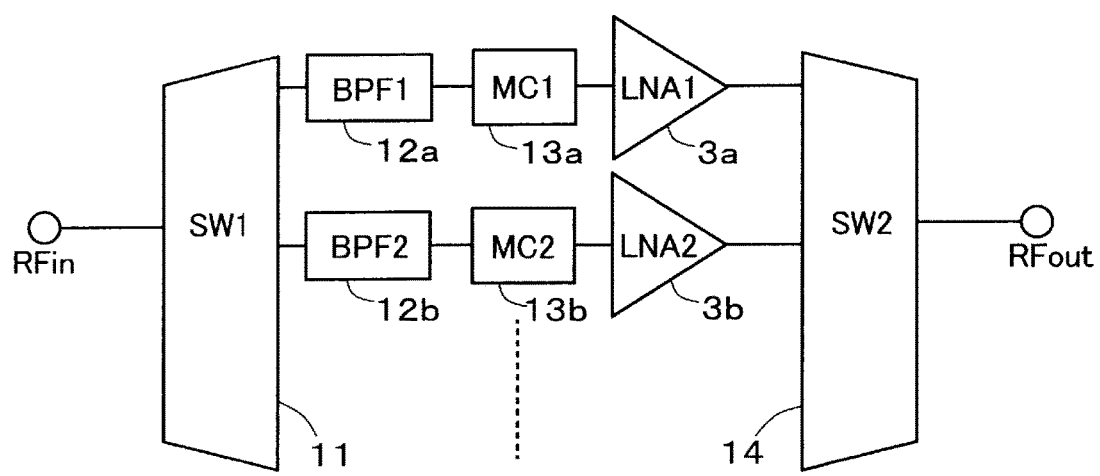
FIG. 20 is a block diagram illustrating a configuration of a radio communication device.

In recent years, multi-band compatible smart phones have become common so as to permit use of the phone in all countries in the world. Generally, a high-frequency circuit is a narrow band circuit based on a lossless matching circuit. For this reason, to make a multi-band compatible high-frequency LNA 3, it is considered that a high-frequency LNA 3 must be separately provided for each band as illustrated in a radio communication device depicted in FIG. 20. In FIG. 20, the radio communication device includes a first switch 11, a plurality of bandpass filters 12a and 12b, a plurality of matching circuits 13a and 13b, a plurality of high-frequency LNAs 3a and 3b, and a second switch 14.

The first switch 11 switches a high-frequency input signal according to frequency band and is connected to the bandpass filters 12a and 12b. As depicted in FIG. 20, one bandpass filter in plurality of bandpass filters 12a and 12b, one matching circuit in the plurality of matching circuits 13a and 13b, and one LNA in the plurality of high-frequency LNAs 3a and 3b is provided for each possible frequency band of the high-frequency input signal. The second switch 14 selects of the output signal from the appropriate LNA in the plurality of high-frequency LNAs 3a and 3b for the frequency band being transmitted and outputs the selected signal from an output terminal RFout.

As can be seen from FIG. 20, as the number of bands for the multi-band terminal increases, the number of the bandpass filters (12a, 12b . . . ), the matching circuits (13a, 13b . . . ), and the high-frequency LNAs (3a, 3b . . . ) increases, and the internal configuration of the first switch 11 and the second switch 14 becomes increasingly complicated, and additionally a circuit size becomes larger. In addition, when a bypass mode is provided in the radio communication device illustrated in FIG. 20, the circuit size generally becomes even larger.

Therefore, a high-frequency semiconductor amplifier circuit 1 according to a third embodiment is characterized in that multi-band compatible bypass mode is provided and the total circuit size can be reduced.

Figure 21A:
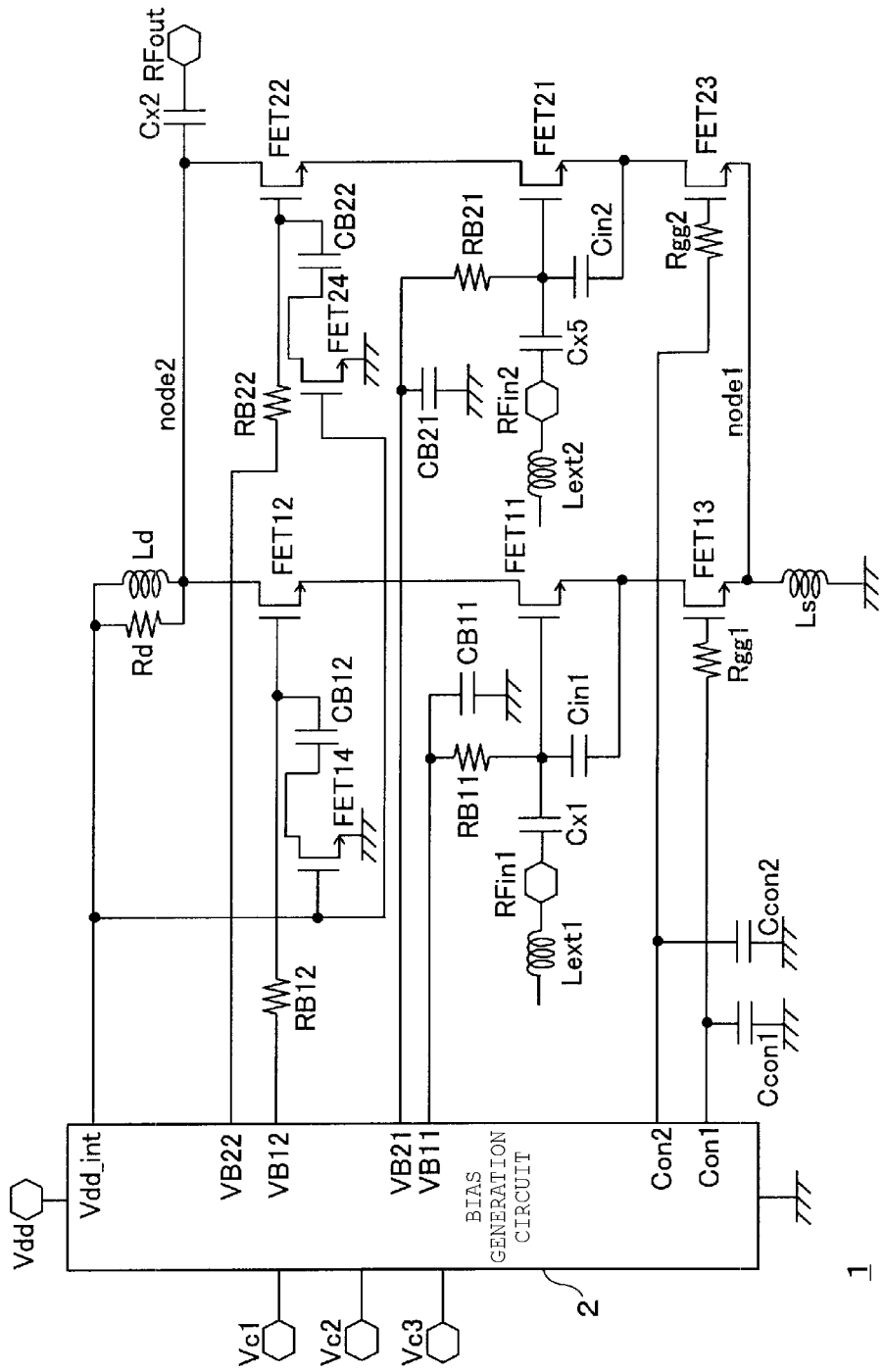
FIG. 21A is a circuit diagram of a high-frequency semiconductor amplifier circuit according to a third embodiment.

FIG. 21A is a circuit diagram of the high-frequency semiconductor amplifier circuit 1 according to the third embodiment, and FIG. 21B is a diagram illustrating input/output voltages of a bias generation circuit 2 in the high-frequency semiconductor amplifier circuit 1 illustrated in FIG. 21A. In FIG. 21A, the high-frequency amplifier circuit 1 is compatible with multi-band communication in that it may select any one of two high-frequency input signals and amplify and output the selected high-frequency signal. In the high-frequency amplifier circuit 1 illustrated in FIG. 21A, a switching between a gain mode and a bypass mode can be performed. In the high-frequency semiconductor amplifier circuit 1 illustrated in FIG. 21A, a minimal multi-band configuration is illustrated for convenience, but the number of high-frequency input signals that may be selected for amplification and output can be greater than two—for example, three or more.

The high-frequency semiconductor amplifier circuit 1 illustrated in FIG. 21A basically has a configuration in which two circuit portions (other than the bias generation circuit 2) illustrated in FIG. 8A are provided. A gate of an N-type transistor (first transistor) FET11 is connected to an input terminal RFin1 receiving a first high-frequency input signal, via a capacitor Cx1 of DC-cut capacitance. A capacitor Cin1 for matching is connected between a gate and a source of the FET11. An N-type transistor (third transistor) FET12 is connected to a drain of the FET11.

One end of a capacitor (first capacitor) CB12 is connected to a gate of the FET12. A drain of an N-type transistor (first switching circuit) FET14 is connected to the other end of the capacitor CB12. A source of the FET14 is grounded, and a gate thereof receives a voltage Vdd_int that is output from the bias generation circuit 2. One end of each of a resistor Rd, an inductor Ld, and a capacitor Cx2 is connected to a drain of the FET12. The voltage Vdd_int is input to the other end of each of the resistor Rd and the inductor Ld. An output terminal RFout is connected to the other end of the capacitor Cx2.

An N-type transistor (second transistor) FET13 is connected to the source of the FET11. An inductor Ls is connected between a source of the FET13 and a ground node. A control voltage Coni output from the bias generation circuit 2 is input to a gate of the FET13 via a resistor Rgg1. A capacitor Ccon1 is connected between an output terminal of the bias generation circuit 2 which outputs the control voltage Coni and a ground node.

A gate of an N-type transistor FET21 is connected to an input terminal RFin2 to which the second high-frequency input signal is input, via a capacitor Cx5 of DC-cut capacitance. A capacitor Cin2 for matching is connected between a gate and a source of the FET21. An N-type transistor FET22 is connected to a drain of the FET21.

One end of a capacitor CB22 is connected to a gate of the FET22. A drain of an N-type transistor FET24 is connected to the other end of the capacitor CB22. A source of the FET24 is grounded, the voltage Vdd_int output from the bias generation circuit 2 is input to a gate of the FET24. One end of each of the resistor Rd, the inductor (first inductor) Ld, and the capacitor (second capacitor) Cx2 is connected to a drain of the FET22.

An N-type transistor FET23 is connected to the source of the FET21. The inductor Ls is connected between a source of the FET23 and the ground node. A control voltage Con2 output from the bias generation circuit 2 is input to a gate of the FET23, via a resistor Rgg2. A capacitor Ccon2 is connected between an output terminal of the bias generation circuit 2 which outputs the control voltage Con2 and a ground node.

Control voltages Vc1, Vc2, and Vc3 are input to the bias generation circuit 2 depicted in FIG. 21A. As illustrated in FIG. 21B, the bias generation circuit 2 selects between two high-frequency input signals depending on the logic of these control voltages Vc1, Vc2, and Vc3, and likewise sets a gain mode, a bypass mode, or a shutdown mode according to these control voltages. Here, the "shutdown mode" is a mode in which all of the output signals of the bias generation circuit 2 are set to 0 V and no signals are output from the output terminal RFout.

In FIG. 21A, for example, when the bias generation circuit 2 is controlled to select the first high-frequency input signal and the gain mode, the control voltages Con1 and Con2 are generated such that the FET13 is turned on and the FET23 is turned off, a bias voltage VB11 applied to the gate of the FET11 is set to be lower than a drain-to-source voltage of the FET11 so that a gate voltage of the FET11 is set close to a threshold voltage, and a bias voltage VB12 applied to the gate of the FET12 is set to a predetermined voltage such that the FET22 is turned off. The predetermined voltage in this case is a voltage (for example, 1.15 V) for setting the drain-to-source voltage of the FET11 to an optimum value (for example 0.8 V). In addition, for example, when the bias generation circuit 2 selects for the first high-frequency input signal and the bypass mode, the control voltages Con1 and Con2 are generated such that both FET13 and FET23 are turned off, the bias voltages VB11 and VB21 are generated such that a channel of the FET11 enters a strong inversion state and FET21 is turned off, FET12, connected to the FET11, is turned on, and the bias voltages VB12 and VB22 are generated such that FET22 is turned off.

When the first high-frequency input signal and the gain mode are to be selected, the high-frequency input signal input from RFin1 is amplified by a cascode amplifier circuit that includes FET11 and FET12, and the amplified first high-frequency input signal is output from the output terminal RFout. Since the bias voltage VB11 input to the gate of the FET11 at this time is 0.35 V, the gate voltage of the FET11 is close to the threshold voltage value. Accordingly, FET11 exhibits an excellent noise figure NF with low current consumption. In addition, the bias voltage VB12 is set such that the drain-to-source voltage Vds of the FET11 has an appropriate value (for example, 0.8 V).

An input matching circuit is formed with an inductor Lext1 (attached externally to the input terminal RFin1), a capacitor Cin1, and the inductor Ls.

In the gain mode, since FET14 is in the ON-state, the gate of the FET12 is grounded via the capacitor CB12. On the other hand, a FET21, a FET22, and a FET23 are each in an OFF-state and can be regarded as an open connection. Therefore, when operating in the gain mode, the circuit in FIG. 21A is electrically equivalent to the circuit depicted in FIG. 8A. This also applies to the case of the second high-frequency input signal and the gain mode being selected.

Figure 22:
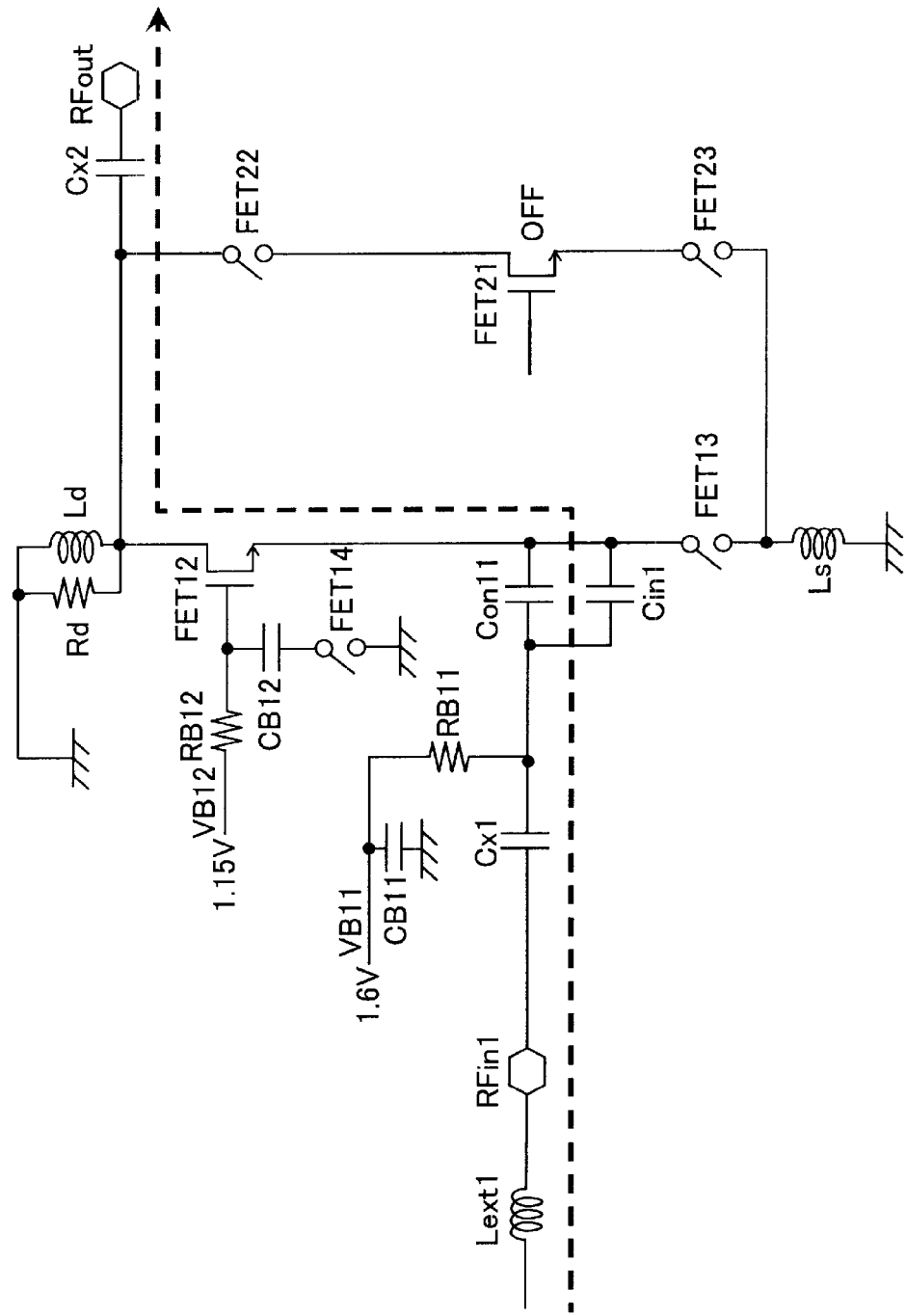
FIG. 22 is a schematic diagram illustrating an equivalent circuit and a signal path of the circuit illustrated in FIG. 21A while in a bypass mode.

Next, for discussion, it can be assumed that the first high-frequency input signal and the bypass mode are selected. FIG. 22 is a schematic diagram illustrating an equivalent circuit and a signal path during operation in the bypass mode for the high-frequency semiconductor amplifier circuit 1 illustrated in FIG. 21A. Here, since the bias voltage VB11 is 1.6 V, the channel of FET11 enters a strong inversion state, and FET11 is turned on. For this reason, the FET11 is depicted as a MOS capacitor Con11 in FIG. 22.

The high frequency signal is input via the inductor Lext1, attached externally (outside the chip including the high-frequency semiconductor amplifier circuit 1), and the input terminal RFin and the high frequency signal passes through the capacitor Cx1, and then flows into a source node of FET12 through the capacitors Con11 and Cin1 connected in parallel. In the bypass mode, the gate of FET12 is not grounded, but functions as a high-frequency switch having high impedance. For this reason, the high frequency signal can pass through the FET12 with low loss. The high frequency signal that passes through FET12 is output from the output terminal RFout via the capacitor Cx2.

Due to the inductor Lext1, attached externally to the input terminal RFin1, the capacitors Cin1 and Con11, the inductor Ld, the resistor Rd, and the capacitor Cx2, the impedance may deviate from 50Ω. However, with proper design choices, there is no concern that the impedance will significantly deviates from 50Ω.

As described above, in the high-frequency semiconductor amplifier circuit 1 illustrated in FIG. 21A, since the gate of the FET12 functions as a high-frequency switch with high impedance in the bypass mode, the high frequency signal can pass through the FET12 with low loss.

Figure 23:
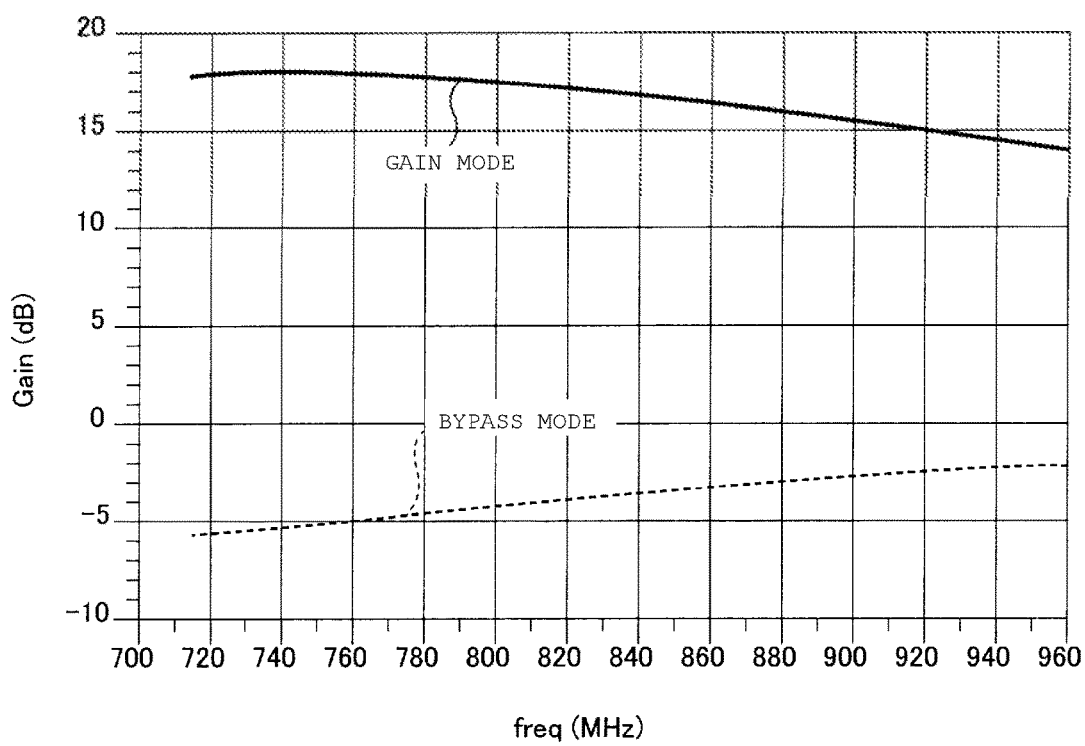
FIG. 23 is a graph illustrating simulation results of a gain of the circuit illustrated in FIG. 21A.
Figure 24:
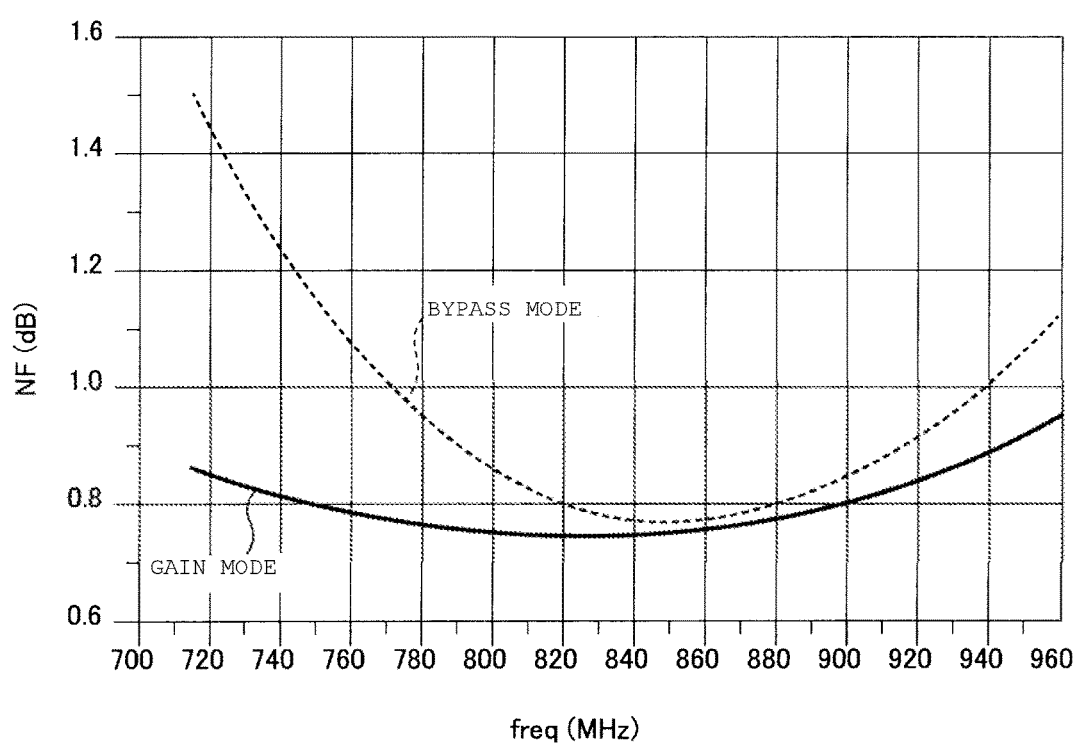
FIG. 24 is a graph illustrating simulation results of a noise figure of the circuit illustrated in FIG. 21A.

FIGS. 23 and 24 are graphs illustrating simulation results of the high-frequency semiconductor amplifier circuit 1 illustrated in FIG. 21A. In FIG. 23, a horizontal axis represents a frequency (MHz), and a vertical axis represents a gain (dB). Excellent gain characteristics are obtained at a frequency of 820 MHz; for example, the gain is about 17.2 dB in the gain mode, and the gain is about −3.9 dB in the bypass mode.

In FIG. 24, a horizontal axis represents a frequency (MHz), and a vertical axis represents a noise figure NF (dB). For example, at a frequency of 820 MHz, the noise figure NF is about 0.75 dB in the gain mode, and the noise figure NF is about 0.80 dB in the bypass mode gain mode.

As described, it is found that loss is as small as about 4 dB in the bypass mode and the noise figure NF (about 0.8 dB) is excellent.

Figure 25A:
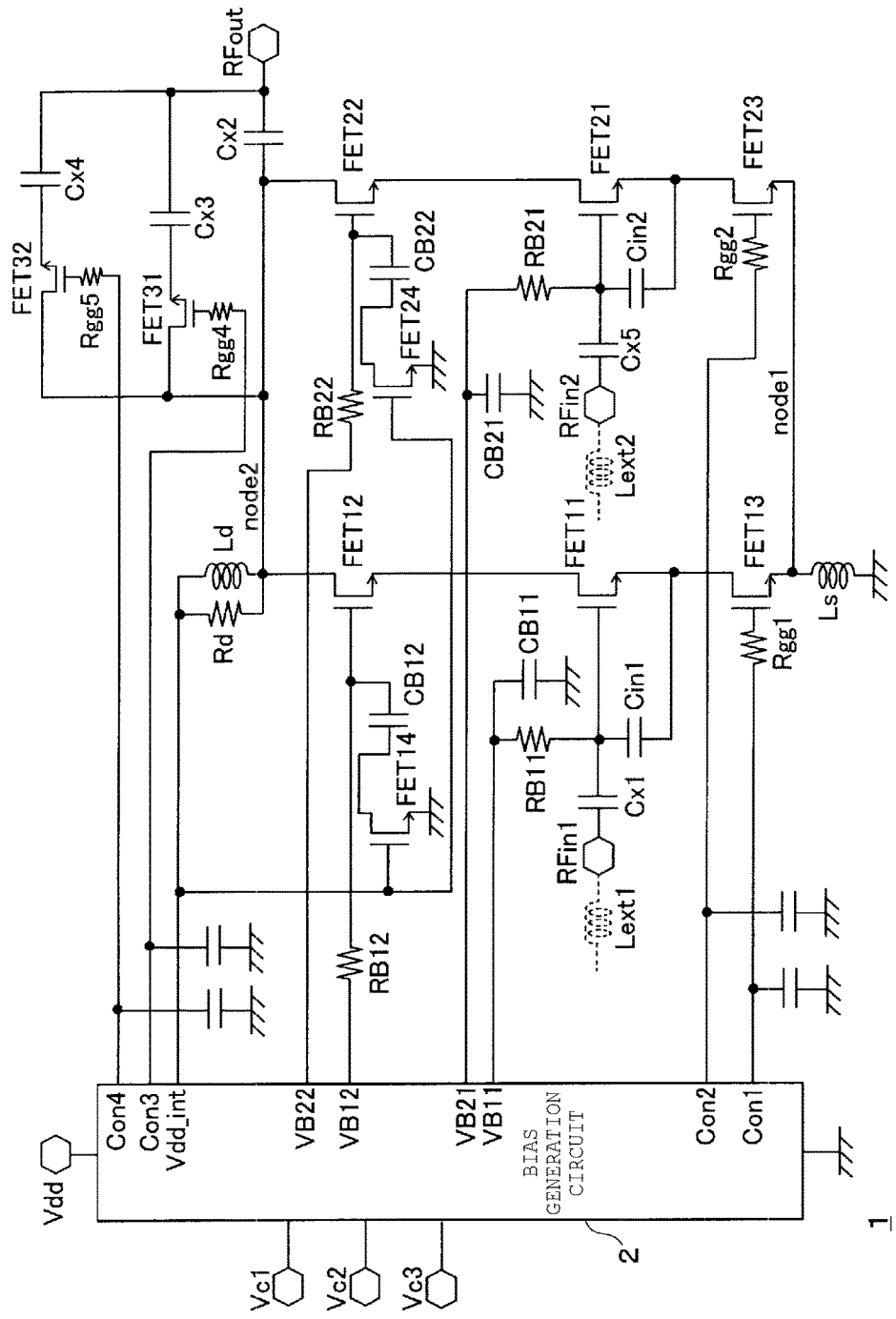
FIG. 25A is a circuit diagram of a high-frequency semiconductor amplifier circuit according to a first modified example of FIG. 21A.

FIG. 25A is a circuit diagram of a high-frequency semiconductor amplifier circuit 1 according to a first modified example of FIG. 21A, and FIG. 25B is a diagram illustrating input/output voltages of the bias generation circuit 2 in the high-frequency semiconductor amplifier circuit 1 depicted in FIG. 25A.

In FIG. 25A, the high-frequency semiconductor amplifier circuit 1 includes FET31 and FET32, resistors Rgg4 and Rgg5, and capacitors Cx3 and Cx4 in addition to the elements of the circuit illustrated in FIG. 21A.

A control voltage Con3 output from the bias generation circuit 2 is input to a gate of FET31 via resistor Rgg4. A drain of FET31 is connected to the drain of FET12 and the drain of FET22. A source of FET31 is connected to one end of capacitor Cx3.

A control voltage Con4 output from the bias generation circuit 2 is input to a gate of FET32 via resistor Rgg5. A drain of FET32 is connected to the drain of FET12 and the drain of FET22. A source of FET32 is connected to one end of capacitor Cx4. The other ends of capacitors Cx3 and Cx4 are connected to the output terminal RFout together with the other end of the capacitor Cx2. The FET31, the FET32, and the capacitors Cx3 and Cx4 form a capacitance adjustment circuit.

In FIG. 25A, it is assumed that each of FET11, FET12, FET21, and FET22 has a threshold voltage of 0.3V, and each of FET13, FET14, FET23, FET24, FET31, and FET32 has a threshold voltage of 0.5 V.

In the high-frequency semiconductor amplifier circuit 1 depicted in FIG. 25A, when the first high-frequency input signal and the bypass mode are selected, FET31 is turned on, and FET32 is turned off. Accordingly, capacitor Cx3 becomes effective, and capacitor Cx4 becomes ineffective. In this way, the capacitors Cx2 and Cx3 are connected in parallel to each other, and the capacitance value of capacitor Cx3 can be appropriately set such that the characteristic impedance of the high-frequency signal path can be brought close to the value of 50Ω.

Figure 26:
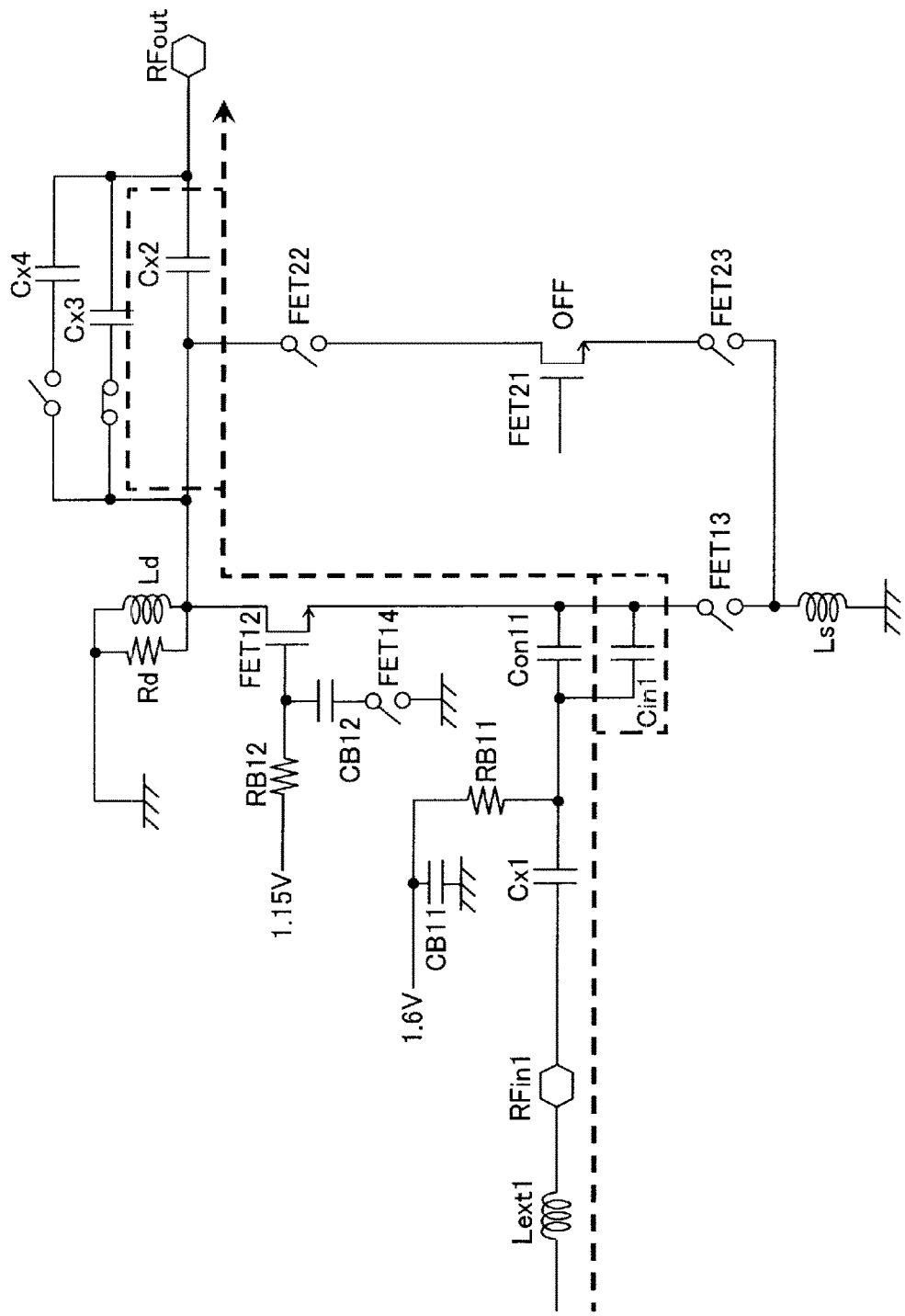
FIG. 26 is a schematic diagram illustrating an equivalent circuit and a signal path when a first high-frequency input signal and a bypass mode are selected by the circuit illustrated in FIG. 25A.
Figure 27:
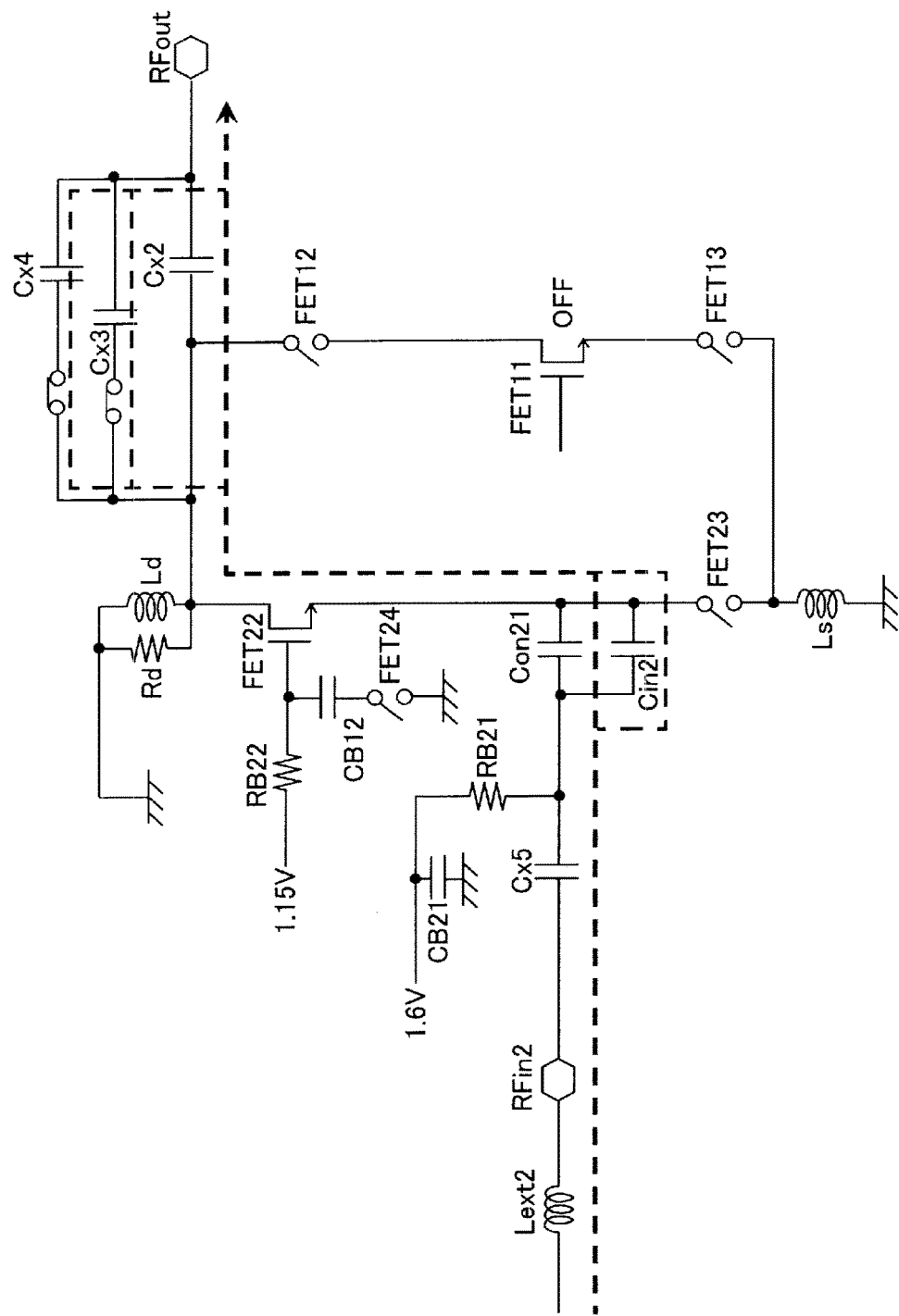
FIG. 27 is a schematic diagram illustrating an equivalent circuit and a signal path when a second high-frequency input signal and a bypass mode are selected by the circuit illustrated in FIG. 25A.

FIGS. 26 and 27 are schematic diagrams illustrating an equivalent circuit and a signal path of the high-frequency semiconductor amplifier circuit 1 depicted in FIG. 25A while operating in the bypass mode. FIG. 26 illustrates a case in which the first high-frequency input signal has been selected, and FIG. 27 illustrates a case in which the second high-frequency input signal has been selected.

When the first high-frequency input signal is selected and the circuit is operated in the bypass mode, the bias voltage VB11 becomes 1.6 V, the channel of the FET11 enters a strong inversion state. For this reason, the FET11 can be denoted as an MOS capacitor Con11 in FIG. 26. The high frequency signal input to the input terminal RFin1 through the inductor Lext1, attached externally to the input terminal RFin1, passes through capacitor Cx1, passes through the FET12 through the capacitors Con11 and Cin1, which are connected in parallel to each other, and then passes through the capacitors Cx2 and Cx3, which are connected in parallel to each other, and is then output from the output terminal RFout.

While in the bypass mode, the gate of FET12 is not grounded, and thus functions as a high-frequency switch having high impedance. For this reason, the high frequency signal can pass through the FET12 with low loss. In the transmission pathway of the high frequency signal in the bypass mode, as illustrated in FIG. 26, there are the inductor Lext1, the capacitor Cx1, the capacitors Con11 and Cin1 connected in parallel to each other, the resistor Rd and the inductor Ld connected in parallel to each other, and the capacitors Cx2 and Cx3 connected in parallel to each other. The capacitance of capacitor Cx3 can be adjusted to an appropriate value such that the high-frequency impedance of this pathway can be made to be approximately 50Ω with respect to the frequency of the high frequency signal input from the input terminal RFin1. Thus, it is possible to realize a high-frequency semiconductor amplifier circuit 1 having the excellent noise figure NF with low loss.

When the second high-frequency input signal is selected and the high-frequency semiconductor amplifier circuit 1 is operated in bypass mode, the bias voltage VB21 becomes 1.6 V and the channel of the FET21 enters a strong inversion state. For this reason, FET21 is depicted as a MOS capacitor Con21 in FIG. 27. The high frequency signal input to the input terminal RFin2 through the inductor Lext2, attached externally to the input terminal RFin2, passes through capacitor Cx2, through FET22, through capacitors Con21 and Cin2 connected in parallel to each other, and then through capacitors Cx2, Cx3, and Cx4 connected in parallel to each other, and is thereby output from the output terminal RFout. When the capacitance of the capacitors Cx3 and Cx4 is adjusted to an appropriate value, the high-frequency impedance of this pathway can be made to be approximately 50Ω with respect to the frequency of the high frequency signal input from the input terminal RFin1. Thus, it is possible to realize the high-frequency semiconductor amplifier circuit 1 having the excellent noise figure NF with low loss.

Figure 28A:
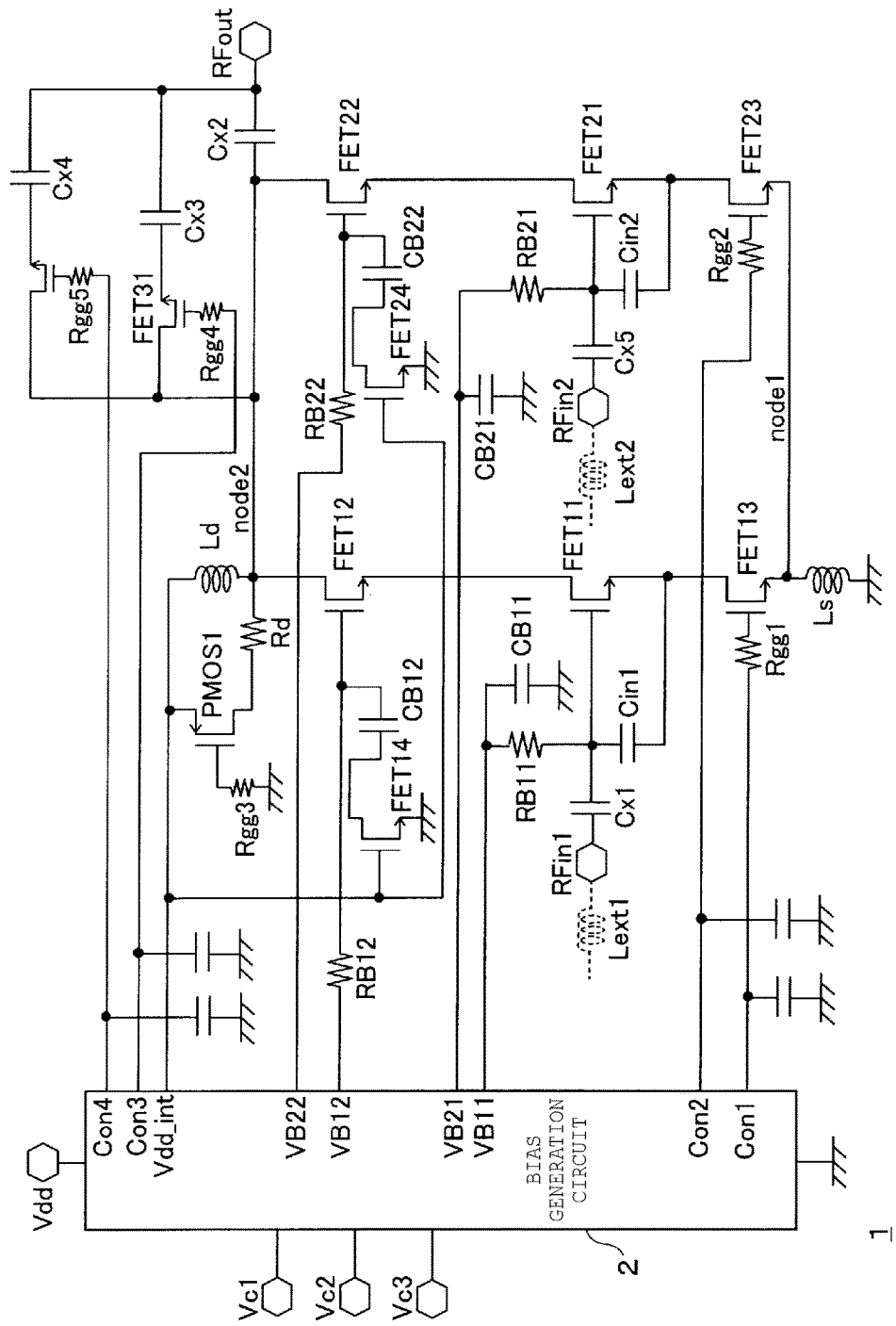
FIG. 28A is a circuit diagram of a high-frequency semiconductor amplifier circuit according to a second modified example of FIG. 21A.

FIG. 28A is a circuit diagram of a high-frequency semiconductor amplifier circuit 1 according to a second modified example of FIG. 21A, and FIG. 28B is a diagram illustrating input/output voltages of a bias generation circuit 2 in the high-frequency semiconductor amplifier circuit 1 depicted in FIG. 28A.

In FIG. 28A, the high-frequency semiconductor amplifier circuit 1 includes a P-type transistor (second switching circuit) PMOS1 in addition to the configuration of the circuit according to the first modified example in FIG. 25A. A high resistor Rgg3 is connected between a gate of PMOS1 and a ground node. A drain of PMOS1 is connected to one end of resistor Rd. A voltage Vdd_int output from the bias generation circuit 2 is input to a source of PMOS1.

A threshold voltage of the PMOS1 is, for example, −0.5 V. In gain mode, PMOS1 is turned on and the resistor Rd becomes effective. In bypass mode, PMOS1 is turned off and resistor Rd becomes ineffective.

As a result, resistor Rd, which causes signal loss, can be effectively excluded from the transmission pathway during the bypass mode operation, and thus loss can be further improved in the bypass mode of the this second modified example of FIG. 21A.

Figure 29:
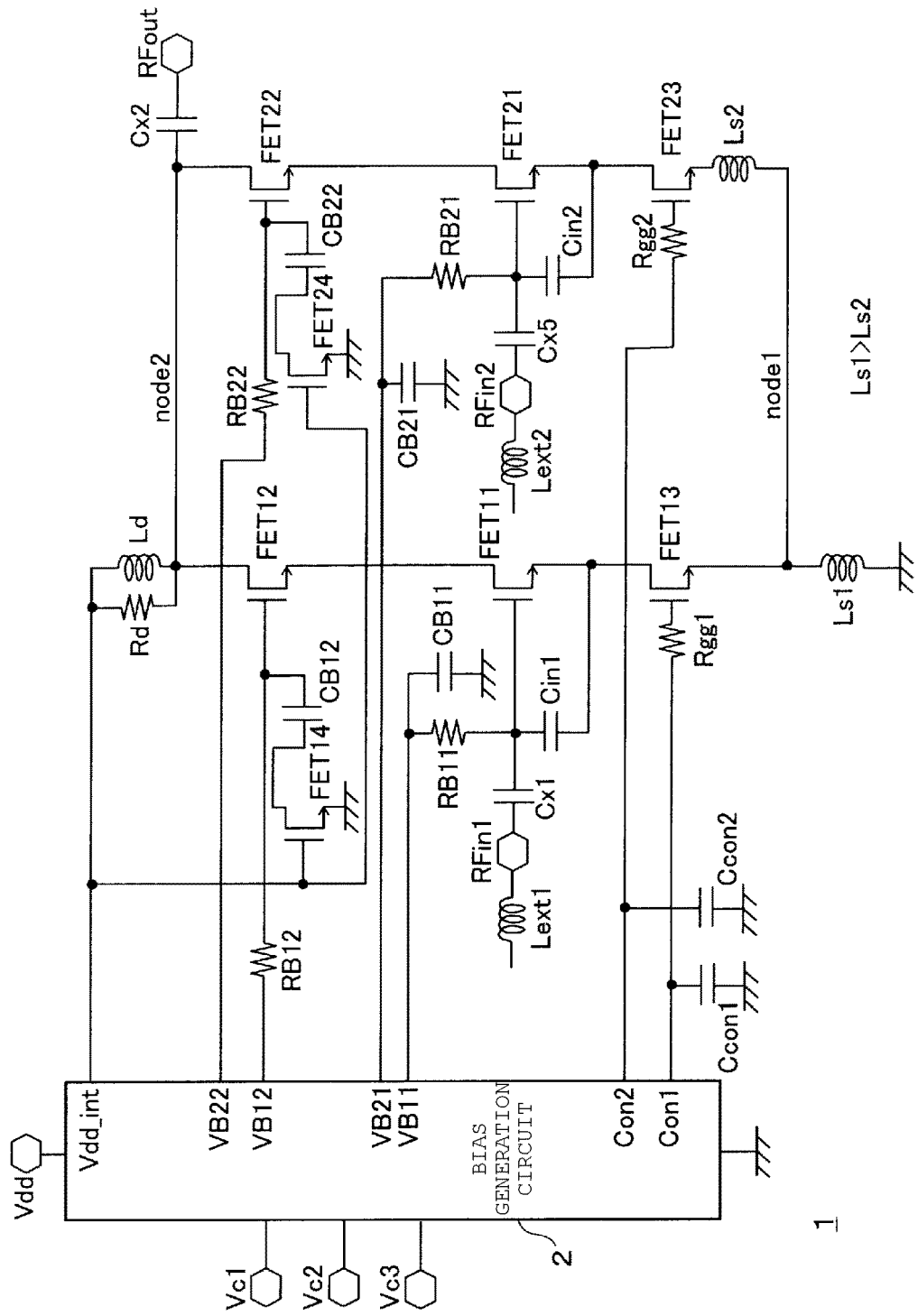
FIG. 29 is a circuit diagram of a high-frequency semiconductor amplifier circuit according to a third modified example of FIG. 21A.

FIG. 29 is a circuit diagram of a high-frequency semiconductor amplifier circuit 1 according to a third modified example of FIG. 21A. In FIG. 29, the high-frequency semiconductor amplifier circuit 1 includes an inductor Ls1 connected between the source of FET13 and the ground node and an inductor Ls2 connected between the source of FET23 and the source of FET13 in addition to elements of the circuit depicted in FIG. 21A. An input matching circuit on the input terminal RFin side is formed with the inductor Ls1 and the gate-to-source capacitor (capacitance) Cin1 of FET11. When the frequency of the first high-frequency input signal is close to the frequency of the second high-frequency input signal, the high-frequency semiconductor amplifier circuit 1 of FIG. 21 can cope with this condition only by the capacitance difference between the capacitors Cin1 and Cin2. However, when the frequency difference is large between input signals, it may be desirable that the inductors Ls1 and Ls2 are electrically separated from each other to allow the inductances to be individually adjusted to account for larger differences in input signal frequencies. For this reason, the inductors Ls1 and Ls2 are electrically separate from each other in FIG. 29.

When the first high-frequency input signal is selected and the high-frequency semiconductor amplifier circuit 1 is operated in the gain mode, the inductance which causes degeneration is Ls1. When the second high-frequency input signal is selected and the high-frequency semiconductor amplifier circuit 1 is operated in the gain mode, the inductance which causes degeneration is Ls1+Ls2. In general, the frequency f1 of the first high-frequency input signal (form input terminal RFin1) is at least slightly different from the frequency f2 of the second high-frequency input signal (from the input terminal RFin2). For example, the frequency f1 may be 900 MHz, and the frequency f2 may be 800 MHz.

Accordingly, the optimal inductance differs for each input terminal. In FIG. 29, since the inductance can be set separately with respect to each of the input terminals (RFin1, RFin2), electrical characteristics (specifically, the gain and the noise figure NF) can be improved for gain mode operation.

Here, inductor Ls1 (having one end grounded) can considered as a main matching inductor, with the inductor Ls2 being provided to correct for a difference in frequency (f1−f2). Accordingly, the inductance of Ls1 is typically larger than that of Ls2. Thus, in general, a layout area (occupied chip/die area) required for Ls2 is much smaller than a layout area required for Ls1, so that the layout area for the circuit of FIG. 29 need not necessarily increase significantly compared with the circuit in FIG. 21A.

Figure 30:
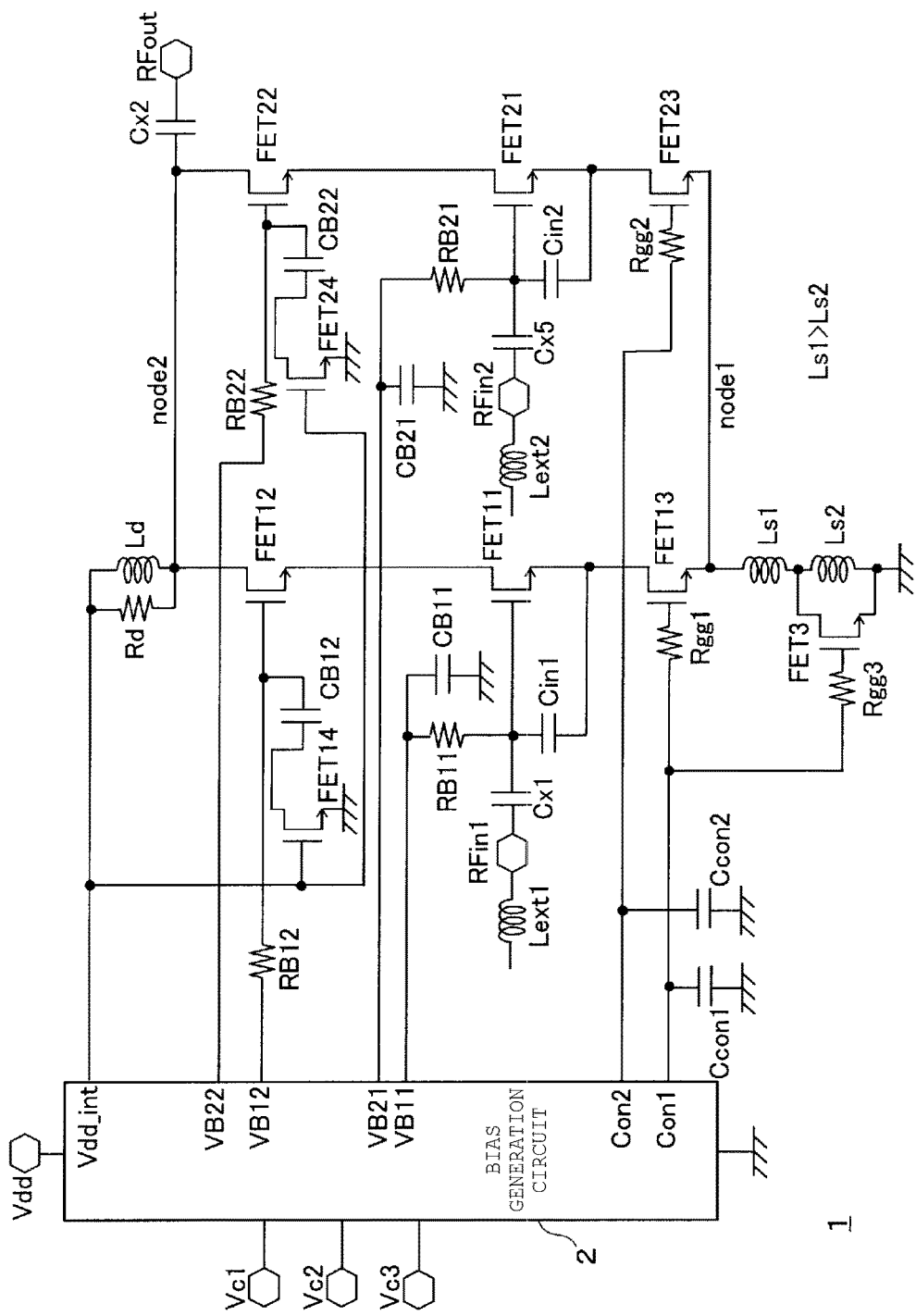
FIG. 30 is a circuit diagram of a high-frequency semiconductor amplifier circuit according to a fourth modified example of FIG. 21A.

FIG. 30 is a circuit diagram of a high-frequency semiconductor amplifier circuit 1 according to a fourth modified example of FIG. 21A. In the high-frequency semiconductor amplifier circuit 1 illustrated in FIG. 30, inductors Ls1 and Ls2 are connected in series between a connection node (node 1), at which the source of FET13 and the source of FET23 are connected to each other, and the ground node. A FET3 is connected in parallel with the inductor Ls2, and the control voltage Con1 is input to a gate of FET3.

In the high-frequency semiconductor amplifier circuit 1 depicted in FIG. 30, when the first high-frequency input signal is selected and the circuit is operated in the gain mode, FET3 is turned on, and an inductance that causes degeneration is only provided by inductor Ls1. When the second high-frequency input signal is selected and the circuit is operated in the gain mode, FET3 is turned off, and the inductance that causes degeneration is Ls1+Ls2 (inductors Ls1 and Ls2 acting in series).

As described above, the frequency f1 of the first high-frequency input signal input from the input terminal RFin1 can be different from the frequency f2 of the second high-frequency input signal input from the input terminal RFin2. In the high-frequency semiconductor amplifier circuit 1 according to the fourth modified example, since the optimal inductance can be set separately with respect to each of the input terminals, electrical characteristics (specifically, the gain and the noise figure NF) can be improved for the gain mode in a manner similar to the circuit according to the third modified example (FIG. 29).

Figure 31:
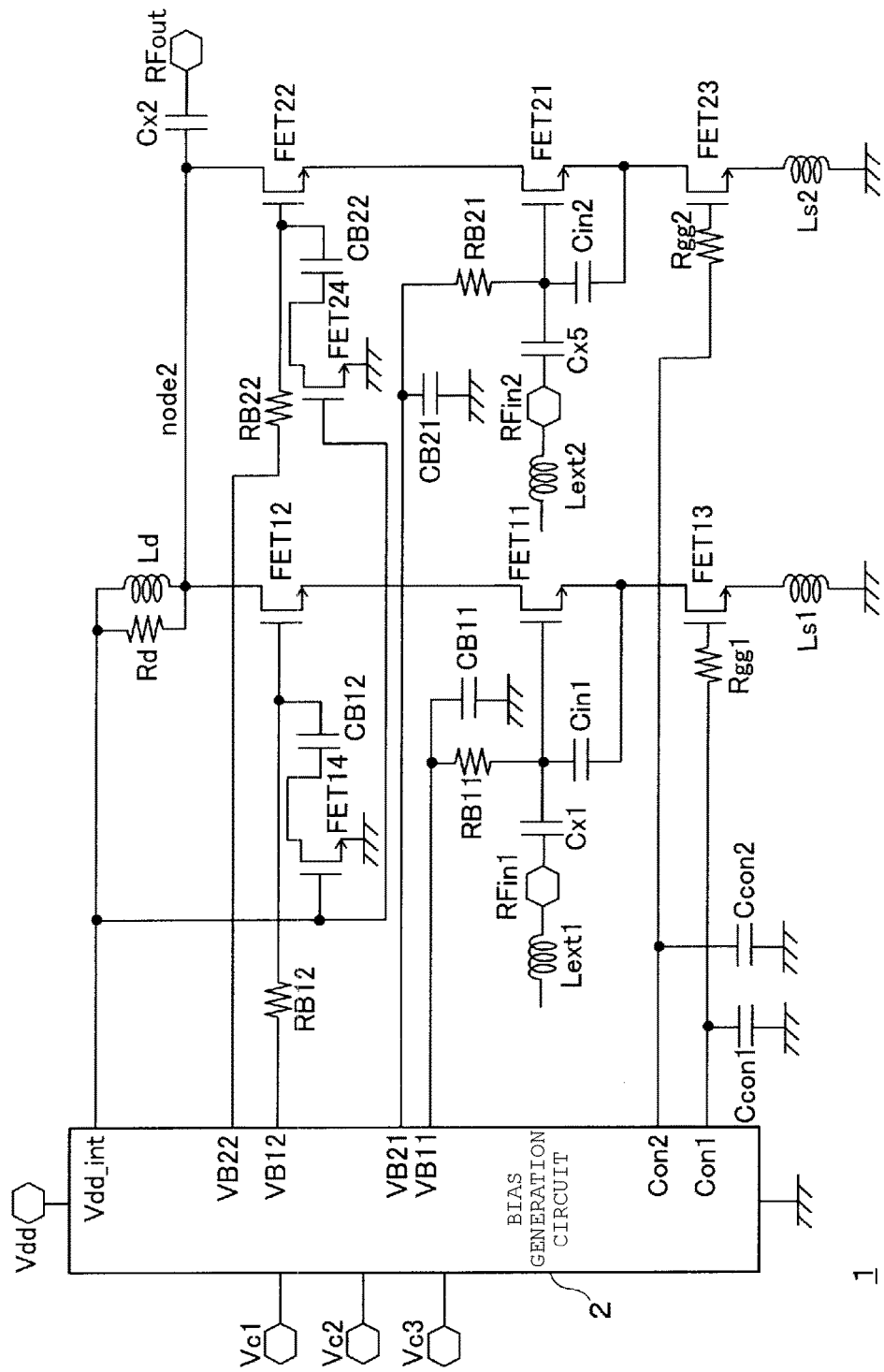
FIG. 31 is a circuit diagram of a high-frequency semiconductor amplifier circuit according to a fifth modified example of FIG. 21A.

FIG. 31 is a circuit diagram of a high-frequency semiconductor amplifier circuit 1 according to a fifth modified example of FIG. 21A. In FIG. 31, the high-frequency semiconductor amplifier circuit 1 includes an inductor Ls1 connected between the source of FET13 and the ground node and an inductor Ls2 connected between the source of FET23 and the ground node in addition to the elements of the high-frequency semiconductor amplifier circuit 1depicted in FIG. 21A.

In the high-frequency semiconductor amplifier circuit 1illustrated in FIG. 28A, when the FET13 and the FET23 are disposed separately from each other, the (wiring) distance between the source of FET13 and the inductor Ls is different from the (wiring) distance between the source of FET23 and the inductor Ls. Thus, it is necessary to consider a parasitic inductance of the wiring by which FET13 and FET23 are connected to inductor Ls, as an effective part of the inductor Ls, such that is possible the source inductance of FET13 is significantly different from source inductance of FET23. In such a case, it may be advantageous to independently provide the inductor Ls as distinct components (i.e., inductor Ls1 and Ls2) as illustrated in FIG. 31 rather than wiring the sources of FET13 and FET23 to a common inductor element.

In this fifth modified example of FIG. 21A, the inductor Ls1 connected to the source of FET13 is electrically separate from the inductor Ls2 connected to the source of FET23.

Figure 32:
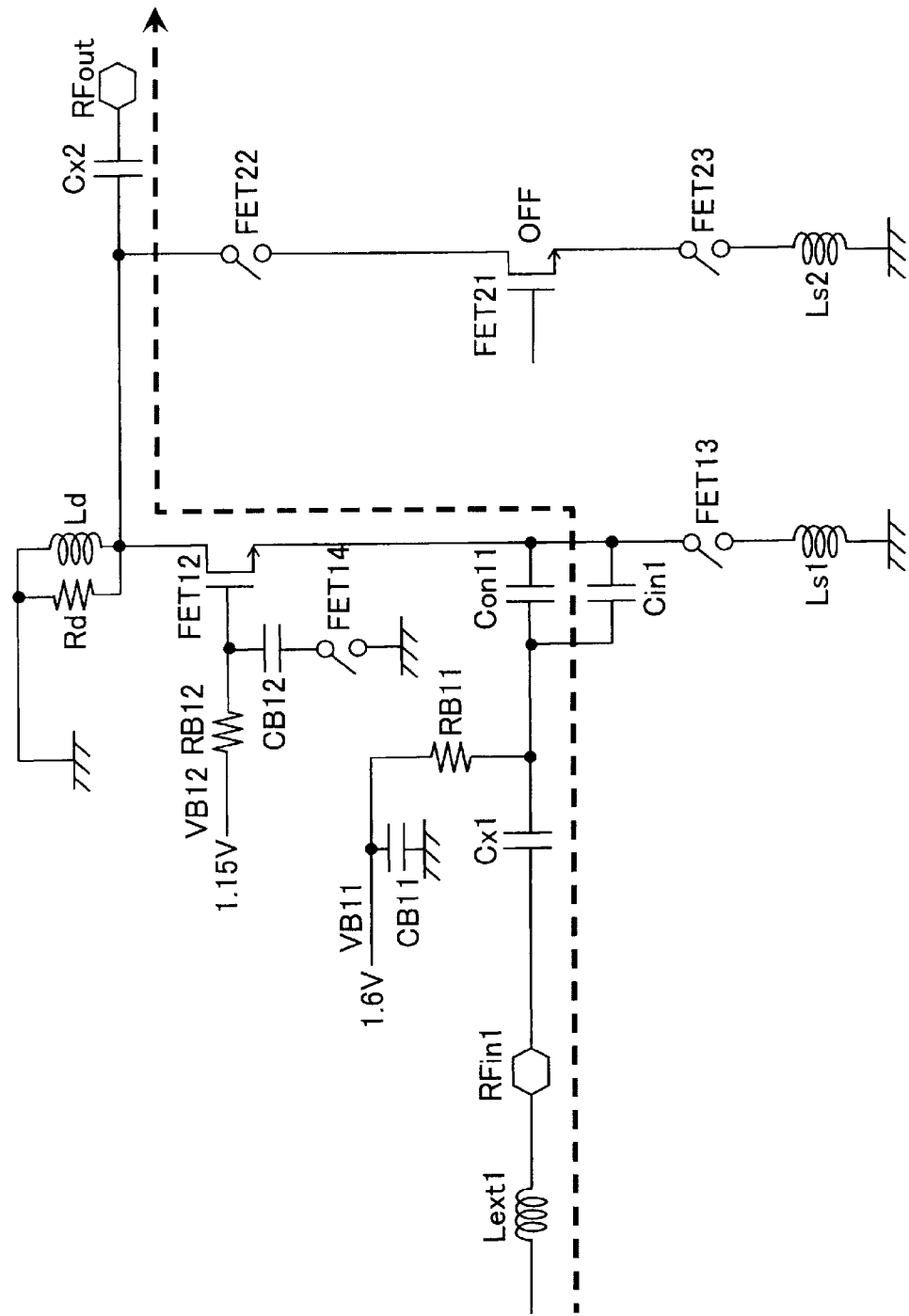
FIG. 32 is a diagram illustrating an equivalent circuit and a signal path in a case where a first high-frequency input signal is selected and the high-frequency semiconductor circuit is operated in a bypass mode.

FIG. 32 is a diagram illustrating an equivalent circuit and a signal path in a case where the first high-frequency input signal is selected and the circuit of FIG. 31 is operated in the bypass mode. In FIG. 32, FET11 is denoted as a MOS capacitor Con11. The high-frequency input signal, which being input to the input terminal RFin1 from the inductor Lext1 (attached externally to the input terminal RFin1), passes through the capacitor Cx1, the capacitors Con11 and Cin1 connected in parallel to each other, the FET12, and then the capacitor Cx2, after which it is then output from the output terminal RFout.

Figure 33:
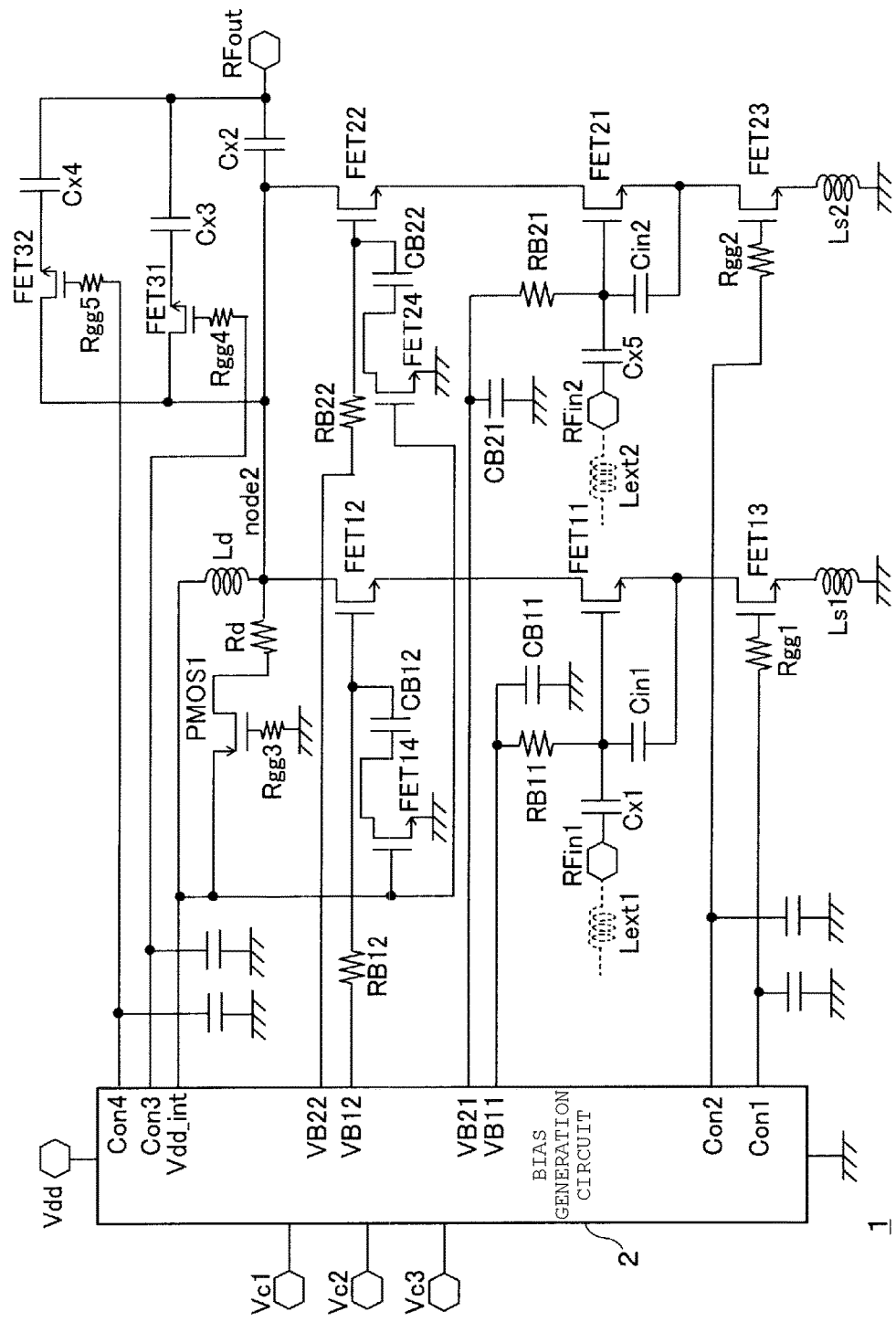
FIG. 33 is a circuit diagram of a high-frequency semiconductor amplifier circuit according to a sixth modified example of FIG. 21A.

FIG. 33 is a circuit diagram of a high-frequency semiconductor amplifier circuit 1 according to a sixth modified example of FIG. 21A. In FIG. 33, the high-frequency semiconductor amplifier circuit 1 includes FET31, FET32, resistors Rgg4 and Rgg5, capacitors Cx3 and Cx4, a P-type transistor PMOS1, and resistor Rgg3 in addition to the elements of the circuit depicted in FIG. 31.

Here, a control voltage Con3 is output from the bias generation circuit 2 to be input to a gate of FET31 via the resistor Rgg4. A drain of FET31 is connected to the drain of FET12 and the drain of FET22. A source of FET31 is connected to one end of capacitor Cx3.

A control voltage Con4 is output from the bias generation circuit 2 to be input to a gate of FET32 via the resistor Rgg5. A drain of FET32 is connected to the drain of FET12 and the drain of FET22. A source of FET32 is connected to one end of capacitor Cx4.

The resistor Rgg3 has a high resistance and is connected between a gate of the PMOS1 and a ground node. A drain of the PMOS1 is connected to one end of the resistor Rd. The voltage Vdd_int output from the bias generation circuit 2 is input to a source of PMOS1.

A threshold voltage of PMOS1 is, for example, −0.5 V. In the gain mode, the PMOS1 is turned on, and the resistor Rd becomes effective. In the bypass mode, the PMOS1 is turned off, and the resistor Rd becomes ineffective.

By switching ON/OFF state of FET31 and FET32, capacitance in the output matching circuit can be adjusted by inclusion/exclusion of the capacitors Cx3 and Cx4 in the signal transmission pathway, so that characteristic impedance on a propagation pathway of the high frequency signal can be adjusted to 50Ω.

When PMOS1 is provided, the resistor Rd causing loss can be effectively excluded from the transmission pathway during the bypass mode, and thus loss can be further improved.

Figure 34:
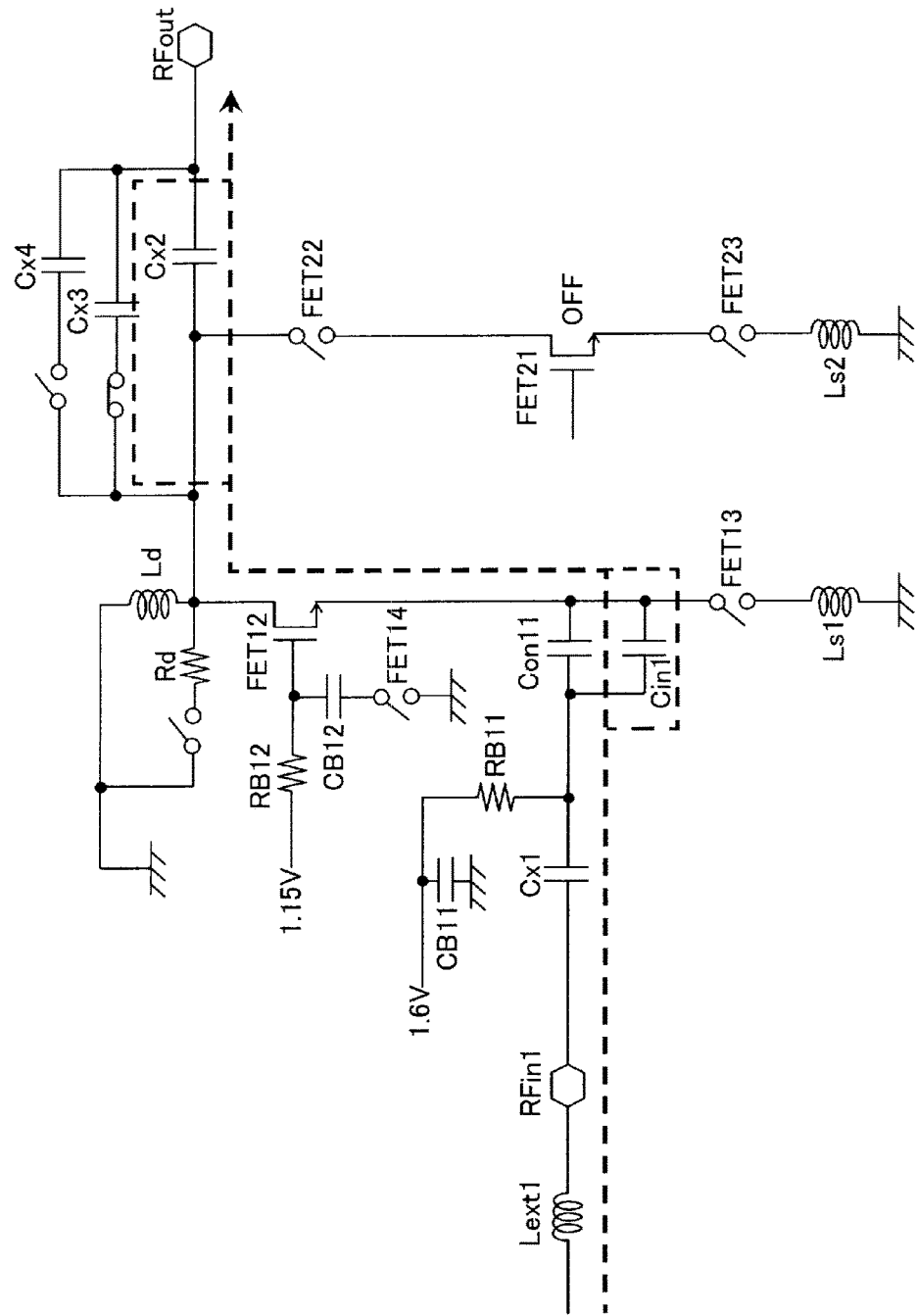
FIG. 34 is a diagram illustrating an equivalent circuit and a signal path when a first high-frequency input signal and a bypass mode are selected.

FIG. 34 is a diagram illustrating an equivalent circuit and a signal path when the first high-frequency input signal and the bypass mode are selected for the circuit depicted in FIG. 33. In FIG. 34, the FET11 is denoted as a MOS capacitor Con11. The high-frequency input signal, which is input to the input terminal RFin1 from the inductor Lext1 (attached externally to the input terminal RFin1), passes through the capacitor Cx1, the capacitors Con11 and Cin1 connected in parallel to each other, and FET12, after which it is output from the output terminal RFout via the capacitors Cx2 and Cx3 connected in parallel to each other.

Figure 35:
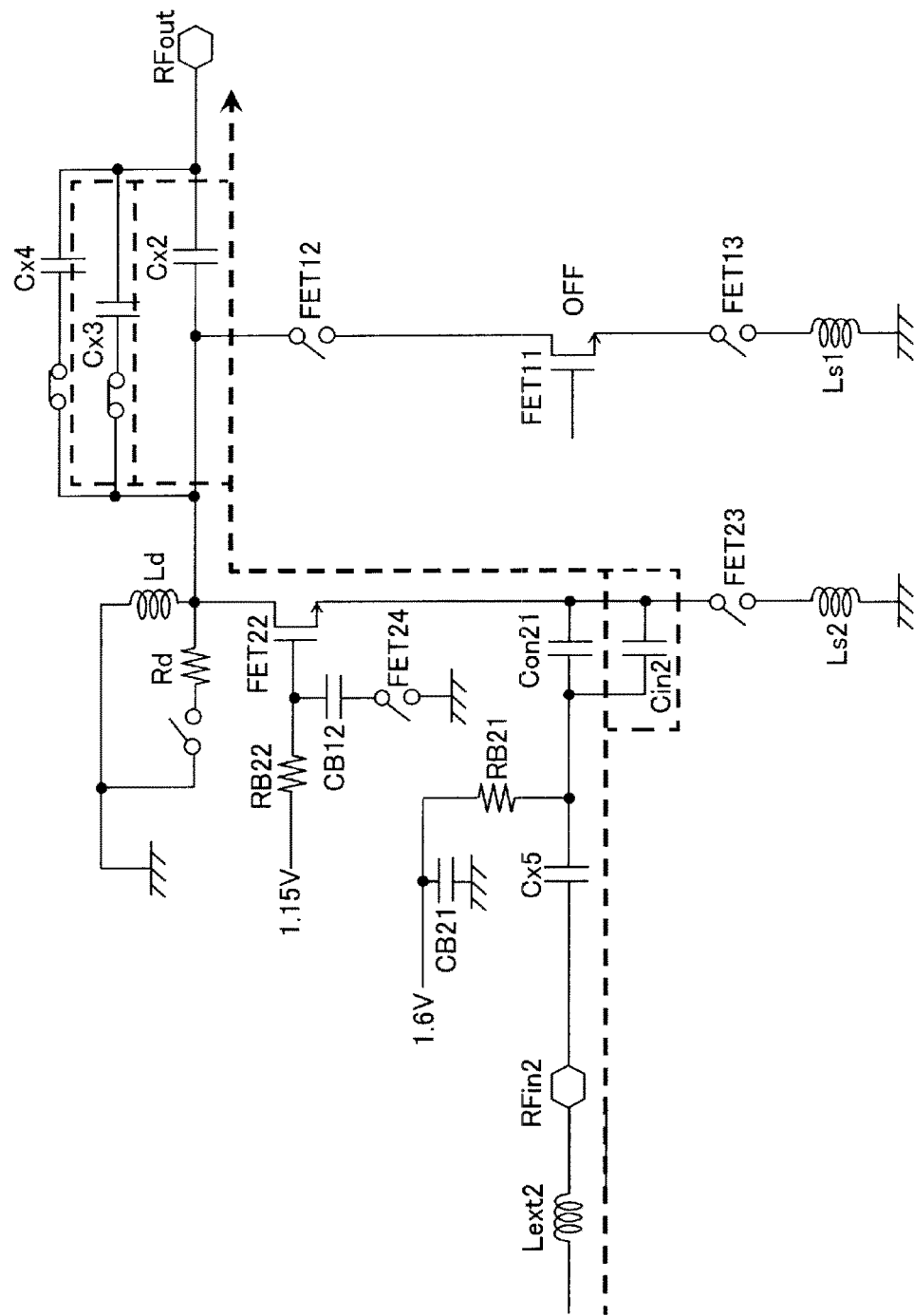
FIG. 35 is a diagram illustrating an equivalent circuit and a signal path when a second high-frequency input signal and a bypass mode are selected.

FIG. 35 is a diagram illustrating an equivalent circuit and a signal path when the second high-frequency input signal and the bypass mode are selected for the circuit depicted in FIG. 33. In FIG. 35, FET21 is denoted by a MOS capacitor Con21. The high-frequency input signal, which is input to the input terminal RFin2 from the inductor Lext2 (attached externally to the input terminal RFin2), passes through the capacitor Cx2, the capacitors Con21 and Cin2 connected in parallel to each other, and FET22, after which it is output from the output terminal RFout via the capacitors Cx2, Cx3, and Cx4 connected in parallel to each other.

As described above, according to the third embodiment, the high-frequency semiconductor amplifier circuit 1, which is compatible with multi-band and has a bypass mode, can be realized with a comparatively small layout area. In addition, the excellent noise figure NF can be obtained in both the gain mode and the bypass mode.

Fourth Embodiment

A fourth embodiment is different from that of the third embodiment.

Figure 36A:
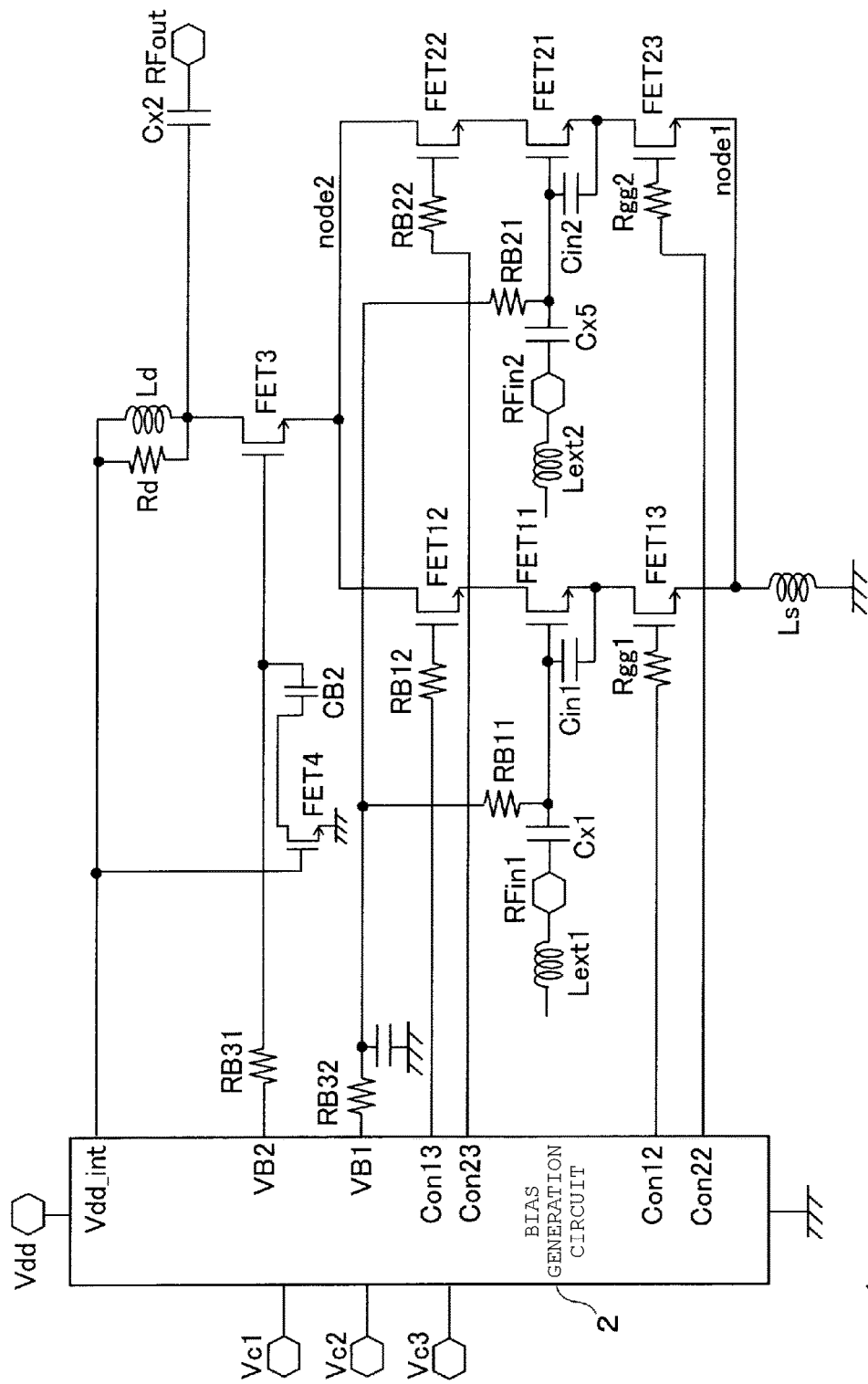
FIG. 36A is a circuit diagram of a high-frequency semiconductor amplifier circuit according to a fourth embodiment.

FIG. 36A is a circuit diagram of a high-frequency semiconductor amplifier circuit 1 according to the fourth embodiment, and FIG. 36B is a diagram illustrating input/output voltages of a bias generation circuit 2 in the high-frequency semiconductor amplifier circuit 1 depicted in FIG. 36A. In FIG. 36A, the high-frequency amplifier circuit 1 is compatible with multi-band communication, in that it can select between at least two different high-frequency input signals, and amplify and output the selected signal. In the high-frequency amplifier circuit 1 depicted in FIG. 36A, a switching between gain mode and bypass mode operation can be performed. In the high-frequency semiconductor amplifier circuit 1 depicted in FIG. 36A, a minimal multi-band configuration (two input frequencies only) is illustrated; however, of the number of input frequencies is not limited to two and may be, for example, three or more high-frequency input signals by appropriate modification of depicted circuit in FIG. 36A.

In the high-frequency semiconductor amplifier circuit 1 illustrated in FIG. 36A, a first high-frequency input signal (input from an input terminal RFin1) is input to a gate of an N-type transistor (first transistor) FET11 via a capacitor Cx1. A capacitor Cin1 is connected between the gate and source of FET11. A bias voltage VB1 output from the bias generation circuit 2 is input to the gate of FET11 via resistors RB11 and RB32. An N-type transistor (second transistor) FET12 is connected to a drain of FET11.

A control voltage Con13 output from the bias generation circuit 2 is input to a gate of FET12 via resistor RB12. A source of an N-type transistor (fourth transistor) FET3 is connected to a drain of FET12. A bias voltage VB2 output from the bias generation circuit 2 is input to a gate of FET3 via resistor RB31. One end resistor Rd, inductor Ld, and capacitor (second capacitor) Cx2 is connected to a drain of FET3. A voltage Vdd_int output from the bias generation circuit 2 is supplied to the other ends the resistor Rd and the inductor Ld. One end of a capacitor (first capacitor) CB2 is connected to a gate of FET3. The other end of the capacitor CB2 is connected to a drain of an N-type transistor (first switching circuit) FET4. A source of FET4 is grounded, and the voltage Vdd_int is input to a gate of FET4.

A drain of an N-type transistor (third transistor) FET13 is connected to a source of FET11. A control voltage Con12 output from the bias generation circuit 2 is input to a gate of FET13 via resistor Rgg1. An inductor (second inductor) Ls is connected between a source of FET13 and a ground node.

A second high-frequency input signal (input from an input terminal RFin2) is input to a gate of FET21 via a capacitor Cx5. A capacitor Cin2 is connected between the gate and source of FET21. A bias voltage VB1 output from the bias generation circuit 2 is input to the gate of FET21 via resistors RB21 and RB32. A FET22 is connected to a drain of the FET21. A control voltage Con23 output from the bias generation circuit 2 is input to a gate of FET22 via resistor RB22. A source of FET3 is connected to a drain of FET22.

A FET23 is connected to the source of FET21. A control voltage Con22 output from the bias generation circuit 2 is input to a gate of FET23 via resistor Rgg2. The inductor Ls is connected between the source of FET23 and the ground node.

In FIG. 36A, when the bias generation circuit 2 selects for the first high-frequency input signal and the gain mode, the control voltages Con12, Con13, Con22, and Con23 are generated such that FET12 and FET13 are turned on and FET22 and FET23 are turned off, the bias voltage (first bias voltage) VB1 to be applied to the gate of FET11 is set to be lower than a drain-to-source voltage of FET11 so that the gate voltage of the FET11 is set close to a threshold voltage, and the bias voltage (second bias voltage) VB2 of FET3 is set to a predetermined voltage. Here, the predetermined voltage is a voltage (for example, 1.15 V) for setting the drain-to-source voltage of the FET11 to an optimum value (for example 0.8 V). In addition, when the bias generation circuit 2 illustrated in FIG. 36A selects for the first high-frequency input signal and the bypass mode, the control voltages Con12 and Con22 are generated such that FET13 and FET23 are turned off, the control voltages Con13 and Con23 are generated such that FET12 is turned on and FET22 is turned off, the bias voltage VB1 is set such that channels of FET11 and FET21 enter a strong inversion state, and the bias voltage VB2 is set such that FET3 is turned on.

Figure 37:
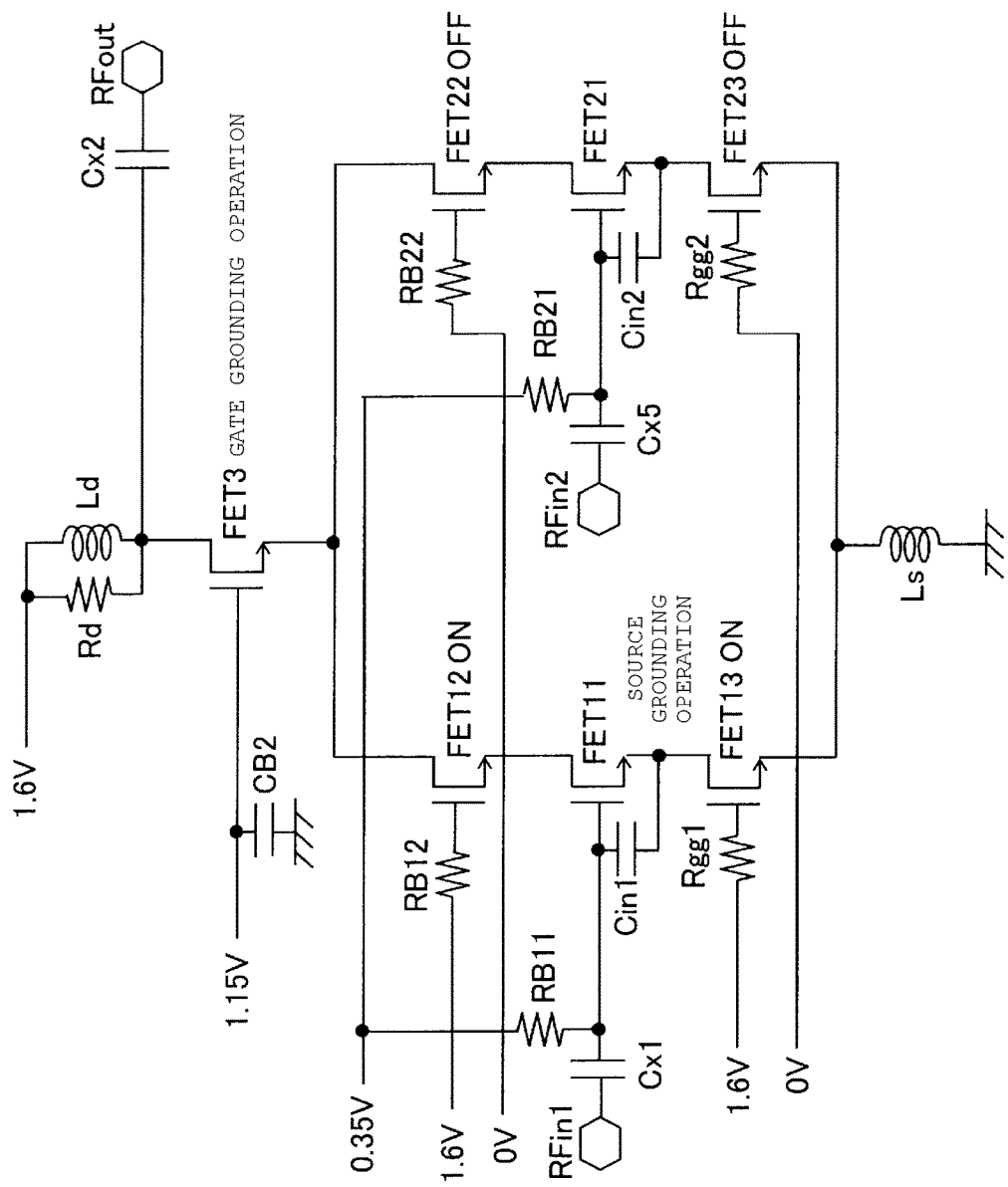
FIG. 37 is an equivalent circuit diagram when the first high-frequency input signal is selected and the high-frequency semiconductor amplifier circuit is in a gain mode.

FIG. 37 is an equivalent circuit diagram for when the first high-frequency input signal is selected and the high-frequency semiconductor amplifier circuit 1 of FIG. 36A is operated in the gain mode. Both of FET12 and FET13 are in the ON-state. The source of FET11 is connected to the inductor Ls via FET13, which is in the ON-state. Accordingly, FET11 functions as a common source FET causing degeneration. Furthermore, FET3 functions as a gate-grounded FET. Thus, FIG. 37 illustrates a cascode amplifier having a common source FET11 and a gate-grounded FET3. The bias voltage VB1 is set to 0.35 V, at which the gate voltage of the FET11 is close to the threshold voltage. For this reason, the FET11 has an excellent noise figure NF with low current consumption. FET22 and FET23 are in the OFF-state, and the input terminal RFin2 to which the second high-frequency input signal can be input becomes ineffective (isolated).

Figure 38:
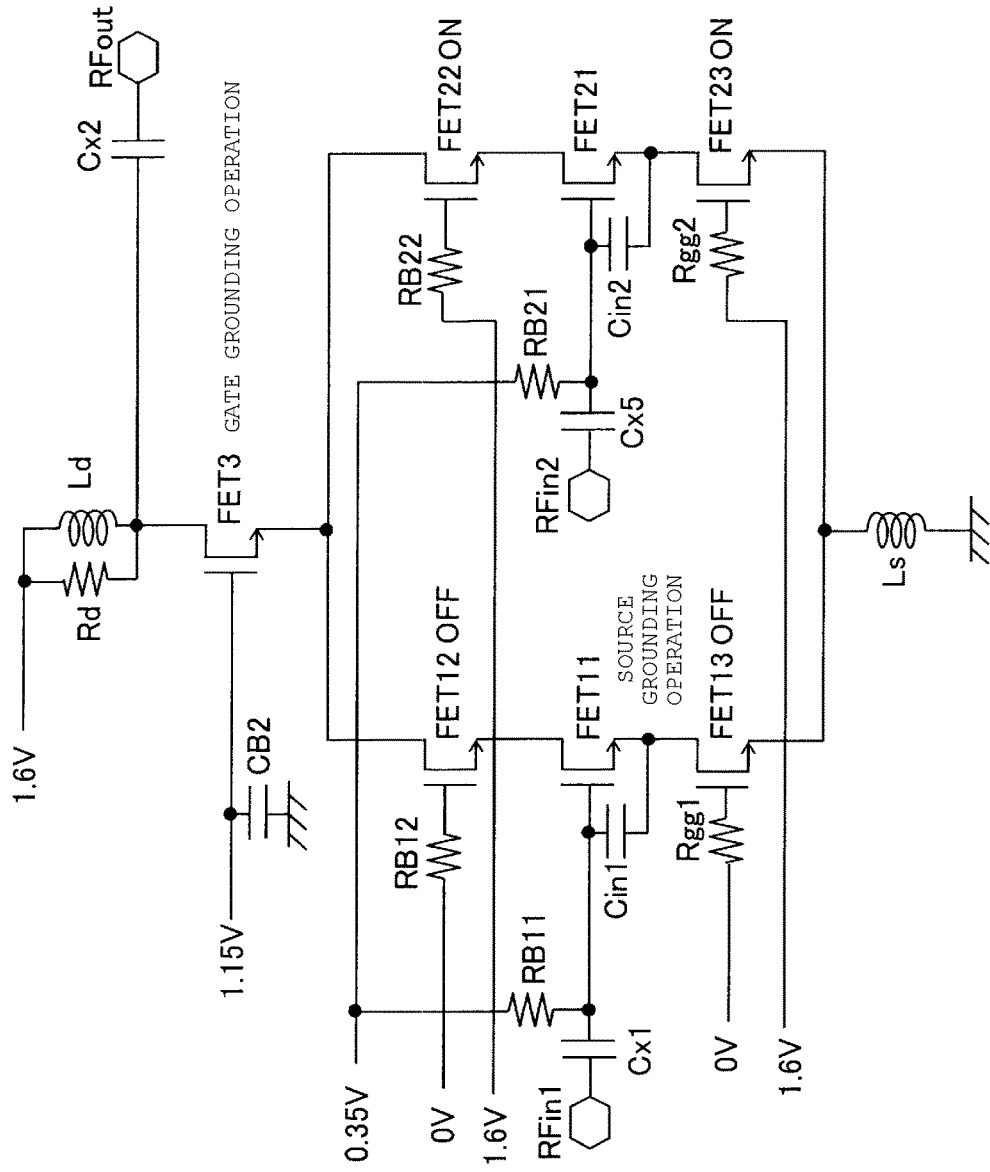
FIG. 38 is an equivalent circuit diagram when a second high-frequency input signal is selected and the high-frequency semiconductor amplifier circuit is in the gain mode.

FIG. 38 is an equivalent circuit diagram for when the second high-frequency input signal is selected for and the high-frequency semiconductor amplifier circuit 1 of FIG. 36A is operated in the gain mode. Here FET22 and FET23 are in the ON-state. Accordingly, FIG. 38 illustrates a cascode amplifier having a common source FET21 and a gate-grounded FET3. Since the gate voltage of the FET21 is set close to the threshold voltage, the high-frequency semiconductor amplifier circuit 1 has an excellent noise figure NF with low power consumption. The FET12 and FET13 are in the OFF-state, and the input terminal RFin1, to which the first high-frequency input signal can be input, becomes ineffective (isolated).

Figure 39:
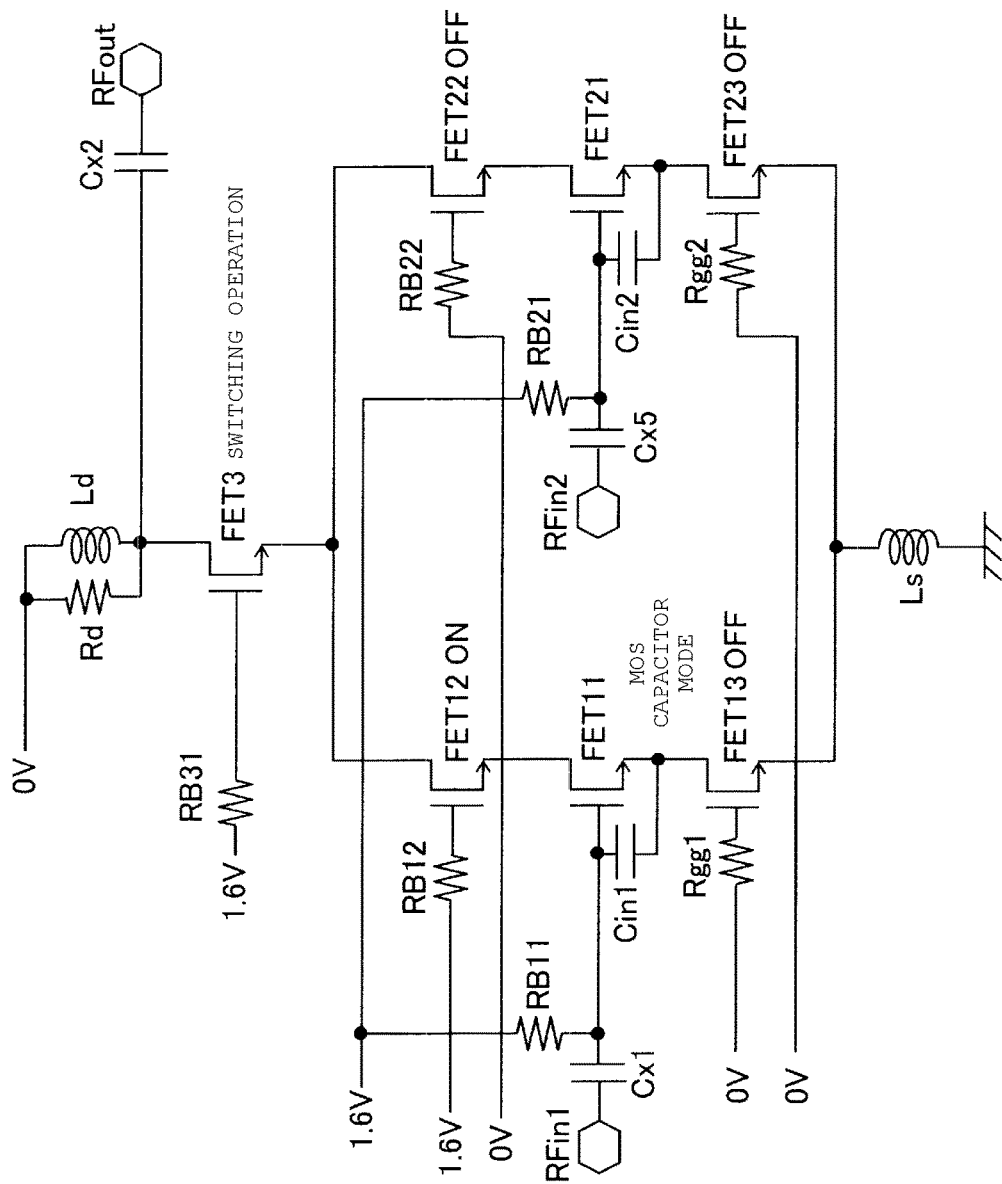
FIG. 39 is an equivalent circuit diagram when the first high-frequency input signal is selected and the high-frequency semiconductor amplifier circuit is in a bypass mode.

FIG. 39 is an equivalent circuit diagram when the first high-frequency input signal is selected for and the high-frequency semiconductor amplifier circuit 1 of FIG. 36A is operated in the bypass mode. In the bypass mode, the voltage Vdd_int output from the bias generation circuit 2 becomes 0 V. The circuit in FIG. 39 has FET11 or FET21, which each have a gate receiving the high-frequency input signal in the bypass mode, being used as a passive element.

When a high voltage (for example, 1.6 V) is input to the gate of the FET11, the channel of the FET11 enters a strong inversion state. Thus, the gate capacitance of the FET11 is increased, and this gate capacitance can be used as a passive element.

Since the FET12 is in the ON-state and the FET13 is in the OFF-state, the high frequency signal input from the input terminal RFin1 passes through the FET11 (which is functioning as a MOS capacitor), and then passes, in this order, through FET12, FET3, and the output matching circuit to be output from the output terminal RFout.

In bypass mode, FET4 is turned off, and the capacitor CB2 becomes ineffective. Accordingly, FET3 functions as a high-frequency switch in the ON-state, and low loss occurs when the high frequency signal passes through the FET3. In this bypass mode, FET22 and FET23 are turned off, and the input terminal RFin2 becomes ineffective.

Figure 40:
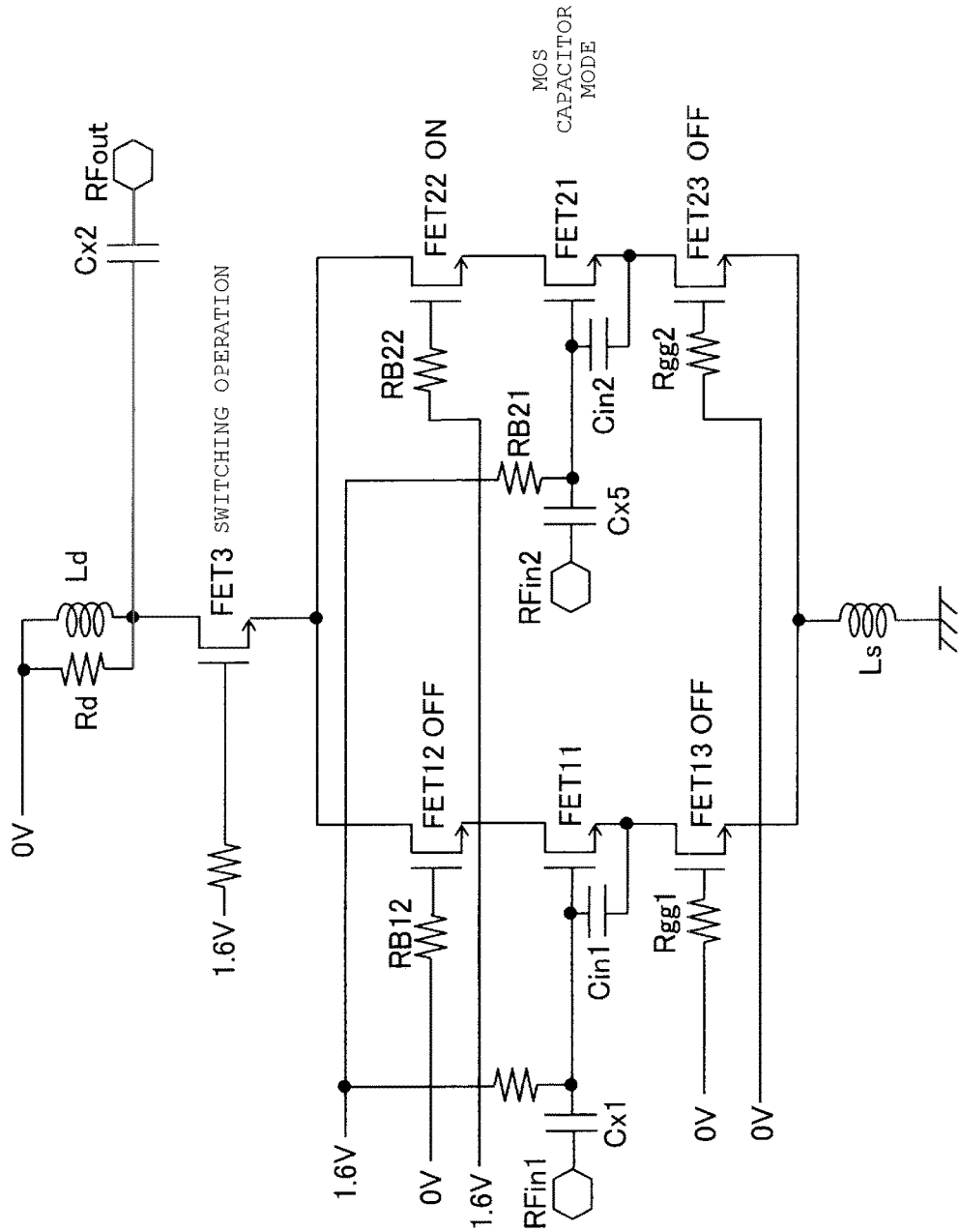
FIG. 40 is an equivalent circuit diagram when the second high-frequency input signal is selected and the high-frequency semiconductor amplifier circuit is in the bypass mode.

FIG. 40 is an equivalent circuit diagram when the second high-frequency input signal is selected and the high-frequency semiconductor amplifier circuit 1 of FIG. 36A is operated in bypass mode. Here, FET22 is turned on and FET23 is turned off, thus the high frequency signal input from the input terminal RFin2 passes through the FET21 (functioning as a MOS capacitor), and then, in this order, through FET22, FET3, and the output matching circuit to be output from the output terminal RFout. The FET12 and FET13 are in the OFF-state, and the input terminal RFin1 becomes ineffective.

Figure 41:
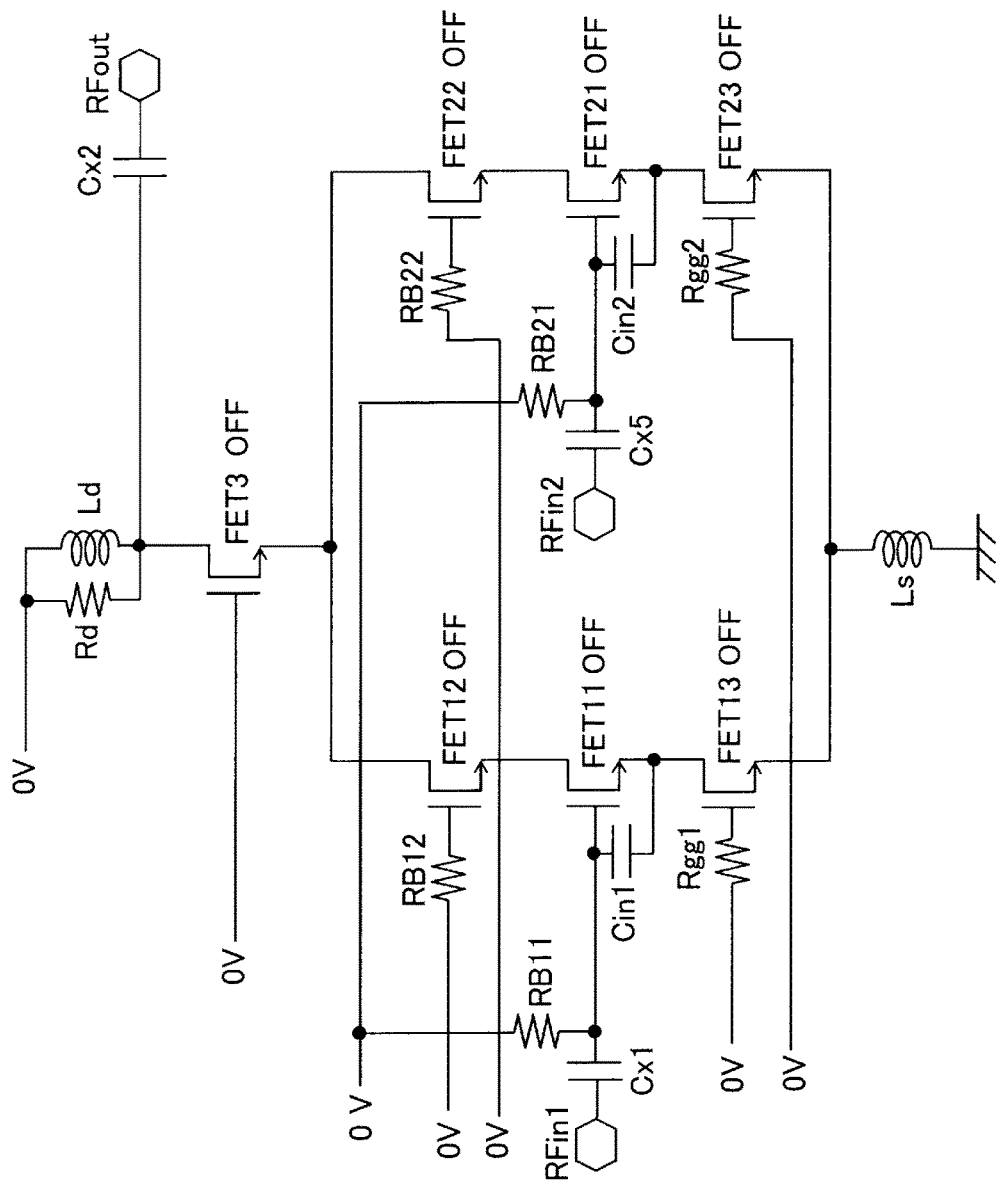
FIG. 41 is an equivalent circuit diagram when the high-frequency semiconductor amplifier circuit is in a shutdown mode.

FIG. 41 is an equivalent circuit diagram in a case of the high-frequency semiconductor amplifier circuit 1 of FIG. 36A being placed in a shutdown mode. In the shutdown mode, all of the bias voltages and the control voltages output from the bias generation circuit 2 are 0 V, and the input terminals RFin1 and RFin2 and the output terminal RFout are electrically disconnected from each other.

Figure 42:
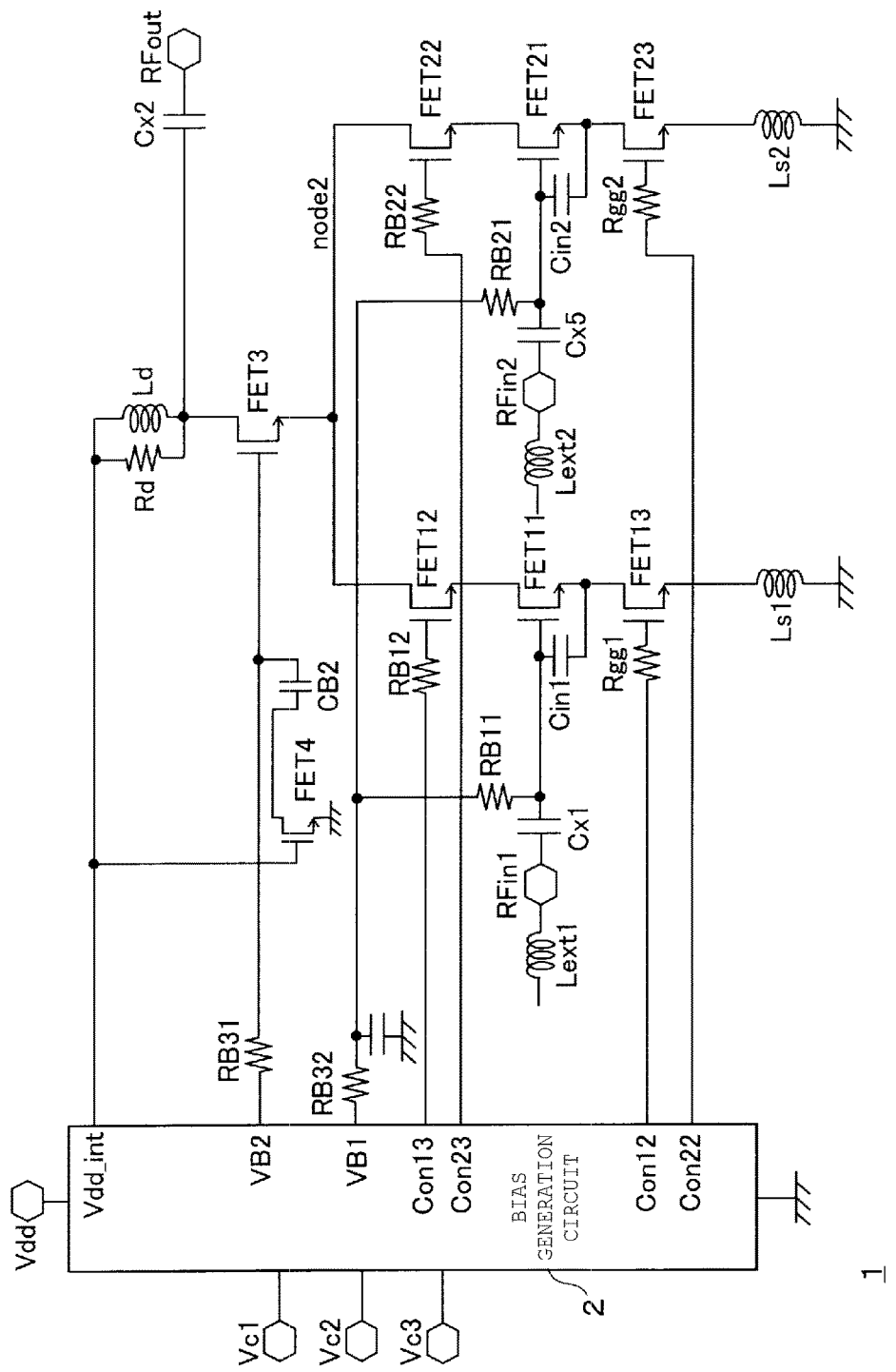
FIG. 42 is a circuit diagram of a high-frequency semiconductor amplifier circuit according to a first modified example of FIG. 36A.

FIG. 42 is a circuit diagram of a high-frequency semiconductor amplifier circuit 1 according to a first modified example of FIG. 36A. In a manner similar to the circuit depicted in FIG. 31, the circuit in FIG. 42 has an inductor Ls1 connected between the source of FET13 and the ground node and an inductor Ls2 connected between the source of FET23 and the ground node. This permits differences in wiring inductances associated with use of a common inductor Ls (as in FIG. 36A) to be considered, for example.

The operative effect of the high-frequency semiconductor amplifier circuit 1 depicted in FIG. 42 is thus substantially similar as that of the circuit as described above in conjunction with FIG. 32, and thus further description thereof will not be presented.

Figure 43:
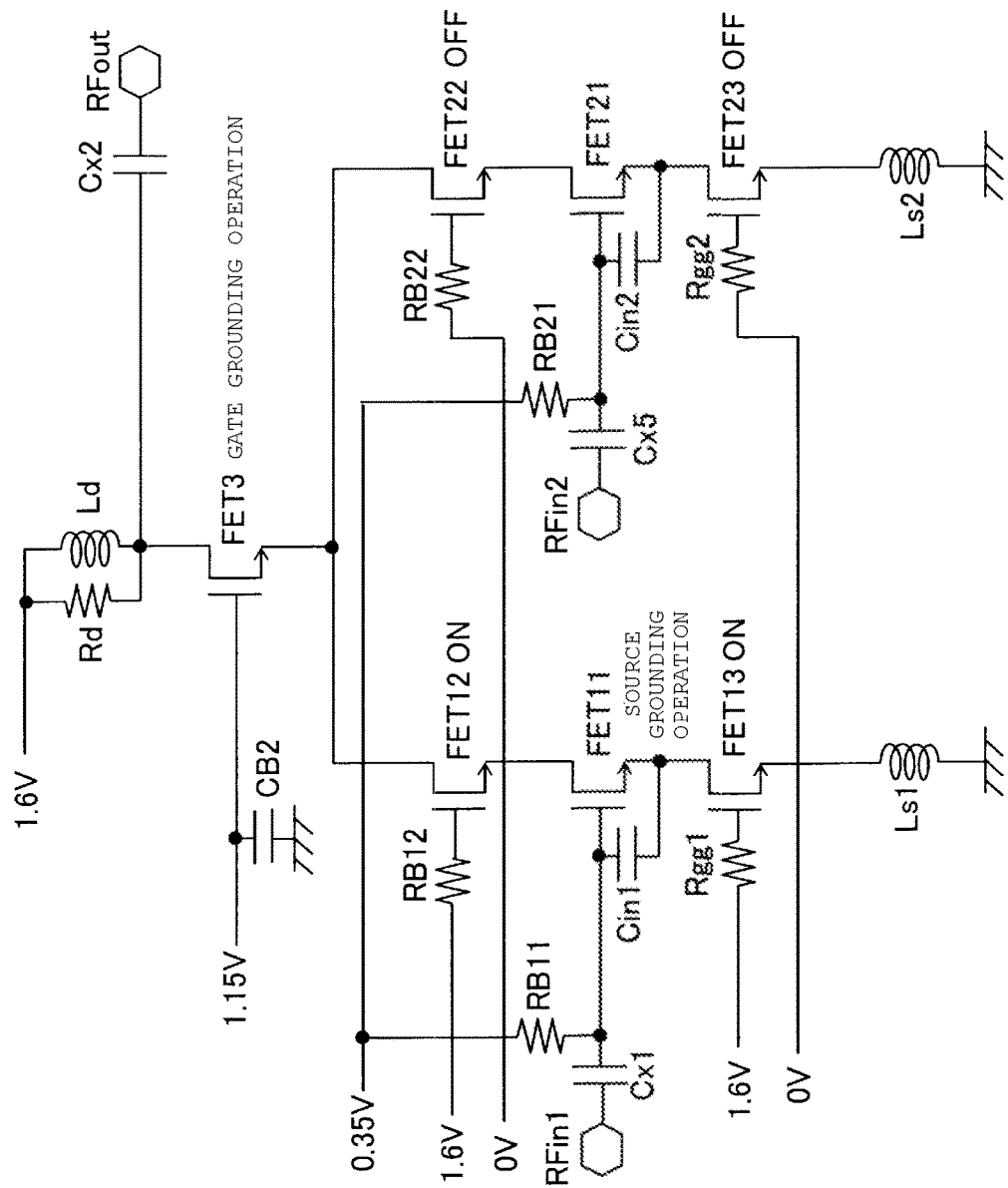
FIG. 43 is an equivalent circuit diagram when a first high-frequency input signal and a gain mode are selected.

FIG. 43 is an equivalent circuit diagram of the high-frequency semiconductor amplifier circuit 1 of FIG. 42 when the first high-frequency input signal and the gain mode are selected. The circuit in FIG. 43 is conceptually similar to that depicted in FIG. 37 excepting only that inductors Ls1 and Ls2 are separately disposed rather than a common inductor Ls being adopted, and thus further detailed description thereof will not be presented.

Figure 44:
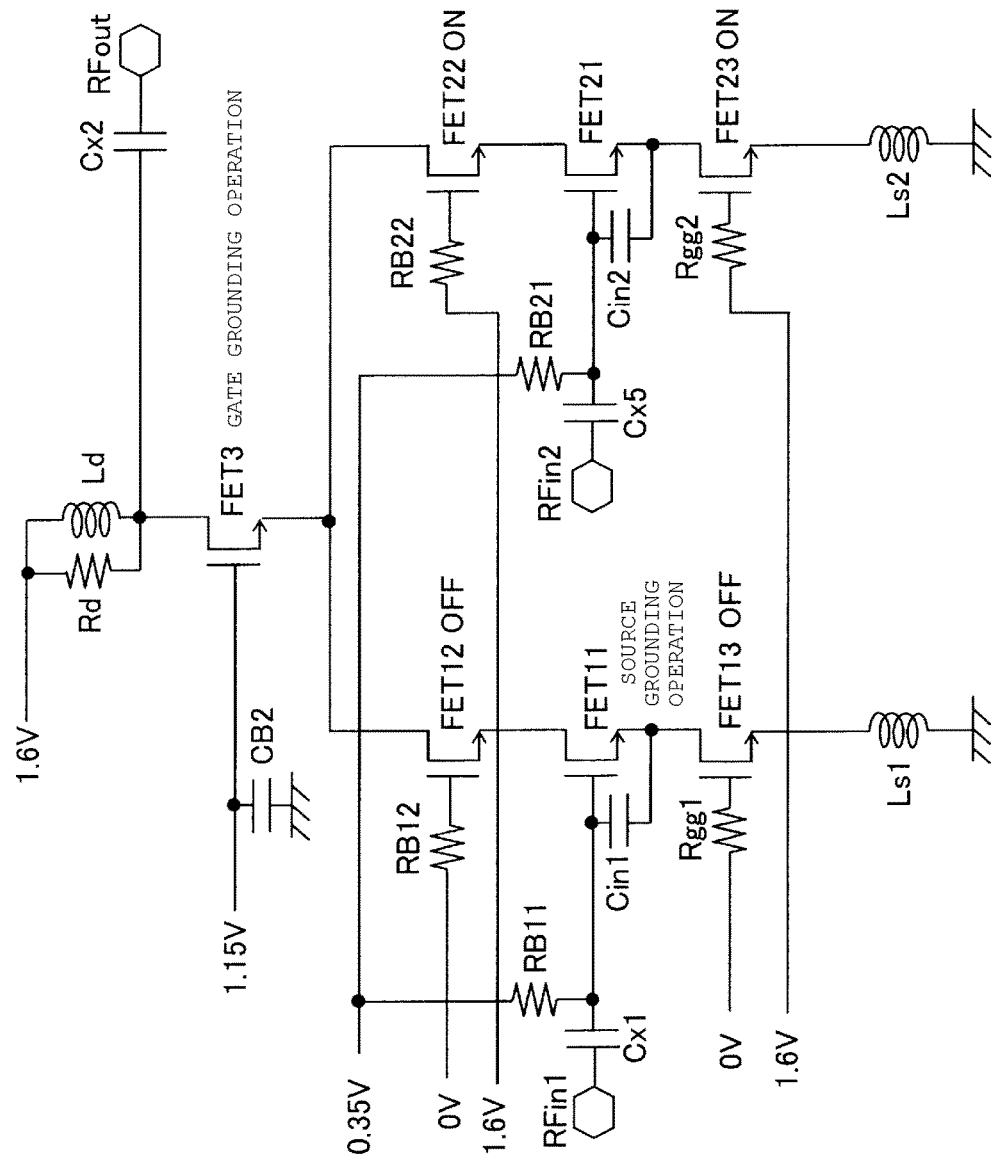
FIG. 44 is an equivalent circuit diagram when a second high-frequency input signal and a gain mode are selected.

FIG. 44 is an equivalent circuit diagram of high-frequency semiconductor amplifier circuit 1 of FIG. 42 when the second high-frequency input signal and the gain mode are selected. The circuit in FIG. 44 is conceptually similar to that depicted in FIG. 38 excepting that inductors Ls1 and Ls2 are separately disposed rather than a common inductor Ls being adopted, and thus further detailed description thereof will not be presented.

Figure 45:
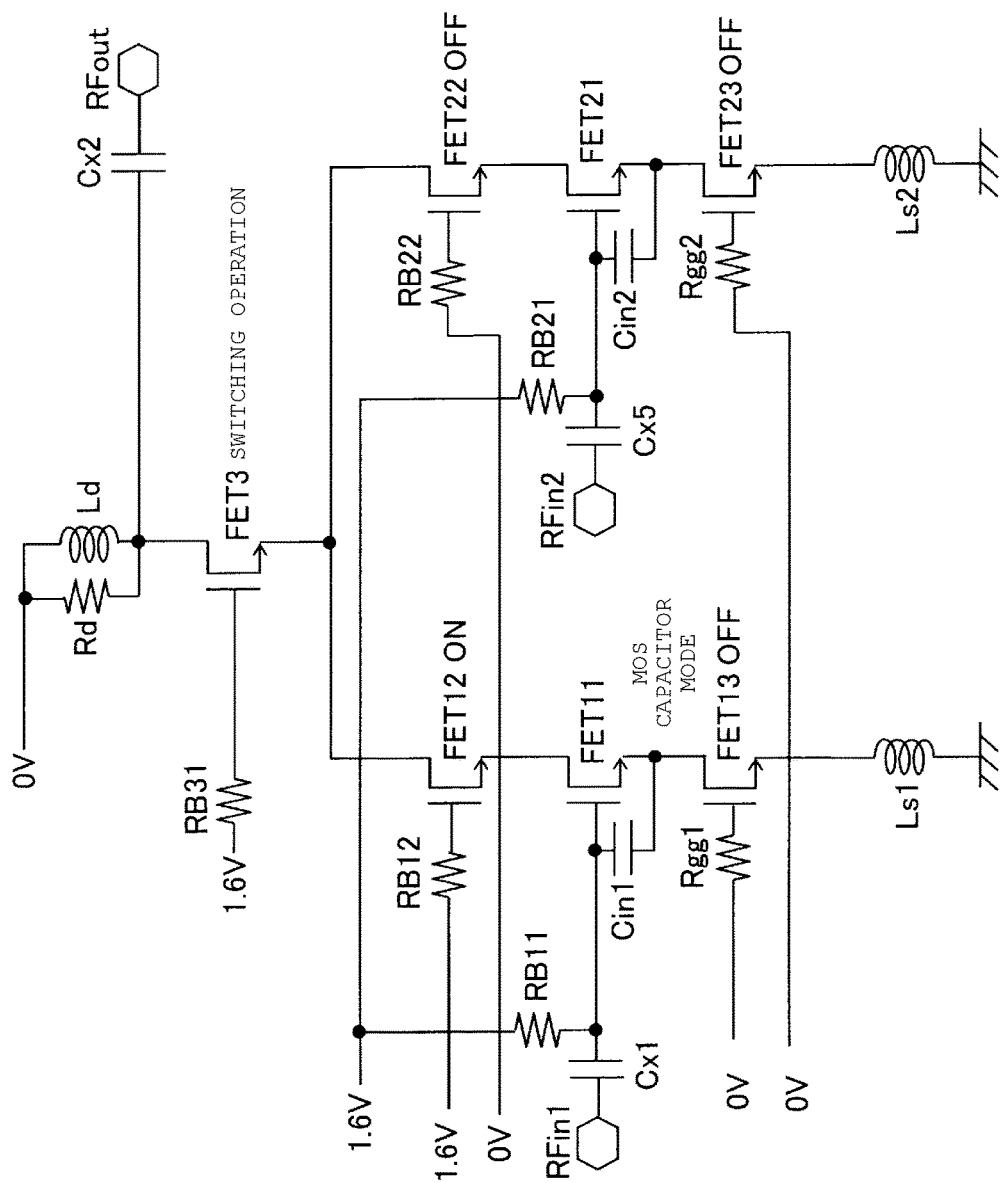
FIG. 45 is an equivalent circuit diagram when a first high-frequency input signal and a bypass mode are selected.

FIG. 45 is an equivalent circuit diagram of high-frequency semiconductor amplifier circuit 1 of FIG. 42 when the first high-frequency input signal and the bypass mode are selected. The circuit in FIG. 45 is conceptually similar to that in FIG. 39 excepting that inductors Ls1 and Ls2 are separately disposed rather than a common inductor Ls being adopted, and thus further detailed description thereof will not be presented.

Figure 46:
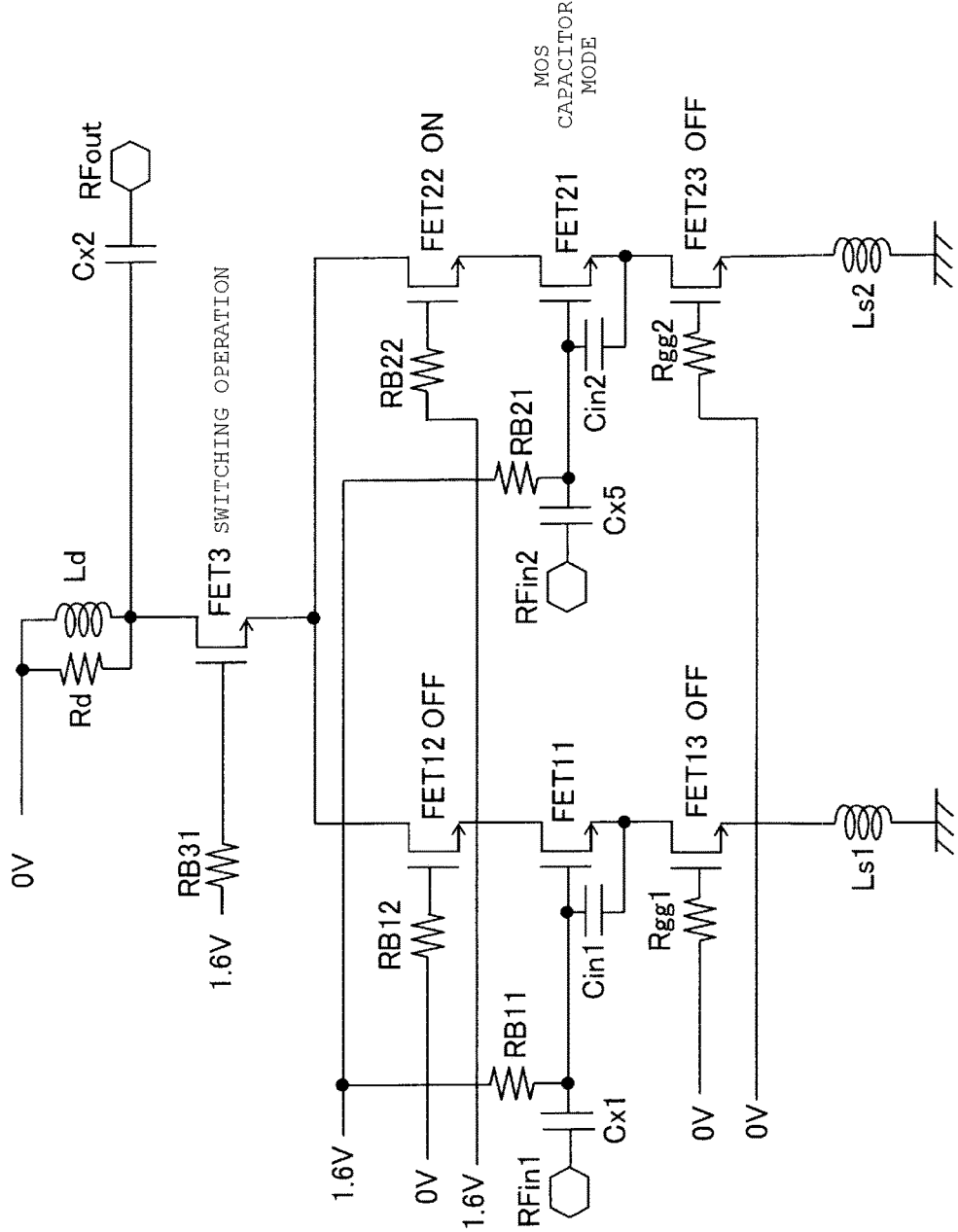
FIG. 46 is an equivalent circuit diagram when a second high-frequency input signal and a bypass mode are selected.

FIG. 46 is an equivalent circuit diagram high-frequency semiconductor amplifier circuit 1 of FIG. 42 when the second high-frequency input signal and the bypass mode are selected. The circuit in FIG. 46 is conceptually similar to that depicted in FIG. 39 excepting that inductors Ls1 and Ls2 are separately disposed rather than a common inductor Ls being adopted, and thus further detailed description thereof will not be presented.

Figure 47:
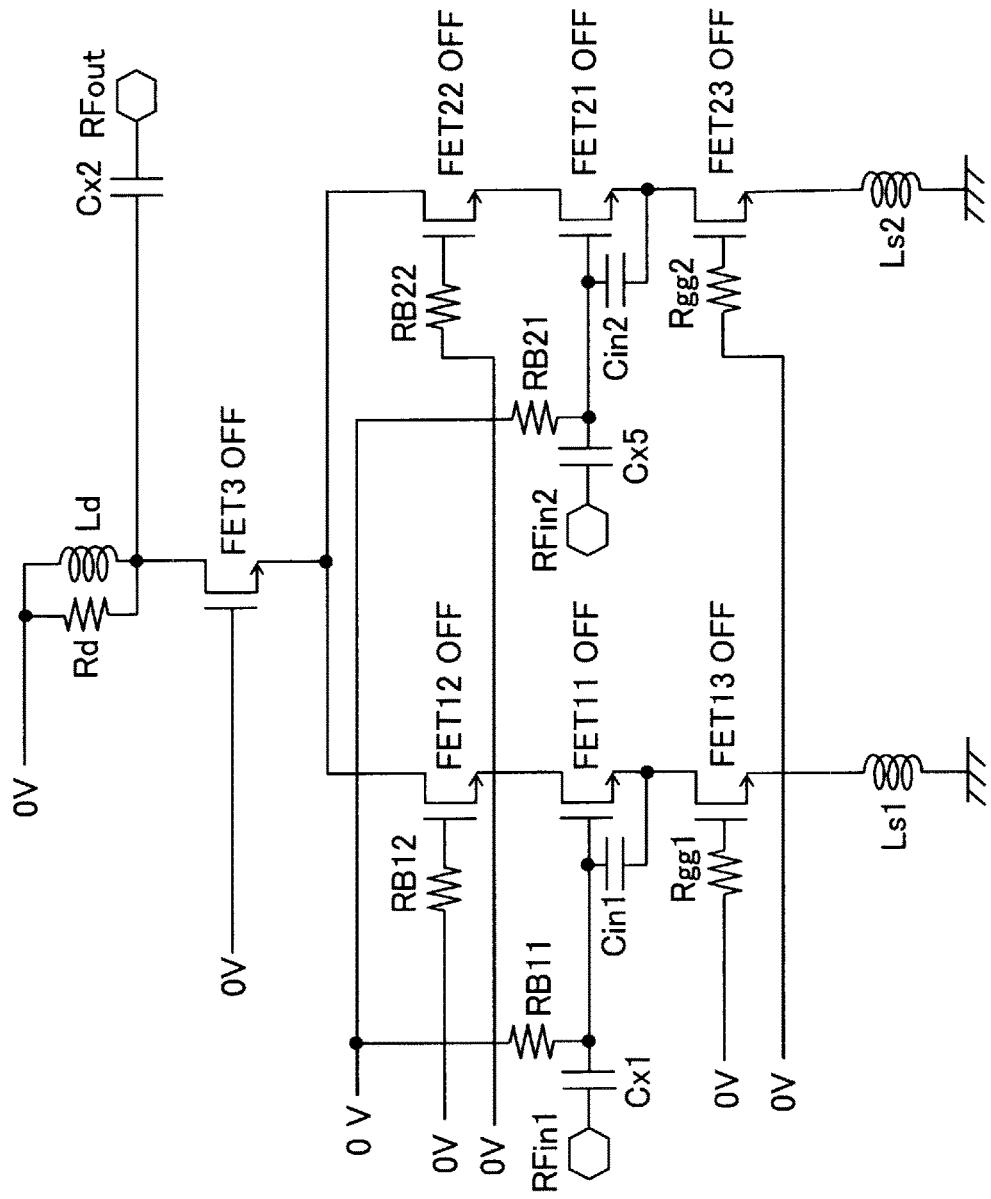
FIG. 47 is an equivalent circuit diagram when a shutdown mode is selected.

FIG. 47 is an equivalent circuit diagram high-frequency semiconductor amplifier circuit 1 of FIG. 42 when the shutdown mode is selected. The circuit in FIG. 47 is conceptually similar to that depicted in FIG. 40 excepting that inductors Ls1 and Ls2 are separately disposed rather than a common inductor Ls being adopted, and thus further detailed description thereof will not be presented.

Figure 48:
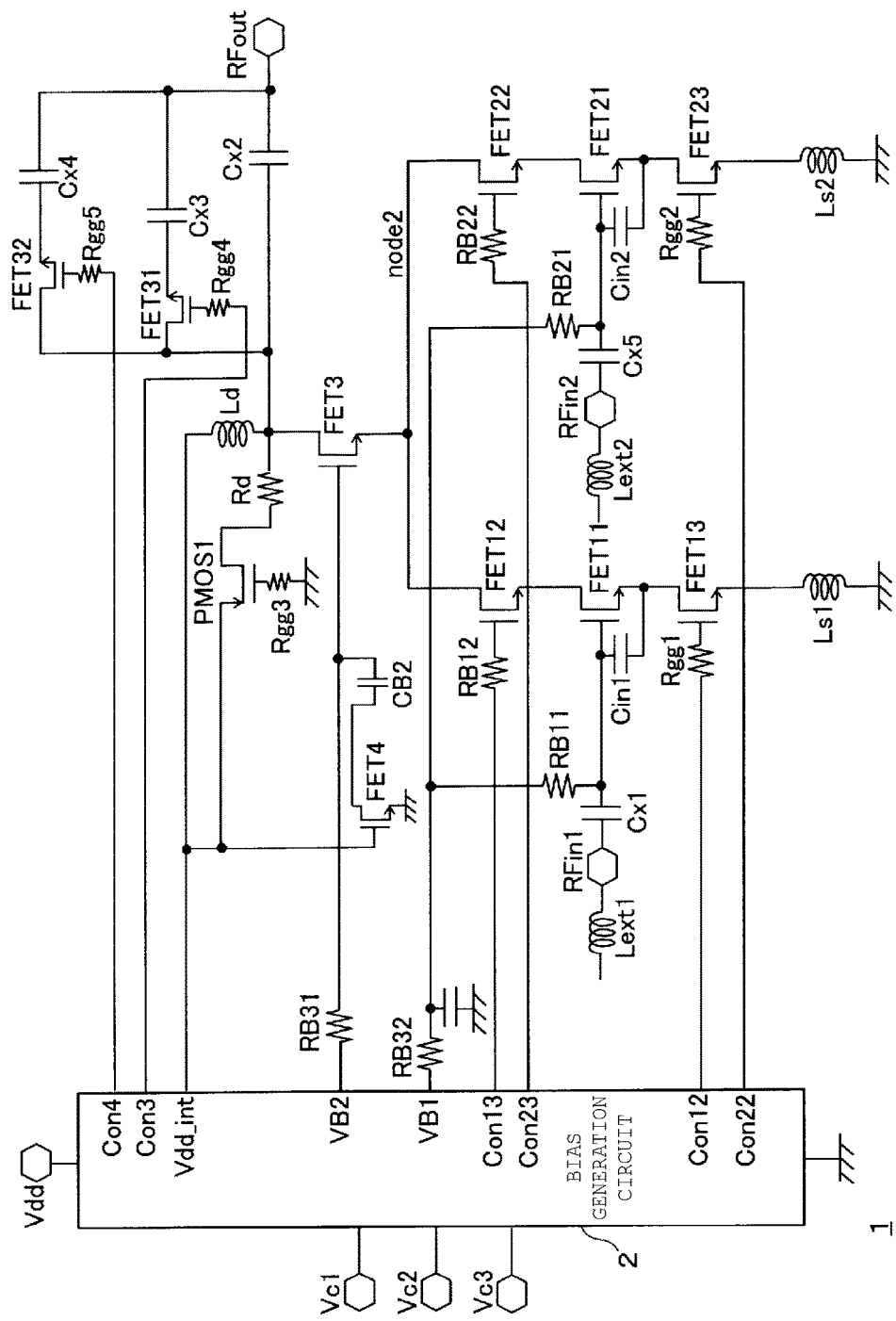
FIG. 48 is a circuit diagram of a high-frequency semiconductor amplifier circuit according to a second modified example of FIG. 36A.

FIG. 48 is a circuit diagram of a high-frequency semiconductor amplifier circuit 1 according to a second modified example of FIG. 36A. The circuit in FIG. 48 includes a FET31, a FET32, resistors Rgg4 and Rgg5, capacitors Cx3 and Cx4, a P-type transistor PMOS1, and a resistor Rgg3 in addition to the elements of the circuit depicted in FIG. 36A.

The connection relationship, the circuit operation, and the effect of these additional circuit elements are the substantially the same as those described above in conjunction with FIG. 33, and thus further detailed description thereof will not be presented.

Although not specifically illustrated, it should be noted that in a manner similar to the circuit described above in conjunction FIG. 28A, a PMOS1, FET31, FET32, capacitor Cx3, and capacitor Cx4 may similarly be added to the high-frequency semiconductor amplifier circuit 1 according to the fourth embodiment. Likewise, similarly to the circuit described above in conjunction with FIG. 29 or FIG. 30, the inductors Ls1 and Ls2 may be provided.

As described above, according to the fourth embodiment, a high-frequency semiconductor amplifier circuit 1 that is compatible with multi-band communication and has a bypass mode can be realized with a comparatively small layout area. In addition, an excellent noise figure NF can be obtained in both the gain mode and the bypass mode.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A multi-band semiconductor amplifier circuit, comprising:
a bias generation circuit connected to a power supply terminal and reference voltage terminal and having a plurality of input control signal terminals at which a plurality of input control signals can be input;
a first input terminal at which a first high-frequency signal can be input;
a second input terminal at which a second high-frequency signal can be input;
a first output terminal at which a high-frequency signal can be output;
a first high-frequency amplifier circuit connected between the first input terminal and the first output terminal, the first high-frequency amplifier circuit comprising:
a first transistor having a gate connected to the first input terminal via a first capacitor;
a second transistor connected between a source of the first transistor and a reference potential terminal; and
a third transistor having a source connected to a drain of the first transistor and a drain connected to the first output terminal via a second capacitor;
a second high-frequency amplifier circuit connected between the second input terminal and the first output terminal, the second high-frequency amplifier circuit comprising:
a fourth transistor having a gate connected to the second input terminal via a third capacitor, a source of the fourth transistor being connected to the gate of the fourth transistor via a fourth capacitor;
a fifth transistor connected between the source of the fourth transistor and the reference potential terminal; and
a sixth transistor having a source connected to a drain of the fourth transistor and a drain connected to the first output terminal via the second capacitor, wherein
the bias generation circuit is configured to:
supply a first voltage at a first voltage terminal, the first voltage being between a power supply voltage supplied at the power supply terminal and a reference voltage supplied at the reference voltage terminal, the first voltage terminal being connected to the drain of the third transistor and the drain of the sixth transistor,
supply control signals to the gates of the second and fifth transistors according to the plurality of input control signals,
supply first bias voltages to the gates of the first and fourth transistors according to the plurality of input control signals, and
supply second bias voltages to the gates of third and sixth transistors according to the plurality of input control signals.

2. The multi-band semiconductor amplifier circuit according to claim 1, further comprising:
a first p-channel metal oxide semiconductor (PMOS) transistor connected between the first voltage terminal and the third resistor, a gate of the first PMOS transistor being grounded; and
a capacitance adjustment circuit connected in parallel with the second capacitor between the drain of the third transistor and the first output terminal and including a seventh transistor and a fifth capacitor connected in series, a gate of the sixth transistor being connected to the bias generation circuit which supplies a gate voltage to a gate of the seventh transistor according to the plurality of input control signals.

3. The multi-band semiconductor amplifier circuit according to claim 1, wherein the first high-frequency amplifier circuit and the second high-frequency amplifier circuit are formed on a semiconductor-on-insulator substrate.

4. The multi-band semiconductor amplifier circuit according to claim 1, further comprising:
a seventh transistor connected between the third capacitor and each of the drains of the third transistor and sixth transistor, a gate of the seventh transistor connected to the bias generation circuit.

5. The multi-band semiconductor amplifier circuit according to claim 1, further comprising:
a third input terminal at which a third high-frequency signal can be input; and
a third high-frequency amplifier circuit connected between the third input terminal and the first output terminal.

* * * * *